(12) United States Patent
Hidaka et al.

(10) Patent No.: US 6,288,949 B1
(45) Date of Patent: Sep. 11, 2001

(54) SEMICONDUCTOR MEMORY DEVICE INCLUDING AN SOI SUBSTRATE

(75) Inventors: Hideto Hidaka; Katsuhiro Suma; Takahiro Tsuruda, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/499,368

(22) Filed: Feb. 7, 2000

Related U.S. Application Data

(62) Division of application No. 09/146,031, filed on Sep. 2, 1998, now Pat. No. 6,091,647, which is a division of application No. 08/876,755, filed on Jun. 16, 1997, now Pat. No. 5,825,696, which is a continuation of application No. 08/353,276, filed on Dec. 5, 1994.

(30) Foreign Application Priority Data

| Dec. 3, 1993 | (JP) | 5-304162 |
| Sep. 1, 1994 | (JP) | 6-208393 |
| Oct. 25, 1994 | (JP) | 6-260355 |

(51) Int. Cl.[7] .................................. G11C 11/40
(52) U.S. Cl. .................. 365/189.09; 365/230.06
(58) Field of Search ................. 365/189.09, 230.06, 365/176, 181, 149, 205, 156; 257/351

(56) References Cited

U.S. PATENT DOCUMENTS

| 3,836,894 | 9/1974 | Cricchi . |
| 3,990,056 | 11/1976 | Luisi et al. . |
| 4,233,672 | 11/1980 | Suzuki . |
| 4,253,162 | 2/1981 | Hollingsworth . |
| 4,899,202 | 2/1990 | Blake et al. . |
| 4,946,799 | 8/1990 | Blake et al. . |
| 4,965,213 | 10/1990 | Blake . |
| 5,047,979 | 9/1991 | Leung . |
| 5,060,035 | 10/1991 | Nishimura et al. . |
| 5,125,007 | 6/1992 | Yamaguchi et al. . |
| 5,253,202 | 10/1993 | Bronner et al. . |
| 5,283,457 | 2/1994 | Matloubian . |
| 5,506,436 | 4/1996 | Hayashi et al. . |

Primary Examiner—A. Zarabian
(74) Attorney, Agent, or Firm—McDermott, Will & Emery

(57) ABSTRACT

A semiconductor memory device includes a plurality of N and P channel MOS transistors. The plurality of MOS transistors are formed on an SOI (Silicon On Insulator) substrate. Each MOS transistor includes a source region, a drain region, and a body region located between the source region and the drain region. The body region of at least one N channel MOS transistor is electrically fixed. The body region of at least one P channel MOS transistor is rendered floating.

10 Claims, 63 Drawing Sheets

SEMICONDUCTOR MEMORY DEVICE INCLUDING AN SOI SUBSTRATE

This application is a divisional of application Ser. No. 09/146,031 filed Sep. 2, 1998, U.S. Pat. No. 6,091,647, which is a divisional of application Ser. No. 08/876,755, filed Jun. 16, 1997 now U.S. Pat. No. 5,825,696, which is a continuation of application Ser. No. 08/353,276, filed Dec. 5, 1994.

BACKGROUND OF THE INVENTION

1. Field of the Invention

The present invention relates to semiconductor memory devices, and more particularly to a dynamic random access memory (DRAM) formed on an SOI (Silicon On Insulator) substrate.

2. Description of the Background Art

A semiconductor memory device is typically divided into a volatile memory such as a RAM, and a non-volatile memory such as a ROM. The volatile memory is further divided into a DRAM and a static random access memory (SRAM). The non-volatile memory includes a mask ROM, an EPROM, a flash memory, an EEPROM, a fuse ROM, and the like.

A DRAM has data stored by accumulating charge in the capacitor of a memory cell. Although such a DRAM requires a refresh operation, a DRAM having a large storage capacity can be manufactured at a low cost due to its simple structure of the memory cell.

Because data is stored by accumulating charge in a capacitor in a DRAM, the amount of charge stored in a capacitor is altered according to α particles emitted from its package or interconnection material. This change in the amount of charge will result in data inversion, i.e., soft error.

The demand for DRAMs having a higher integration density is also great. The potential of mass production is appreciable for DRAMs having a large storage capacity such as 256M bits and 1G bits. Although the gate length is generally reduced to increase the integration density of a DRAM, this reduction in gate length has a limitation due to a significant short channel effect as the channel length is reduced.

In recent years, large scaled integrated circuits (LSI) are developed having circuit elements such as transistors formed on an SOI substrate with an insulation layer buried in the semiconductor substrate.

FIG. 92 is a plan view showing a structure of a MOS transistor formed on an SOI substrate. FIGS. 93 and 94 are sectional views of the MOS transistor shown in FIG. 92 taken along lines 93—93 and 94—94, respectively.

Referring to FIGS. 92–94, an MOS transistor includes an $n^+$ type source region 1, an $n^+$ type drain region 2, a p type body region 3, and a gate electrode 4. Body region 3 is located between source region 1 and drain region 2. When a predetermined potential is applied to gate electrode 4, a channel is formed in body region 3.

This MOS transistor is completely enclosed by a LOCOS oxide film 5 for isolation from an adjacent element. This MOS transistor is formed on an SOI substrate 6. SOI substrate 6 includes a silicon substrate 7, a buried oxide film 8 of $SiO_2$, and an SOI active layer 9. Source region 1, drain region 2, and body region 3 are formed in this SOI active layer 9.

Body region 3 attains a floating state electrically since it is enclosed by LOCOS oxide film 5 and isolated from silicon substrate 7 by buried oxide layer 8. When body region 3 attains a floating state, the breakdown voltage between the source and drain becomes as low as approximately 3V due to a parasitic bipolar operation. There is also a possibility of a leakage current flow between the source and the drain. Furthermore, a body region 3 attaining a floating state induces the generation of a kink to disturb the drain current Id—drain voltage Vd characteristics. Therefore, the transistor cannot operate stably.

SUMMARY OF THE INVENTION

In view of the foregoing, a main object of the present invention is to provide a semiconductor memory device formed on an SOI substrate.

Another object of the present invention is to provide a DRAM with almost no generation of a soft error.

A further object of the present invention is to provide a DRAM having a greater storage capacity.

Still another object of the present invention is to further increase the data retaining time in a memory cell.

A still further object of the present invention is to improve the breakdown voltage between the source and drain of a MOS transistor in a semiconductor memory device.

Yet a further object of the present invention is to reduce leakage current between the source and drain of a MOS transistor in a semiconductor memory device.

Yet another object of the present invention is to operate a MOS transistor stably in a semiconductor memory device.

Yet a still further object of the present invention is to minimize increase in the layout area.

A semiconductor memory device according to an aspect of the present invention includes a plurality of N and P channel MOS semiconductor elements. The plurality of N and P channel MOS semiconductor elements are formed on an SOI substrate. Each MOS semiconductor element includes a source region, a drain region, and a body region located between the source and drain regions. At least one N channel MOS semiconductor element of the plurality of N channel MOS semiconductor elements has its body region electrically fixed. At least one P channel MOS semiconductor element of the plurality of P channel MOS semiconductor elements has its body region rendered floating electrically.

A semiconductor memory device according to another aspect of the present invention includes a plurality of N and P channel MOS semiconductor elements. The plurality of N and P channel MOS semiconductor elements are formed on an SOI substrate. Each MOS semiconductor element includes a source region, a drain region, and a body region located between the source and drain regions. Any body region of the plurality of N channel MOS semiconductor elements is fixed electrically. All the body regions of the plurality of P channel MOS semiconductor elements are rendered floating electrically.

A semiconductor memory device according to a further aspect of the present invention includes a plurality of N and P channel MOS semiconductor elements. The plurality of N and P channel MOS semiconductor elements are formed on an SOI substrate. Each MOS semiconductor element includes a source region, a drain region and a body region located between the source and drain regions. All the body regions of the plurality of N channel MOS semiconductor devices are fixed electrically. All the body regions of the plurality of P channel MOS semiconductor elements are rendered floating.

A semiconductor memory device according to still another aspect of the present invention includes a plurality of MOS capacitors. The plurality of MOS capacitors are formed on an SOI substrate. Each MOS capacitor includes a source region, a drain region connected to the source region, and a body region located between the source and drain regions. At least one MOS capacitor of the plurality of MOS capacitors has its body region connected to its own source region.

A semiconductor memory device according to still a further aspect of the present invention includes a plurality of MOS transistors and a plurality of bit line pairs for storing data. The stored data is read out via a bit line pair. The plurality of MOS transistors and the plurality of bit line pairs are formed on an SOI substrate. Each MOS transistor includes a source region, a drain region, and a body region located therebetween. The body region of a MOS transistor out of the plurality of MOS transistors having a source region or a drain region connected to any of the plurality of bit line pairs is electrically fixed.

A semiconductor memory device according to yet a further aspect of the present invention includes a plurality of MOS transistors. The plurality of MOS transistors are formed on an SOI substrate. Each MOS transistor includes a source region, a drain region, and a body region located therebetween. A variable potential is supplied to the body region of at least one of the plurality of MOS transistors. This variable potential is the reverse voltage with respect to the PN junction between one of the source and drain regions and the body region. Preferably, the body region of the at least one MOS transistor is connected to its own source region.

A semiconductor memory device according to yet another aspect of the present invention includes a plurality of bit line pairs, and a plurality of sense amplifiers. The plurality of sense amplifiers are provided corresponding to the plurality of bit line pairs. Each sense amplifier amplifies the potential difference between a corresponding bit line pair. The plurality of bit line pairs and the plurality of sense amplifiers are formed on an SOI substrate. Each sense amplifier includes first and second N channel MOS transistors connected in series between the corresponding bit line pair. The body region of the first N channel MOS transistor located between the source region and the drain region is connected to its own source region. The body region of the second N channel MOS transistor located between the source region and the drain region is connected to its own source region.

Preferably, each sense amplifier further includes first and second P channel MOS transistors connected in series between a corresponding bit line pair. The body region of the first P channel MOS transistor located between the source region and the drain region is connected to its own source region. The body region of the second P channel MOS transistor located between the source region and the drain region is connected to its own source region.

A semiconductor memory device according to yet a still further aspect of the present invention includes a plurality of MOS transistors and output terminals for storing data. The stored data is externally output via the output terminal. The plurality of MOS transistors are formed on an SOI substrate. Each MOS transistor includes a source region, a drain region, and a body region located therebetween. Out of the plurality of the MOS transistors, the body region of the MOS transistor having the source region connected to the output terminal is connected to its own source region.

A semiconductor memory device according to a further aspect of the present invention includes a plurality of MOS transistors. A predetermined power supply voltage is supplied to the semiconductor memory device. The plurality of MOS transistors are formed on an SIO substrate. Out of the plurality of the MOS transistors, the body region of the MOS transistor having a voltage higher than the power supply voltage supplied between the source region and the drain region is electrically fixed.

A semiconductor memory device according to a further aspect of the present invention includes a plurality of MOS transistors. The plurality of MOS transistors are formed on an SOI substrate. Out of the plurality of MOS transistors, the body region located between the source region and the drain region of a MOS transistor carrying out an analog operation is electrically fixed. Preferably, the MOS transistor that carries out an analog operation is a MOS transistor in a circuit that processes a signal of an amplitude smaller than that of power supply voltage supplied to the semiconductor memory device.

A semiconductor memory device according to a further aspect of the present invention includes a plurality of MOS transistors and input/output lines for storing data. The stored data is read/written via the input/output line. The plurality of MOS transistors and the input/output lines are formed on an SOI substrate. Each MOS transistor includes a source region, a drain region, and a body region located therebetween. Out of the plurality of MOS transistors, the body region of a MOS transistor having the source region or the drain region connected to the input/output line is electrically fixed.

A semiconductor memory device according to a further aspect of the present invention includes a plurality of MOS transistors. The plurality of MOS transistors are formed on an SOI substrate. Out of the plurality of MOS transistors, the body region located between the source and drain region of the MOS transistor in the input stage receiving an externally applied signal is electrically fixed.

A semiconductor memory device according to a further aspect of the present invention includes a plurality of MOS transistors. The plurality of MOS transistors are formed on an SOI substrate. Out of the plurality of MOS transistors, the body region located between the source and drain regions of the MOS transistor at an output stage for outputting a signal is electrically fixed.

A semiconductor memory device according to a further aspect of the present invention includes a plurality of MOS transistors. Any N channel MOS transistors out of the plurality of MOS transistors are connected in series between an output node for providing a signal and a ground node. The plurality of MOS transistors are formed on an SOI substrate. Out of the any of the N channel MOS transistors, the body region located between the source region and the drain region of at least one N channel MOS transistors that does not have a source region directly connected to the ground node is electrically fixed.

A semiconductor memory device according to a further aspect of the present invention includes a plurality of MOS transistors. The plurality of MOS transistors are formed on an SOI substrate. Out of the plurality of MOS transistors, the body region located between the source region and the drain region of a MOS transistor having a gate length shorter than a predetermined gate length is electrically fixed. Out of the plurality of MOS transistors, the body region located between the source region and the drain region of a MOS transistor having a gate length longer than the predetermined gate length is rendered floating electrically.

A semiconductor memory device according to a further aspect of the present invention includes a plurality of first and second conductive channel type MOS transistors. The plurality of first and second conductive channel type MOS transistors are formed on an SOI substrate. At least one first conductive channel type MOS transistor of the plurality of first conductive channel type MOS transistors has a first threshold voltage. At least one first conductive channel MOS transistor of the plurality of first conductive channel MOS transistors has a second threshold voltage differing from the first threshold voltage.

A semiconductor memory device according to a further aspect of the present invention includes a plurality of first and second conductive channel type MOS transistors. The plurality of first and second conductive channel type MOS transistors are formed on an SOI substrate. A second conductivity type body region located between a first conductivity type source region and a first conductivity type drain region of at least one first conductive channel MOS transistor of the plurality of first conductive channel type MOS transistors includes a conductive layer having a first impurity concentration on the surface thereof. A second conductivity type body region located between the first conductivity type source region and the first conductivity type drain region between at least another first conductive channel type MOS transistor of the plurality of first conductive channel type MOS transistors includes a conductive layer having a second impurity concentration differing from the first impurity concentration at the surface thereof.

A semiconductor memory device according to a further aspect of the present invention includes a plurality of first and second conductive channel type MOS transistors. The plurality of first and second conductive channel type MOS transistors are formed on an SOI substrate. A second conductivity type body region located between a first conductivity type source region and the first conductivity type drain region of at least one first conductive channel type MOS transistor out of the plurality of first conductive channel type MOS transistors receives a first potential. A second conductivity type body region located between the first conductivity type source region and the first conductivity type drain region of at least another first conductive channel type MOS transistor out of the plurality of first conductive channel type MOS transistors receives a second potential differing from the first potential.

A semiconductor memory device according to a further aspect of the present invention includes a memory cell array of a plurality of first MOS transistors, and a peripheral circuit of a plurality of second MOS transistors. The plurality of first and second MOS transistors are formed on an SOI substrate. The plurality of first MOS transistors have a threshold voltage higher than that of the plurality of second MOS transistors.

A semiconductor memory device according to a further aspect of the present invention includes a plurality of MOS semiconductor elements. The plurality of MOS semiconductor elements are formed on an SOI substrate. The source and drain regions of any MOS semiconductor elements out of the plurality of MOS semiconductor elements are brought into contact with an insulation layer in the SOI substrate.

A semiconductor memory device according to a further aspect of the present invention includes a memory cell array of a plurality of first MOS transistors, and a peripheral circuit of a plurality of second MOS transistors. The memory cell array and the peripheral circuit are formed on an SOI substrate. The source and drain regions of the plurality of first MOS transistors are brought into contact with an insulation layer of the SOI substrate.

A semiconductor memory device according to a further aspect of the present invention includes at least one first semiconductor element and at least one second semiconductor element. An element isolation film for isolating the first and second semiconductor elements are formed on an SOI substrate. The element isolation film is brought into contact with an insulation layer in the SOI substrate.

A semiconductor memory device according to a further aspect of the present invention is formed on an SOI substrate. The SOI substrate includes a semiconductor substrate, a buried insulation layer formed on the semiconductor substrate, and a semiconductor active layer formed on the buried insulation layer. The semiconductor memory device further includes a supply circuit. The supply circuit supplies a predetermined substrate potential to the semiconductor substrate of the SOI substrate.

Because the above-described semiconductor memory device in which all semiconductor elements are formed on an SOI substrate has the body region of at least one N channel MOS semiconductor element electrically fixed, leakage current between the source and drain is reduced and the breakdown voltage between the source and drain is increased. Because there is almost no kinks in the fixed body region, a stable Id-Vd characteristic can be obtained. Furthermore, because the body region of at least one P channel MOS semiconductor element is rendered floating electrically, wiring for fixing the body region is not required, and increase of the layout area is minimized. In general, the breakdown voltage between the source and drain in an N channel MOS semiconductor element is smaller than that of the P channel MOS semiconductor element. Here, the body region of an N channel MOS transistor is fixed, so that the breakdown voltage between the source and drain thereof is similar to that of a P channel MOS semiconductor element.

Because the body region of a MOS capacitor is connected to its own source region, the body region thereof is fixed. Therefore, this MOS capacitor can operate stably. Furthermore, because the body region is connected to the source region, wiring for supplying potential to the body region is not required. Thus, there is almost no increase in the layout area.

Because the body region of the MOS transistor connected to the bit line pair is fixed, leakage current flowing from the bit line pair via the MOS transistor, or the leakage current flowing to the bit line pair via the MOS transistor is reduced.

Because a variable potential is applied to the body region of a MOS transistor that becomes a reverse voltage with respect to the PN junction formed of the body region and the source/drain region, the transistor does not carry out bipolar operation, and body effect does not occur. Therefore, this MOS transistor operates stably.

Because the body region of the MOS transistor to which high voltage is applied between the source and drain is fixed, the breakdown voltage between the source and drain is increased, so that this transistor will operate properly even when high voltage is applied between the source and drain.

Because the body region of a MOS transistor carrying out an analog operation is fixed, there is almost no kinks in that transistor. Therefore, this transistor always operates stably.

Because the body region of a MOS transistor having source/drain regions connected to an input/output line is fixed, a great leakage current will not flow between the source and drain, so that accurate data can be input and output.

Because the body region of a MOS transistor at an input stage is fixed, a great leakage current will not flow between the source and drain, so that a desired input impedance can be obtained.

Because the body region of a MOS transistor at an output stage is fixed, a great amount of leakage current will not flow between the source and drain, so that a desired output impedance can be obtained.

Because the body region of an N channel MOS transistor that is not directly connected to a ground node is fixed, the threshold voltage of the transistor including that fixed body region is reduced, whereby the transistor operates more speedily. Therefore, those transistor can operate properly even when the power supply voltage is low.

Because the body region of a MOS transistor having a short gate length is fixed, the breakdown voltage between the source and drain of that transistor is equal to that of a transistor having a greater gate length. Also, the level of the leakage current flowing between the source and drain of the transistor of the short gate length is similar to that of the transistor of the long gate length. Furthermore, because the body region of the MOS transistor of the long gate length is rendered floating, wiring for providing potential to the body region is not required, so that increase in the layout area can be suppressed to a minimum.

Because transistors of the same conductivity type have more than one type of threshold voltage, these transistors operate stably.

The junction capacitance of the source/drain region is reduced since a semiconductor element is formed in the thin SOI active layer.

Because an element isolation film such as a Locos oxide film is formed in a thin SOI active layer, the element isolation film comes into contact with the insulation layer of the SOI substrate.

Because a predetermined substrate potential is supplied to the semiconductor substrate of an SOI substrate, the semiconductor substrate is electrically fixed. Therefore, the potential of the semiconductor substrate will not change, so that change in the potential of the semiconductor active layer will also not occur. As a result, semiconductor elements such as a transistor formed on the semiconductor active layer operates stably.

The foregoing and other objects, features, aspects and advantages of the present invention will become more apparent from the following detailed description of the present invention when taken in conjunction with the accompanying drawings.

BRIEF DESCRIPTION THE DRAWINGS

Figure 8:
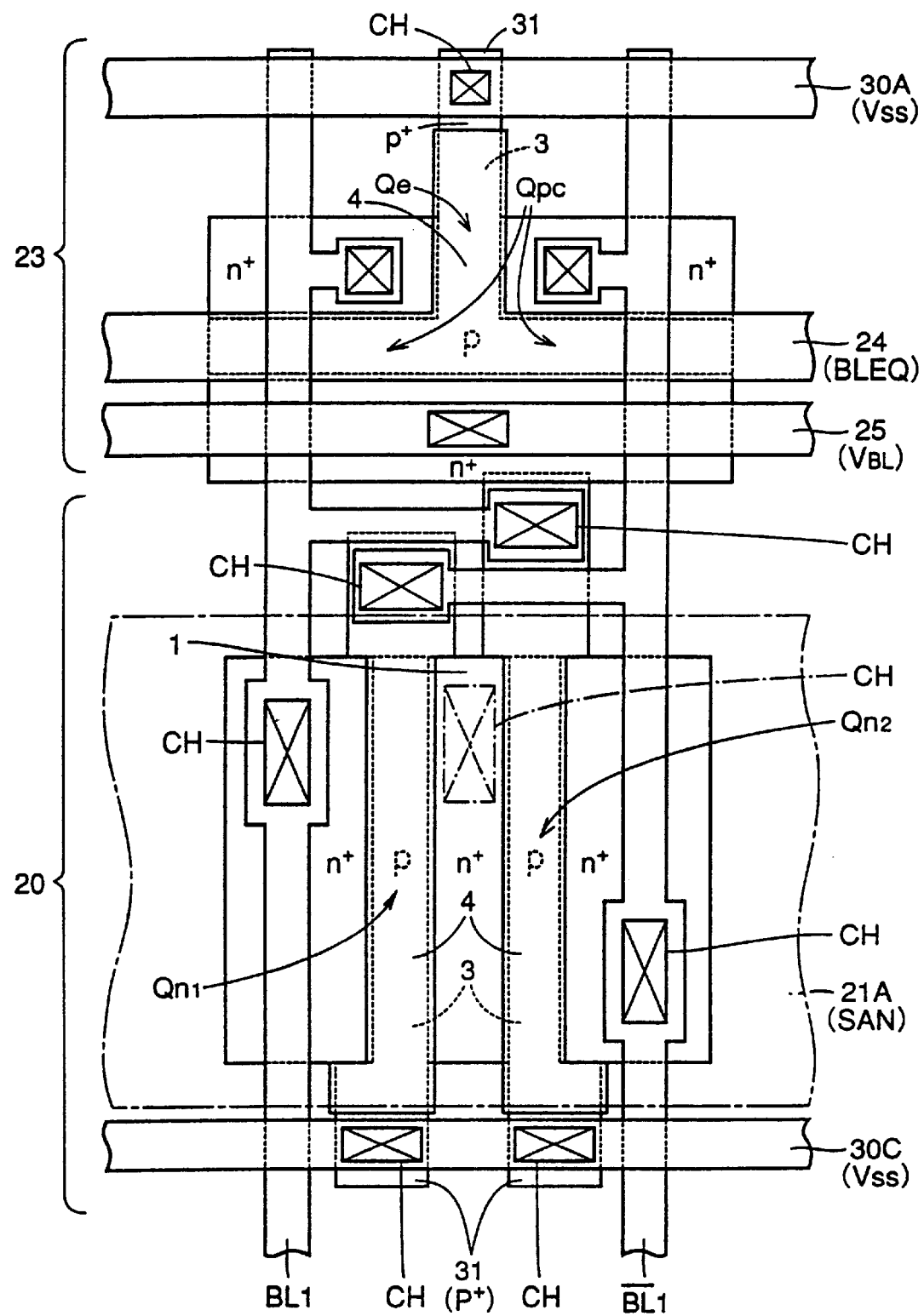
Figure 9:
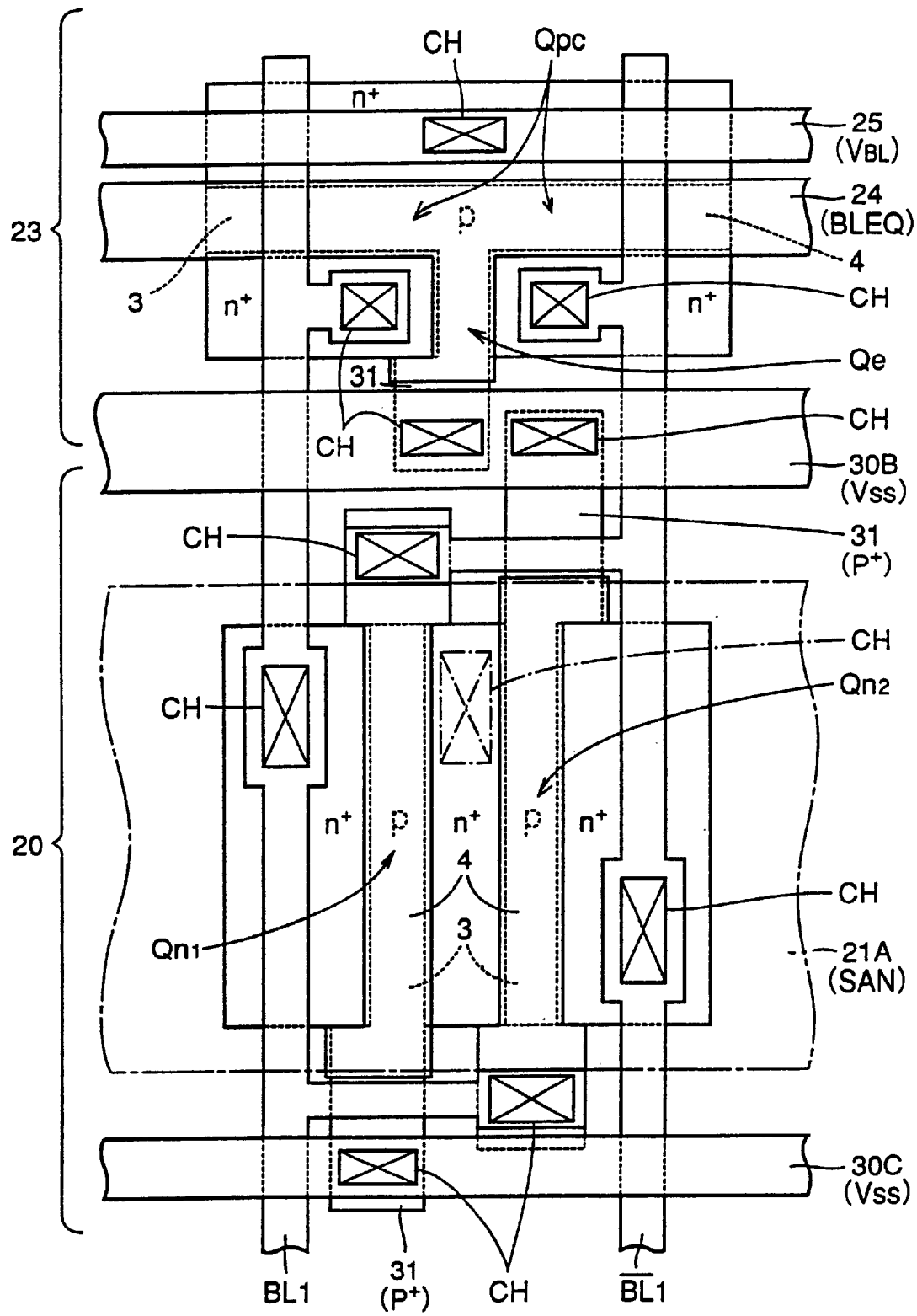

FIGS. 8 and 9 are plan views showing the structure of a sense amplifier and a precharge circuit of a DRAM according to embodiment 2 and embodiment 3, respectively, of the present invention.

Figure 10:
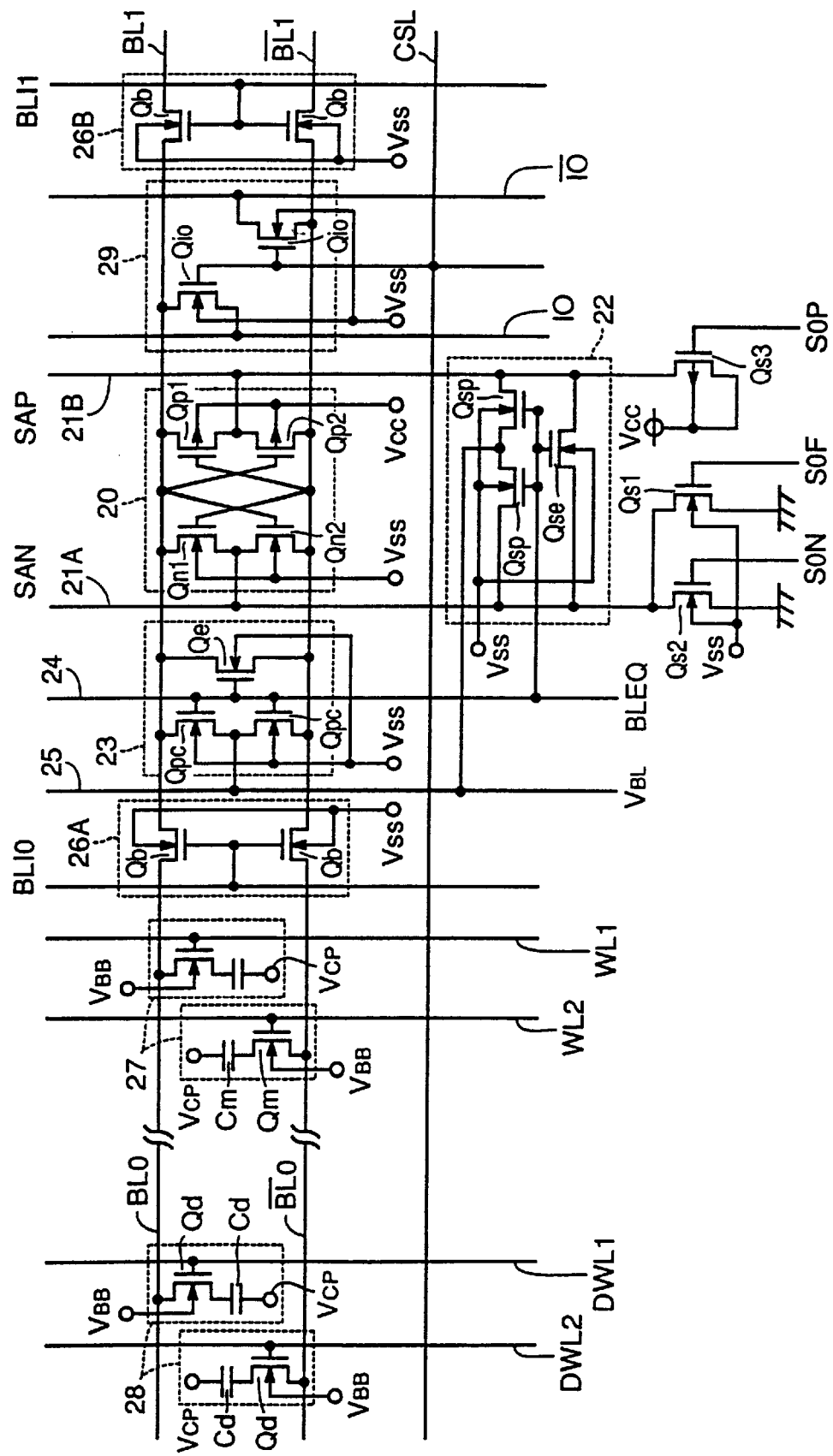
Figure 11:
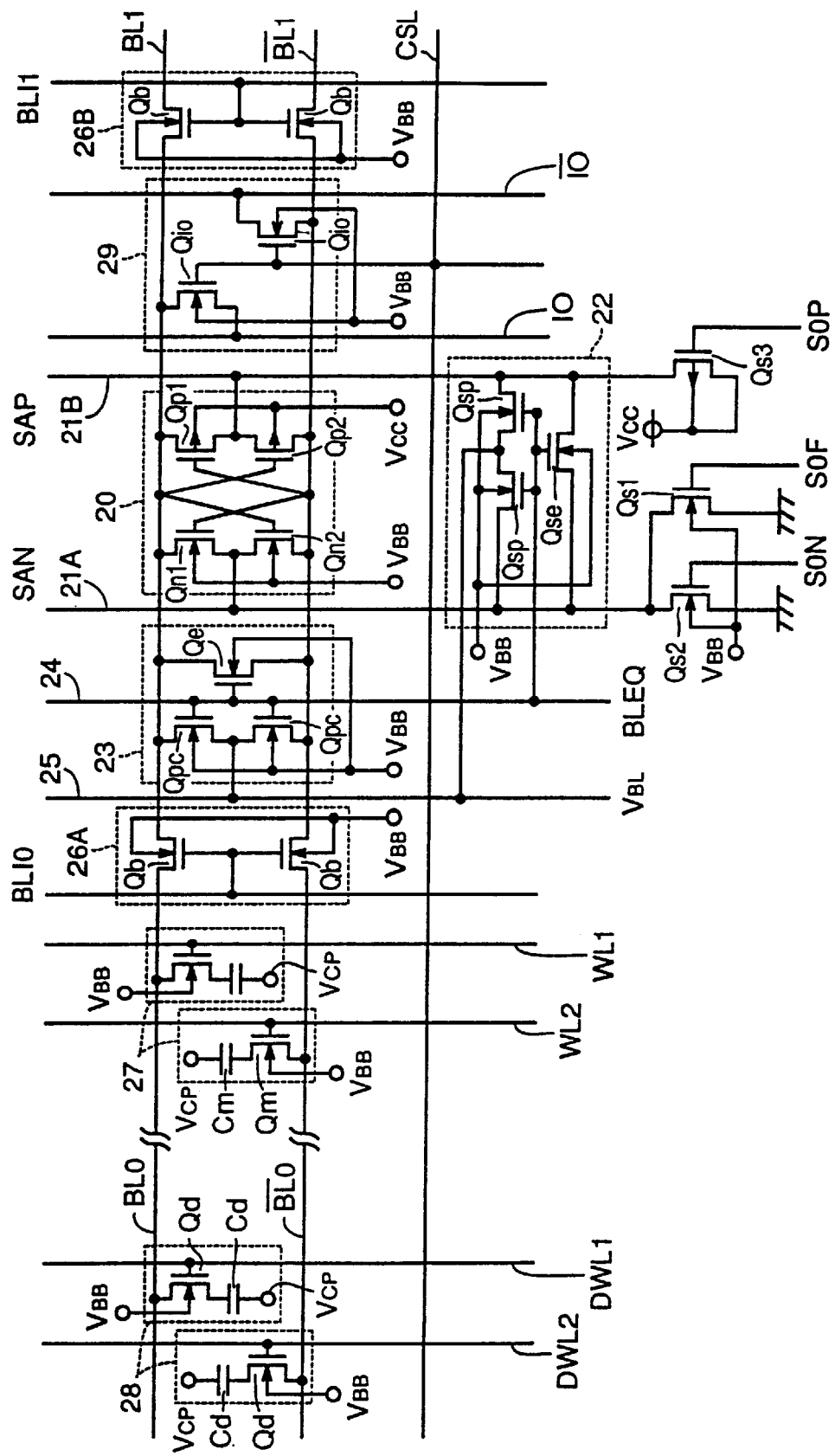
Figure 12:
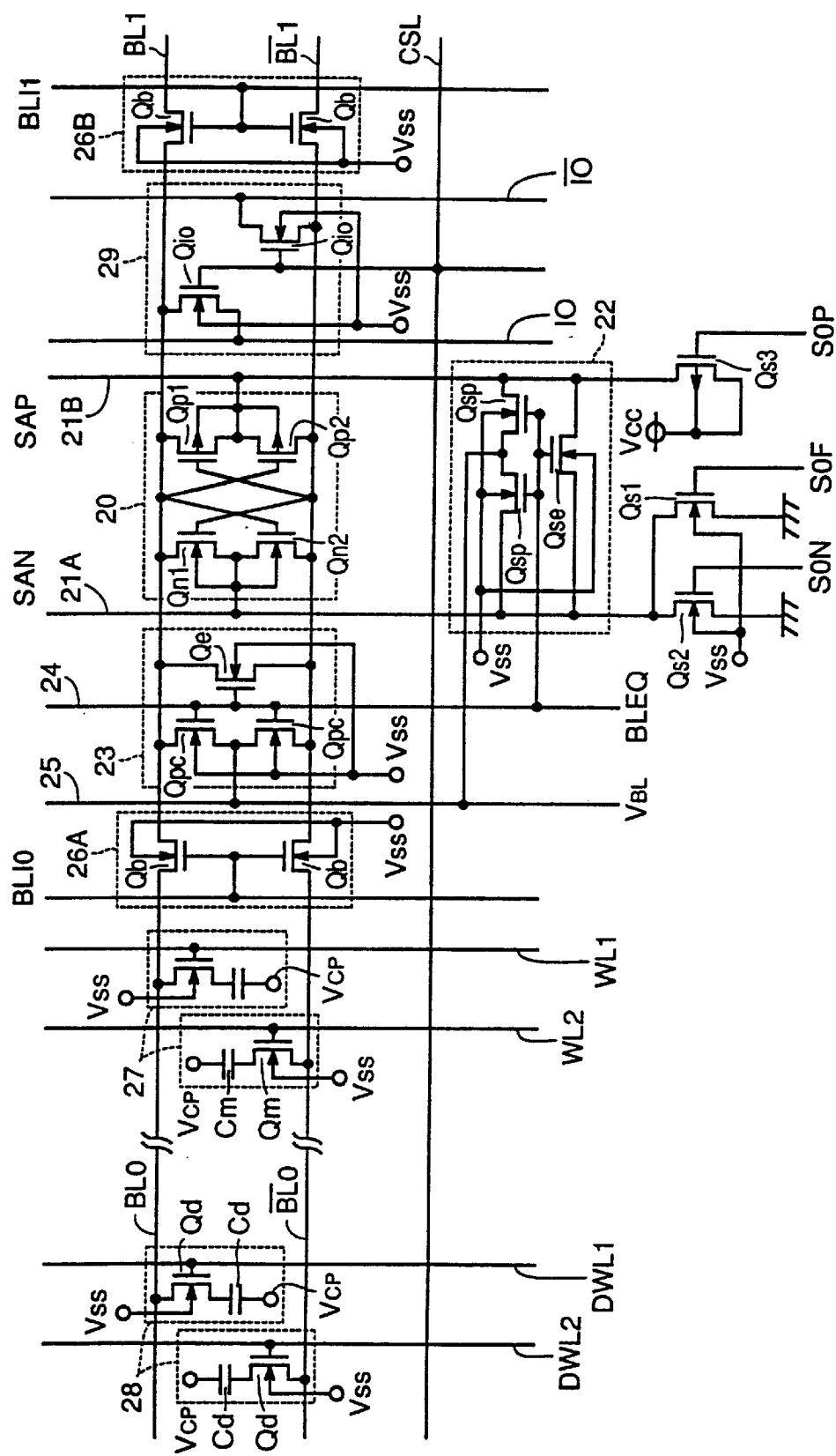

FIGS. 10–12 are circuit diagrams showing a partial structure of a memory cell, a sense amplifier, and an input/output circuit of a DRAM according to embodiment 4, embodiment 5, and embodiment 6, respectively, of the present invention.

Figure 13:
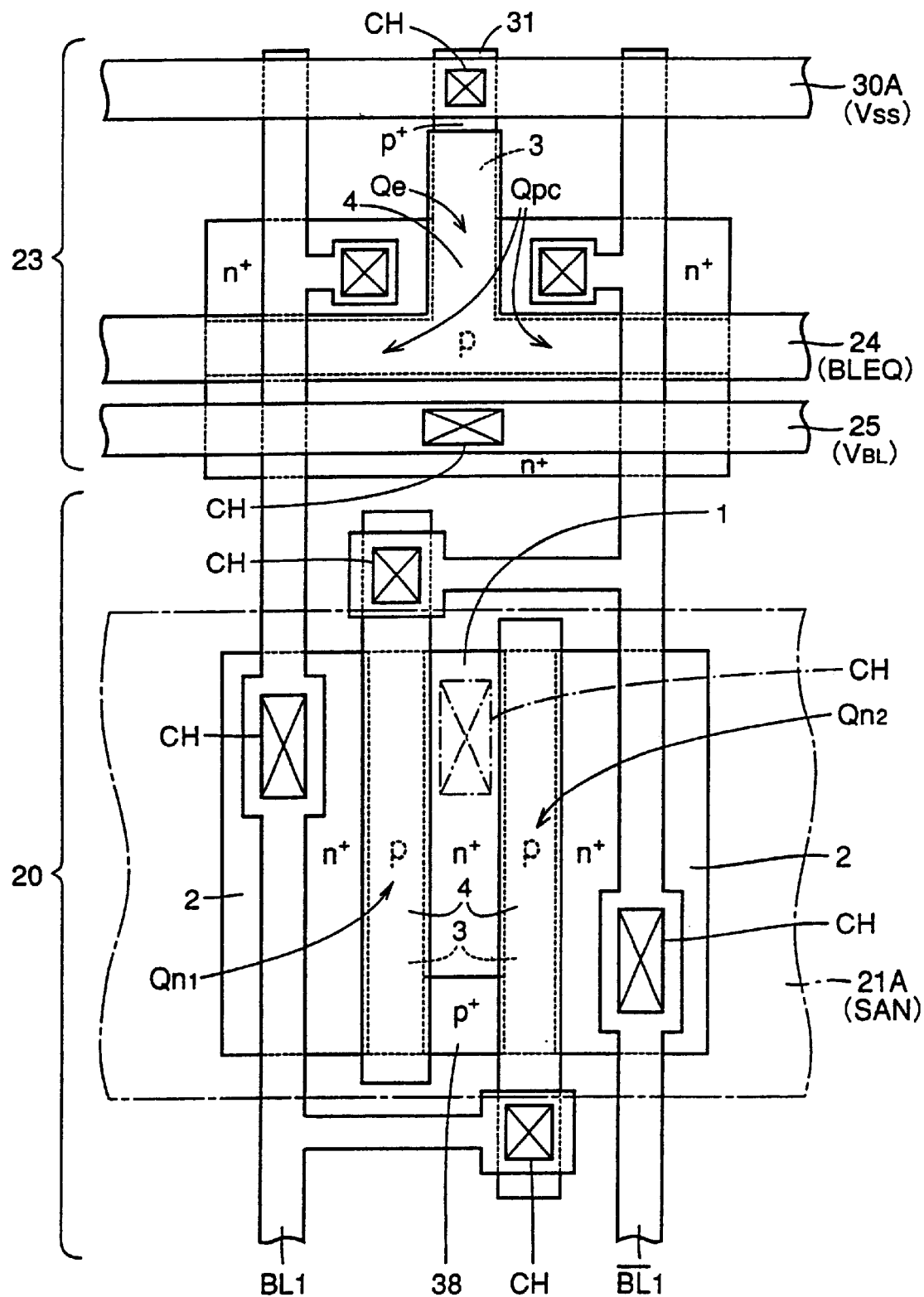

FIG. 13 is a plan view showing the structure of the sense amplifier and the precharge circuit shown in FIG. 12.

Figure 14:
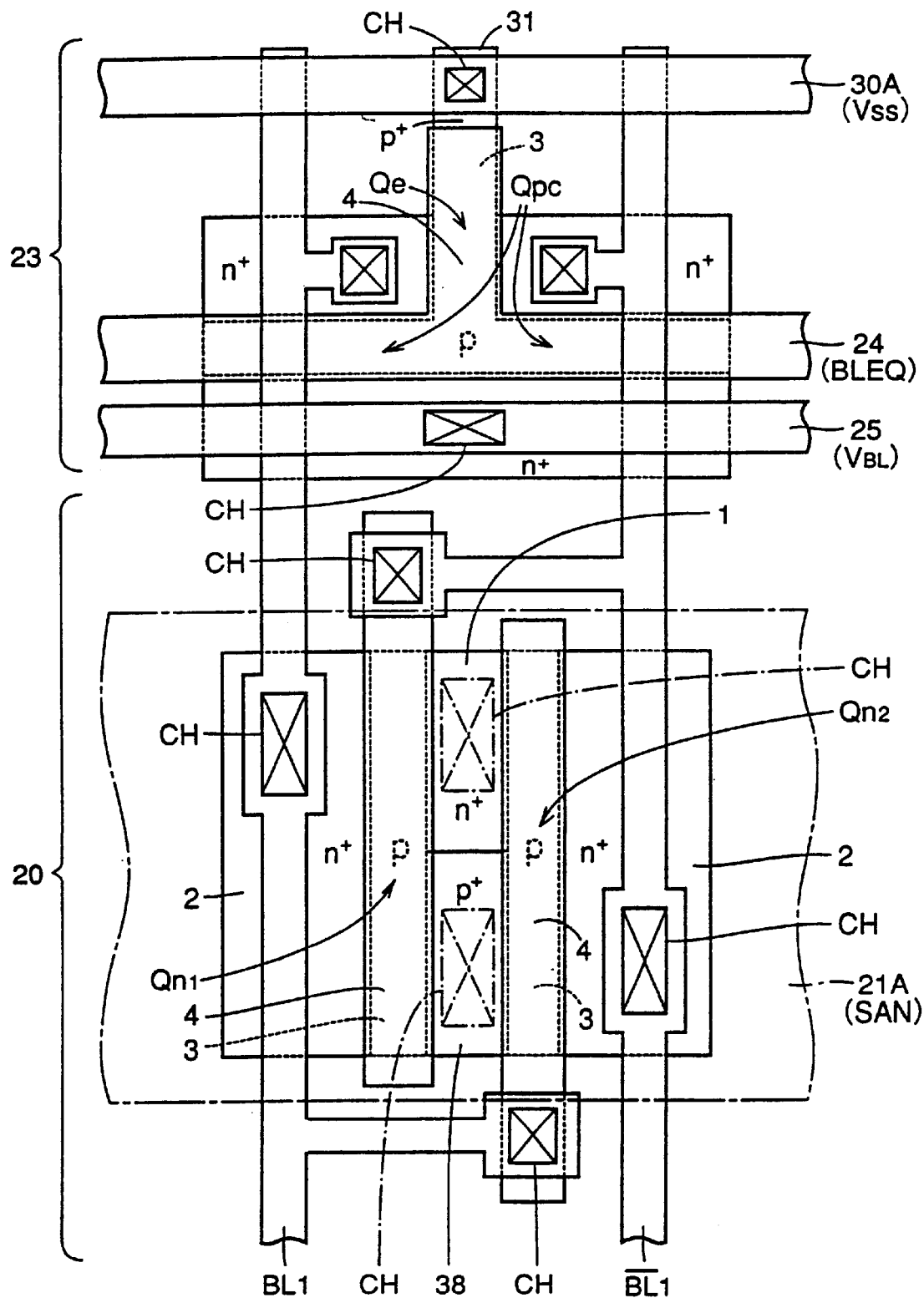
Figure 15:
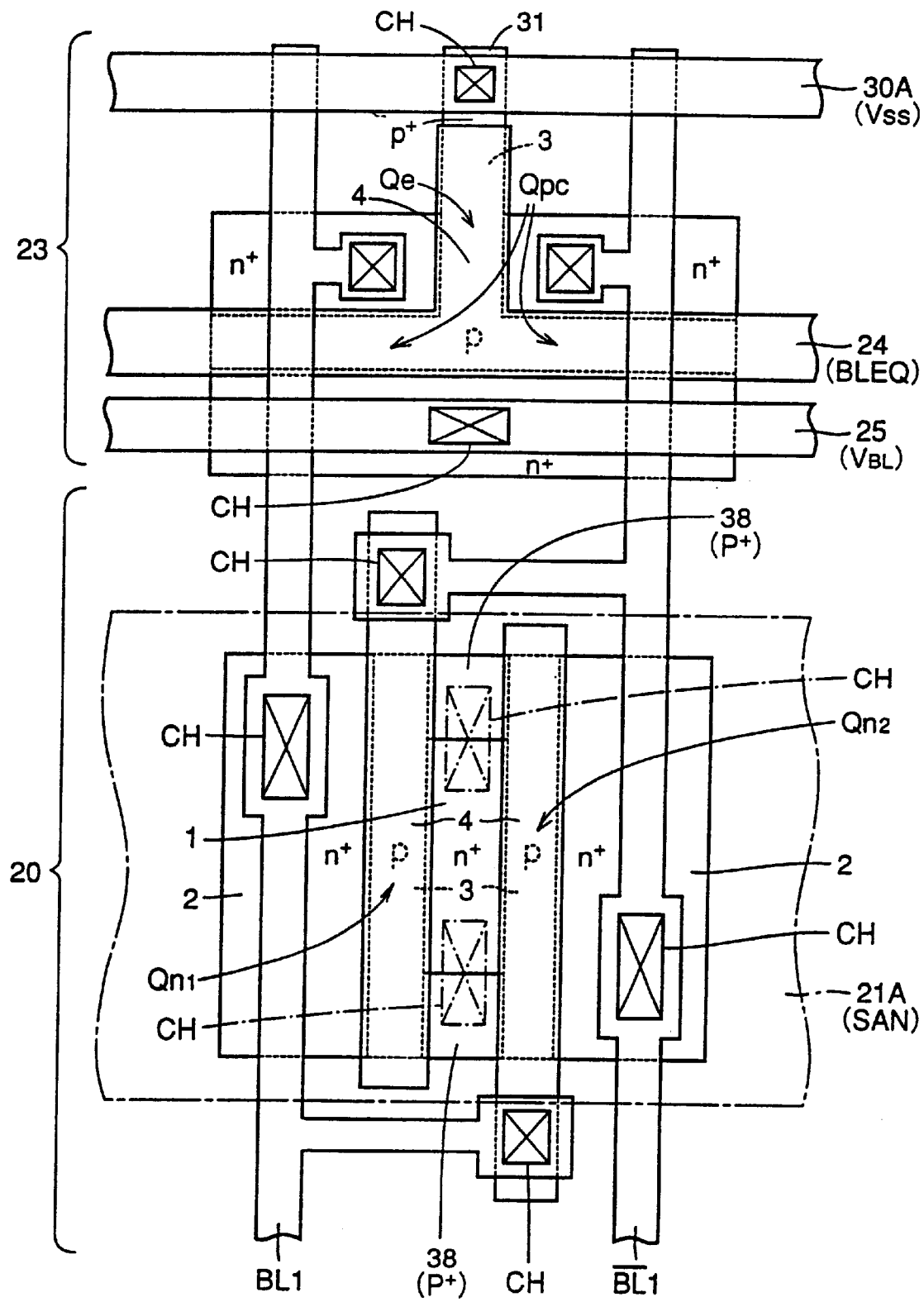

FIG. 14 and 15 are plan view showing a structure of the sense amplifier and the precharge circuit in a DRAM according to embodiment 7 and embodiment 8, respectively, of the present invention FIGS. 16–19 are circuit diagrams showing a partial structure of a memory cell, a sense amplifier, and an input/output circuit of a DRAM according to embodiment 9, embodiment 10, embodiment 11, and embodiment 12, respectively, of the present invention.

Figure 20:
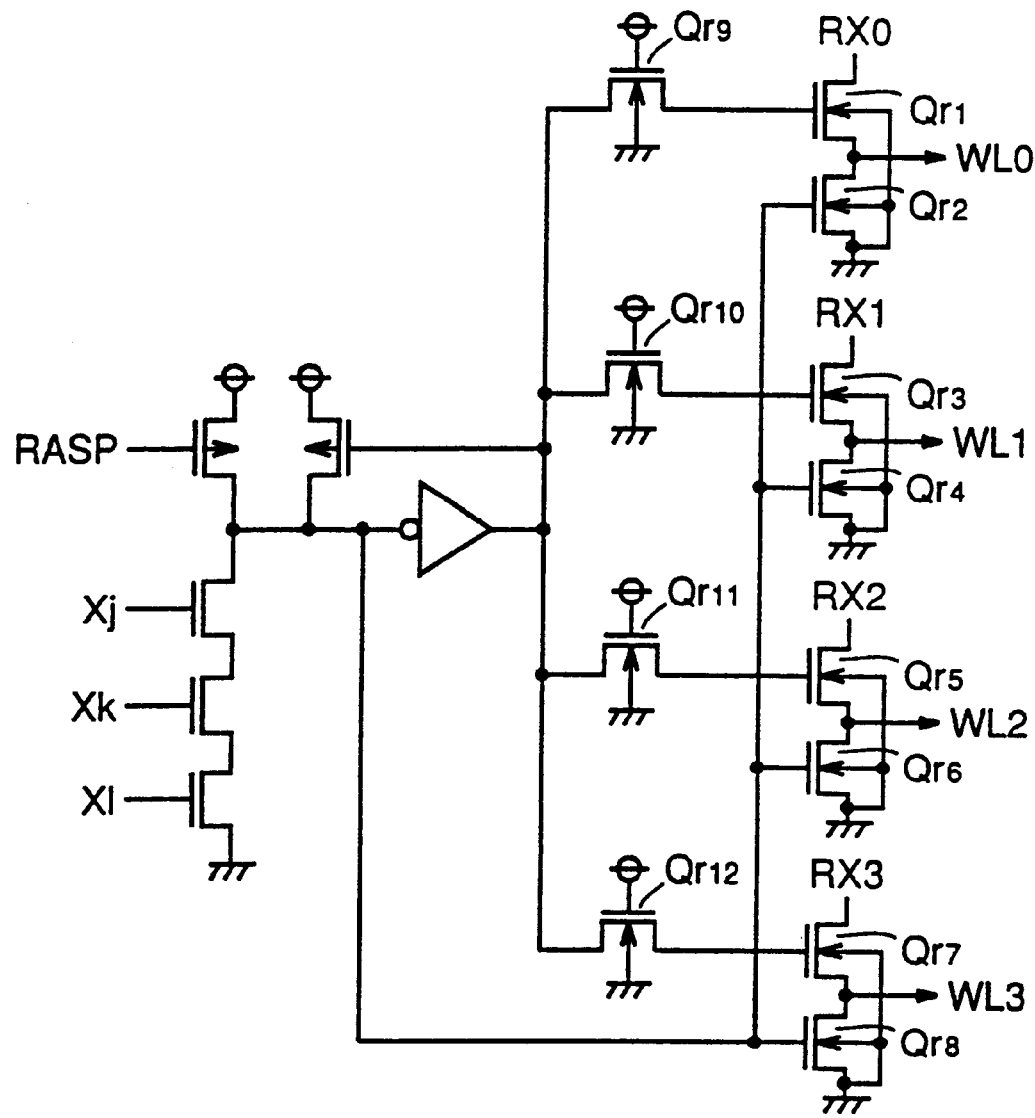
Figure 21:
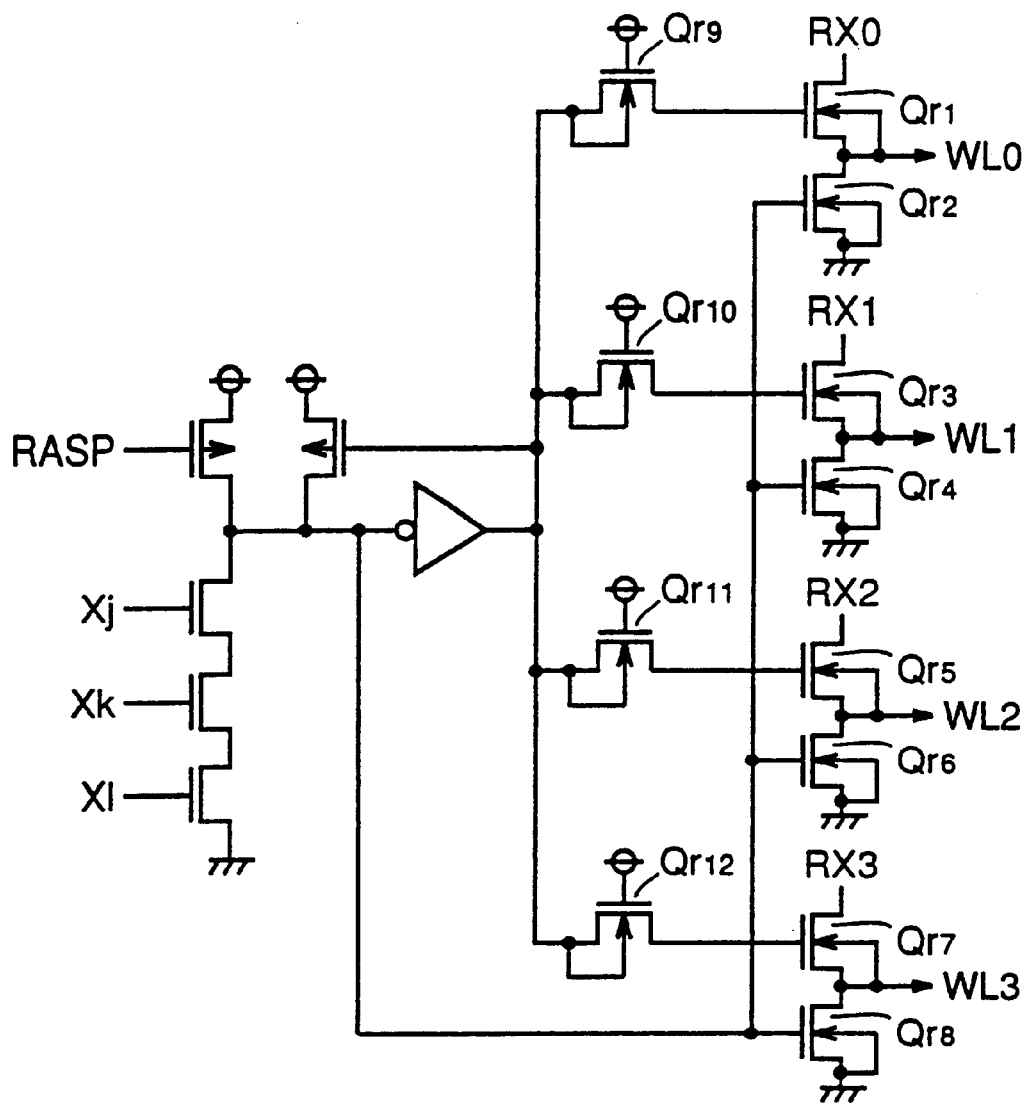

FIGS. 20 and 21 are circuit diagrams showing structure of a word line driving circuit of a DRAM according to embodiment 13 and embodiment 14, respectively, of the present invention.

Figure 22:
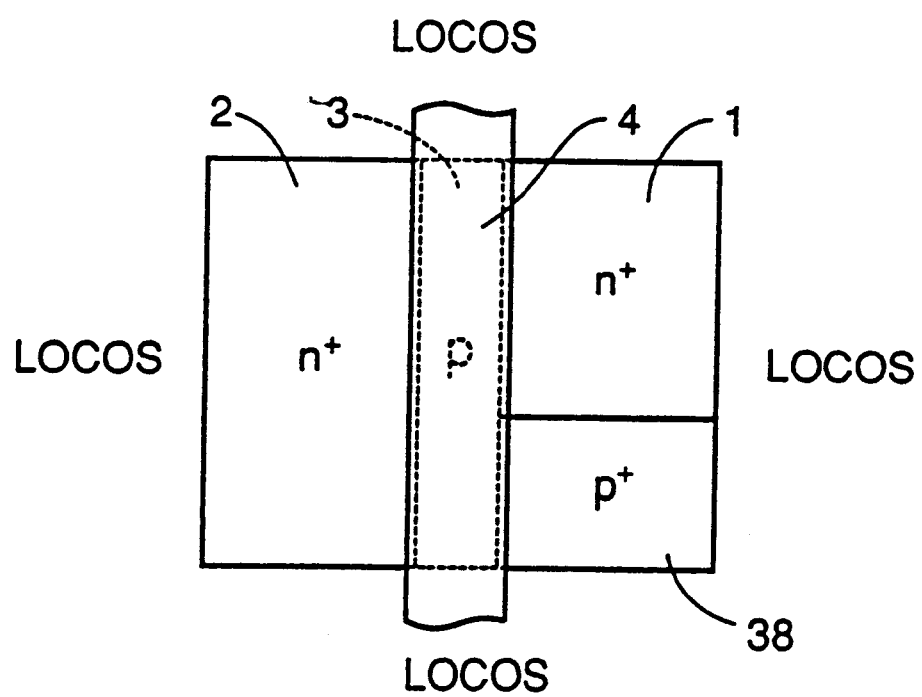

FIG. 22 is a plan view showing a structure of an N channel MOS transistor in the word line driving circuit of FIG. 21.

Figure 23:
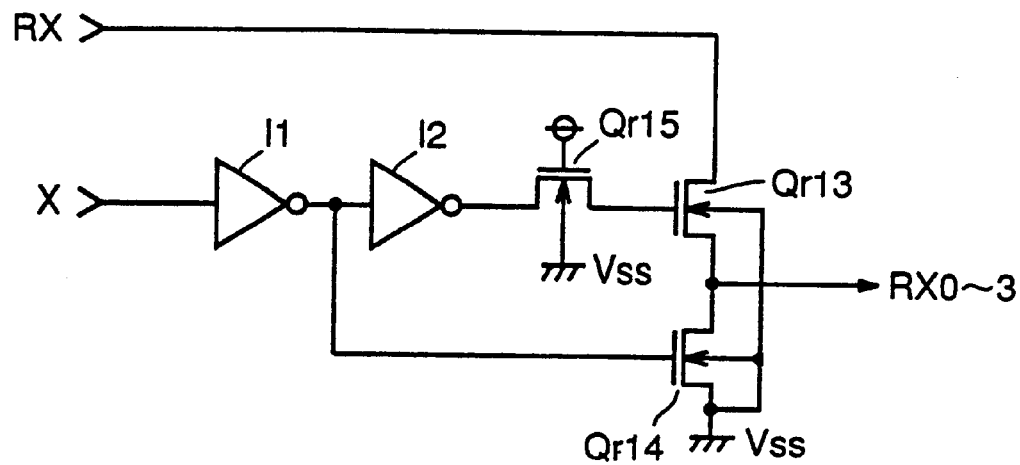
Figure 24:
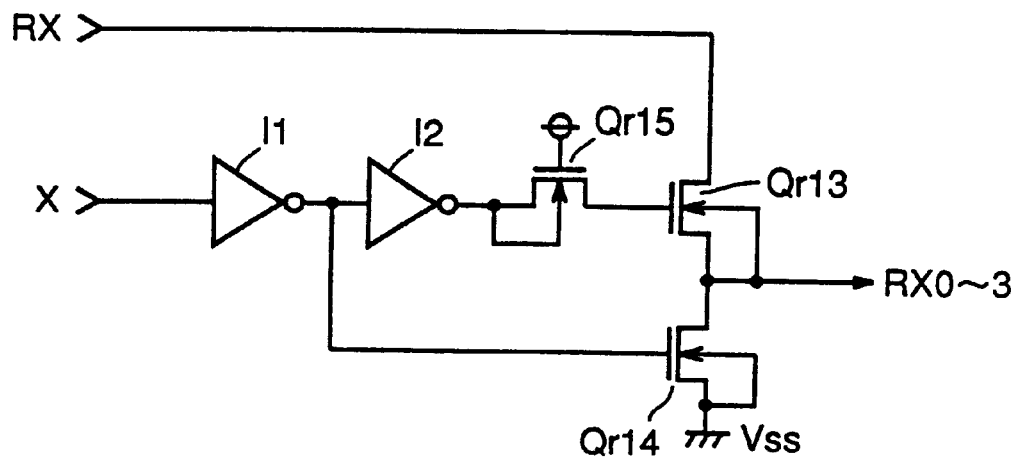

FIGS. 23 and 24 are circuit diagrams showing a structure of boost signal predecode circuit of a DRAM according to embodiment 15 and embodiment 16, respectively, of the present invention.

Figure 25:
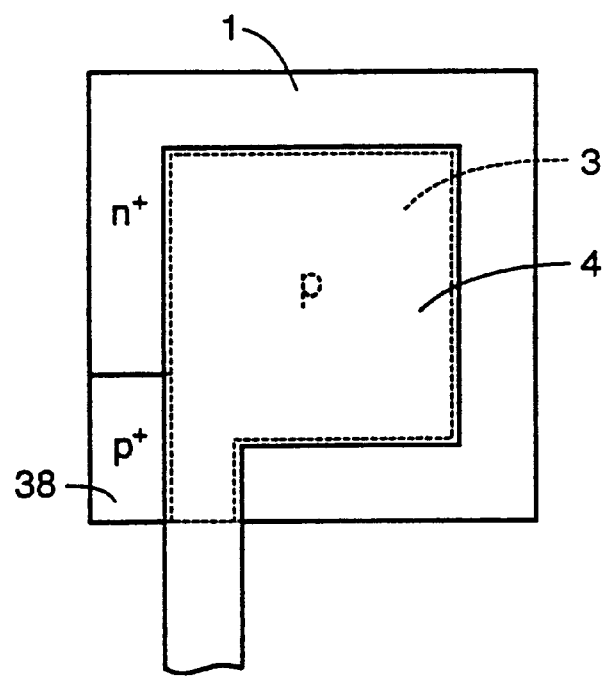

FIG. 25 is a plan view showing a structure of an N channel MOS capacitor in a DRAM according to embodiment 17 of the present invention.

Figure 26:
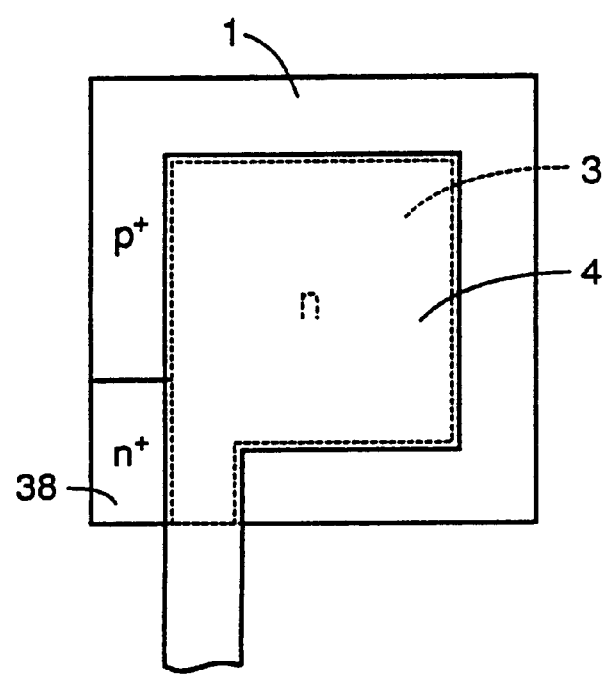

FIG. 26 is a plan view showing a structure of a P channel MOS capacitor of a DRAM according to embodiment 18 of the present invention.

Figure 27:
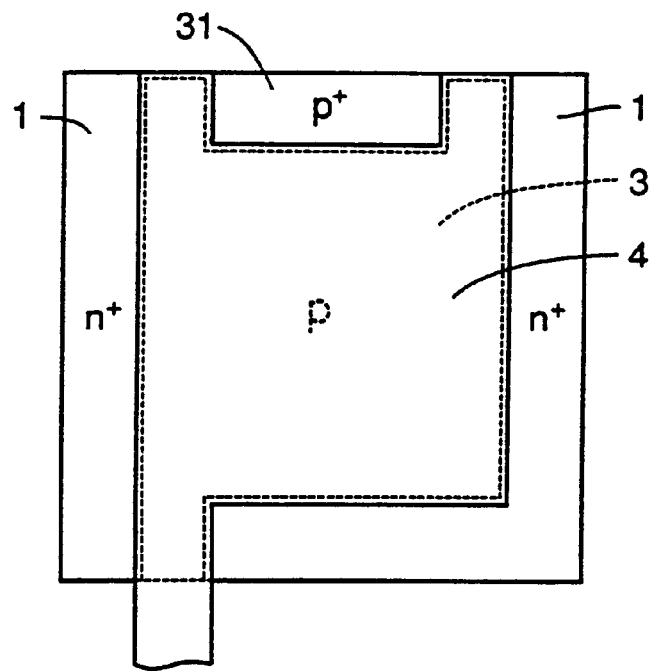

FIG. 27 is a plan view showing a structure of an N channel MOS capacitor of a DRAM according to embodiment 19 of the present invention.

Figure 28:
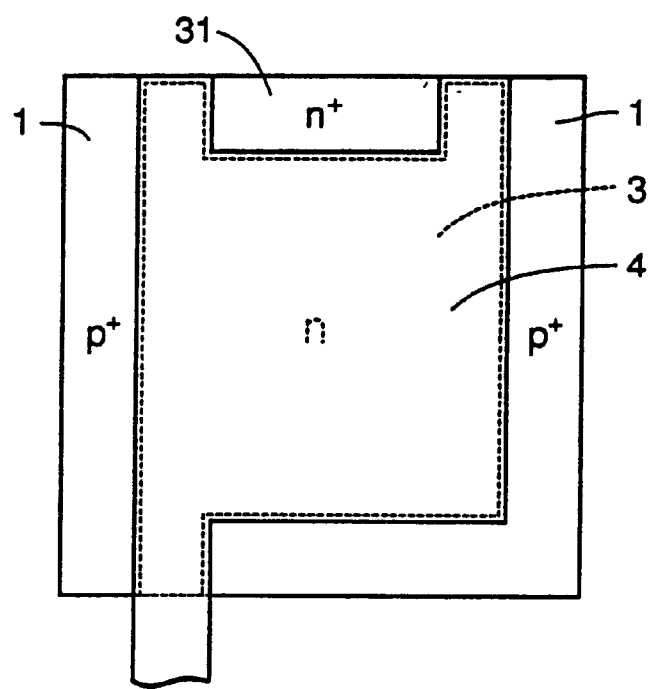

FIG. 28 is a plan view showing a structure of a P channel MOS capacitor of a DRAM according to embodiment 20 of the present invention.

Figure 29:
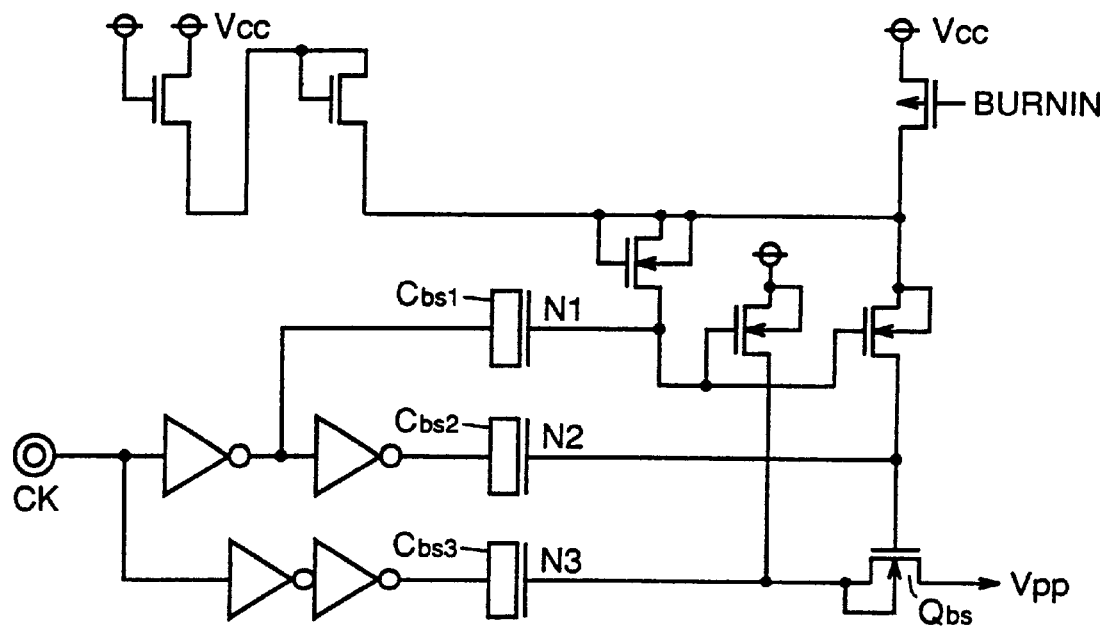

FIG. 29 is a circuit diagram showing the entire structure of a boosted power supply generation circuit of a DRAM according to embodiment 21 of the present invention.

Figure 30:
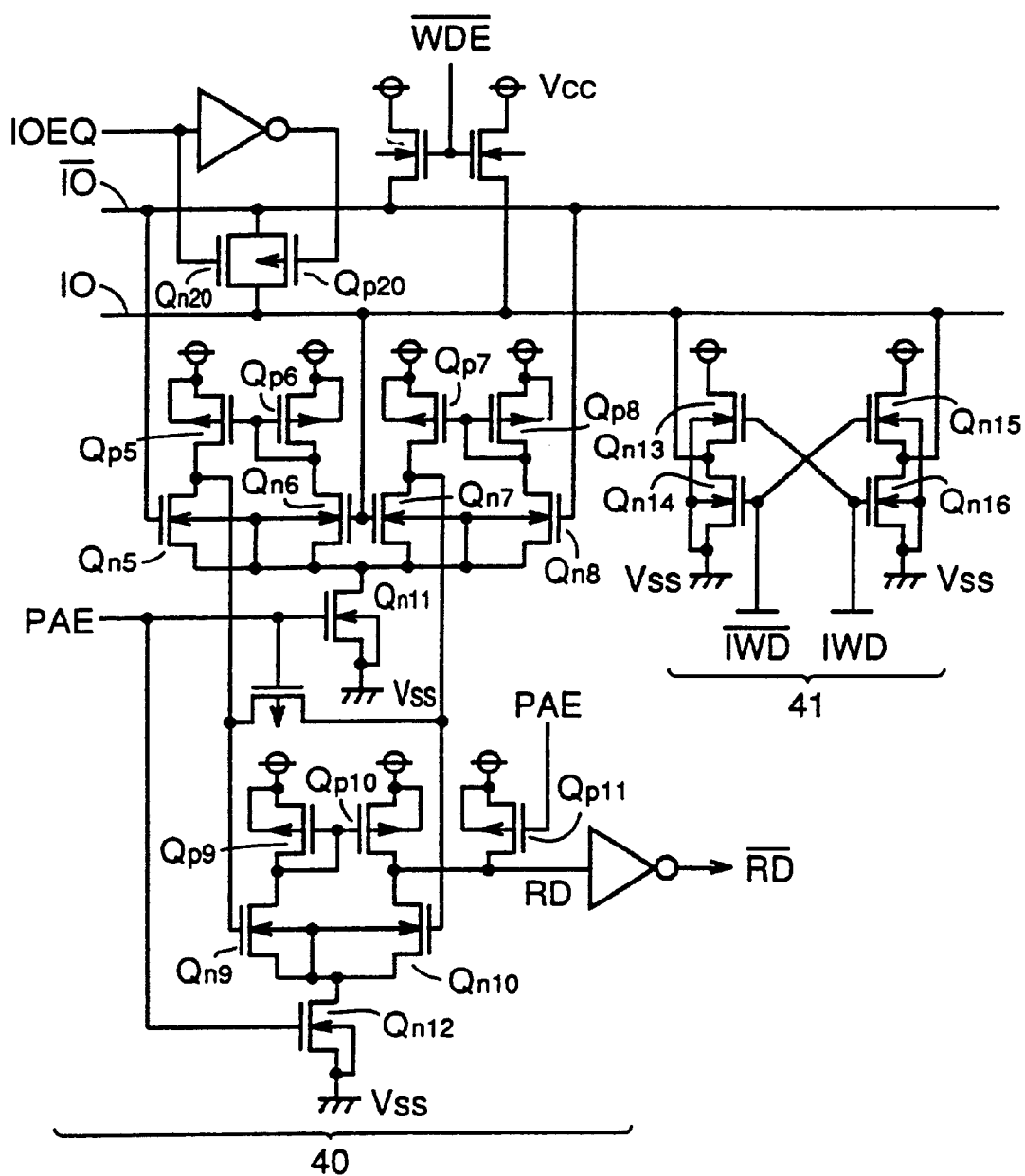

FIG. 30 is a circuit diagram showing a structure of an output preamplifier and a write circuit of a DRAM according to embodiment 22 of the present invention.

Figure 31:
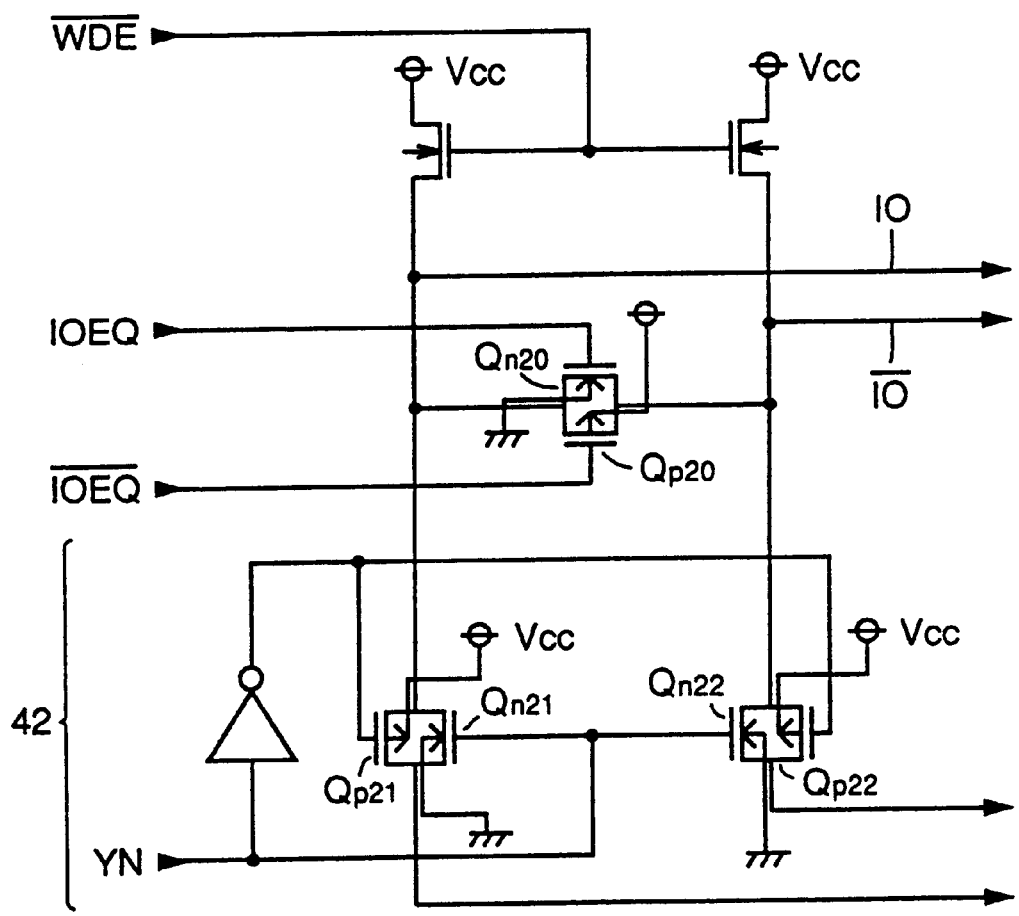

FIG. 31 is a circuit diagram showing a structure of an input/output line precharge circuit and an input/output line equalize circuit of a DRAM according to embodiment 23 of the present invention.

Figure 32:
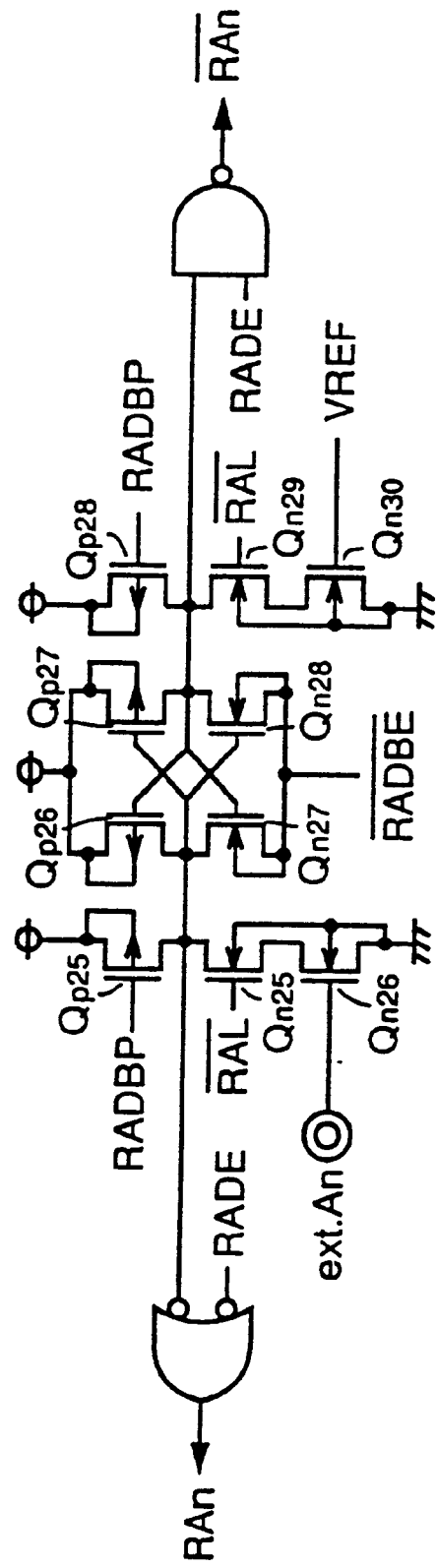

FIG. 32 is a circuit diagram showing a structure of a row address buffer of a DRAM according to embodiment 24 of the present invention.

FIGS. 33–36 are circuit diagrams of a structure of a column address buffer of a DRAM according to embodiments 25–28, respectively, of the present invention.

FIGS. 37–40 are circuit diagrams of a structure of a clock input buffer of a DRAM according to embodiments 29–32, respectively, of the present invention.

Figure 41:
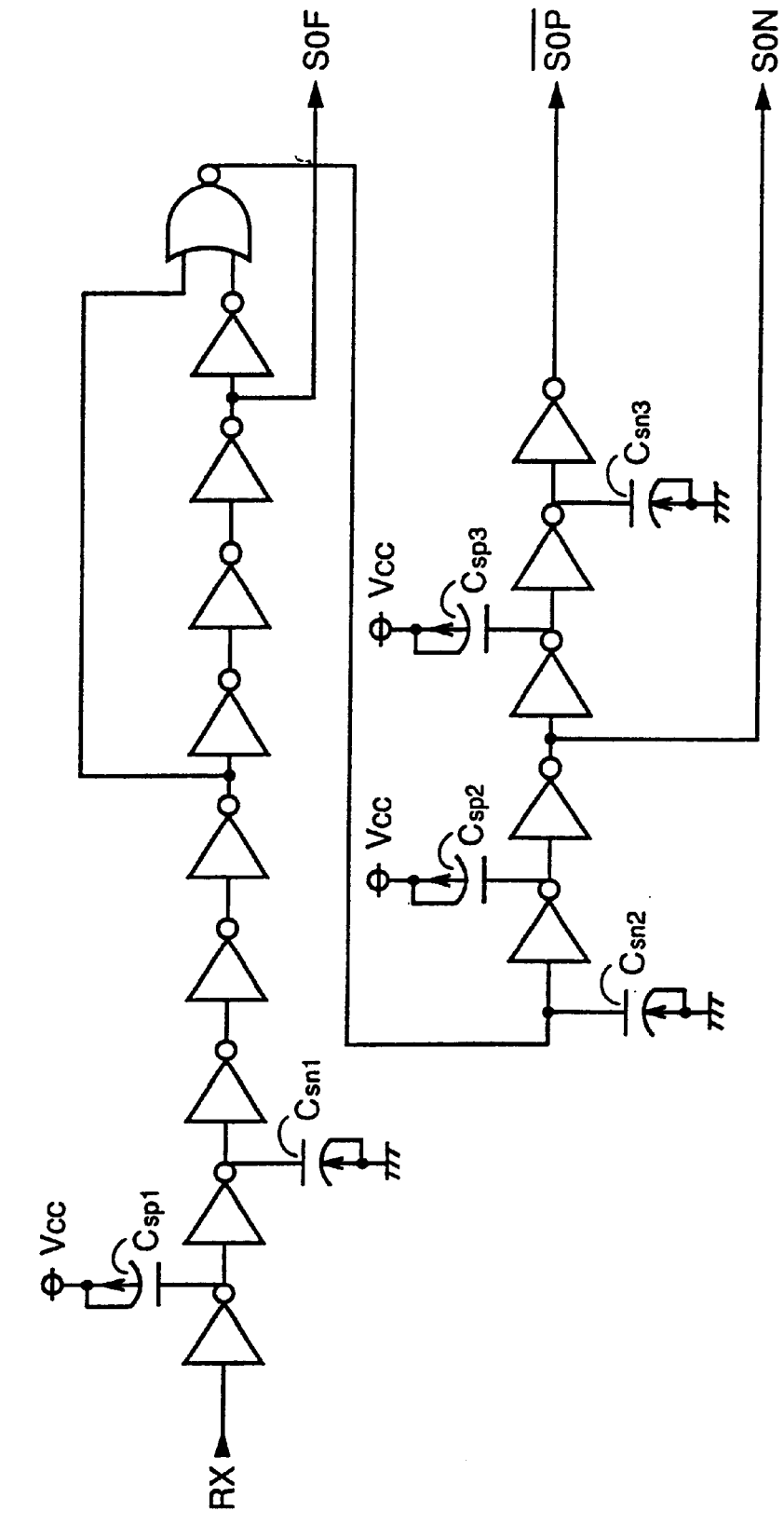

FIG. 41 is a circuit diagram showing a structure of the sense amplifier driving circuit of a DRAM according to embodiment 33 of the present invention.

Figure 42:
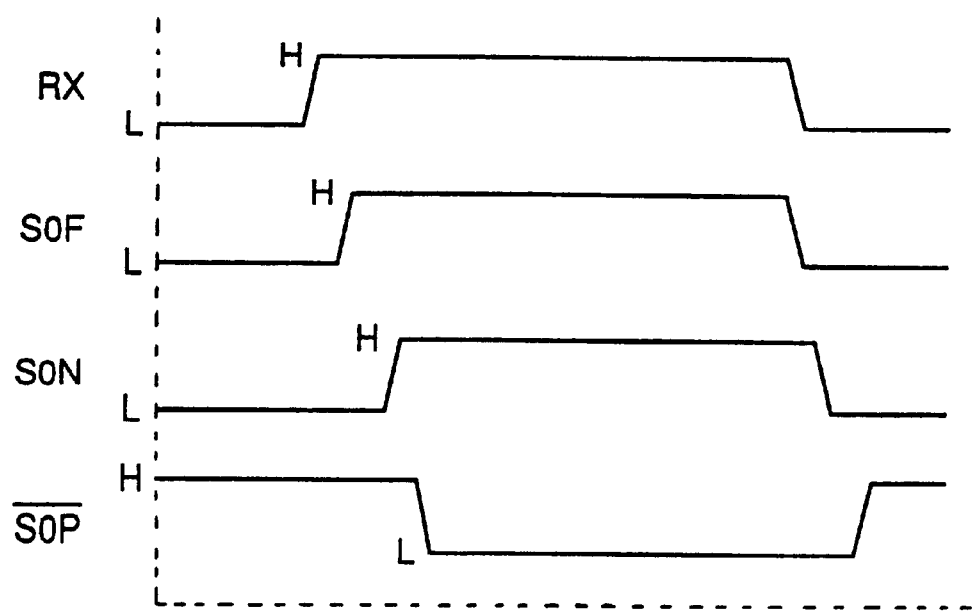

FIG. 42 is a timing chart showing an operation of the sense amplifier driving circuit of FIG. 41.

Figure 43:
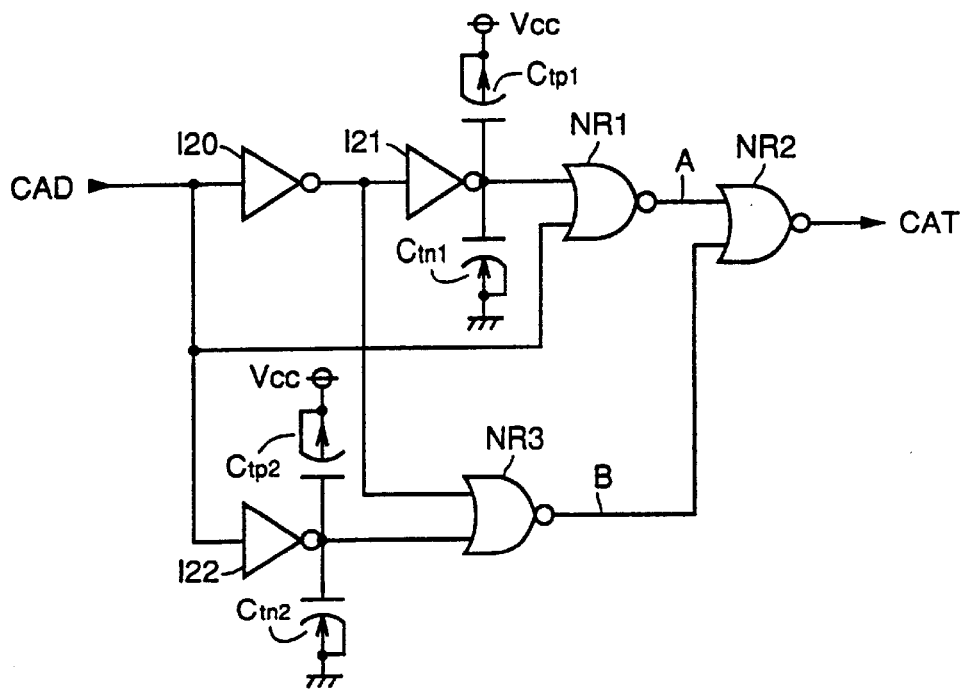

FIG. 43 is a circuit diagram showing a structure of a CAT circuit of a DRAM according to embodiment 34 of the present invention.

Figure 44:
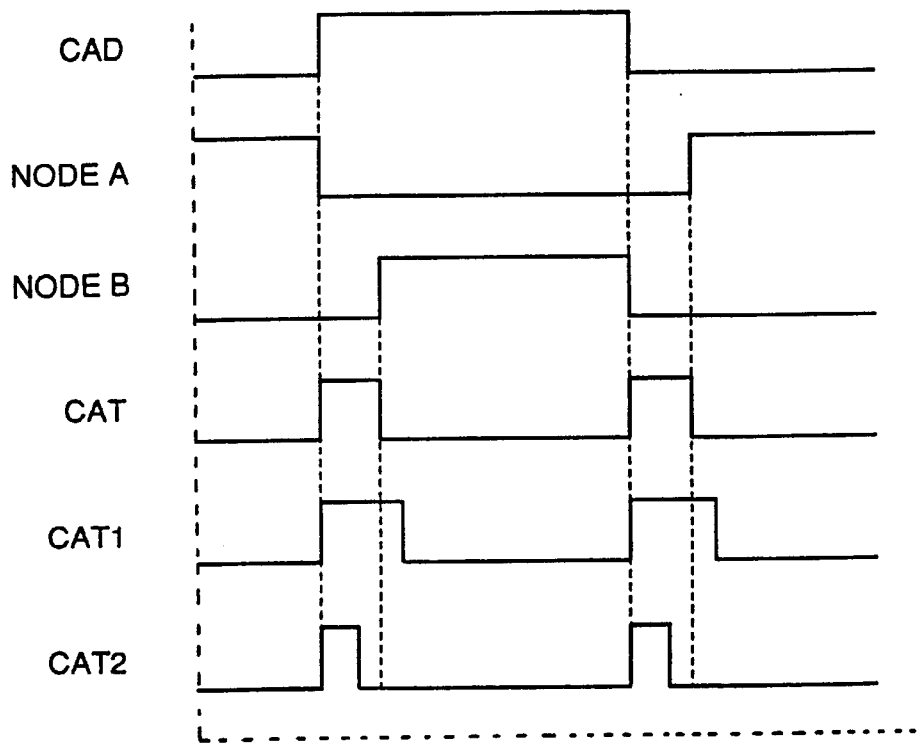

FIG. 44 is a timing chart showing an operation of the CAT circuit of FIG. 43.

Figure 45:
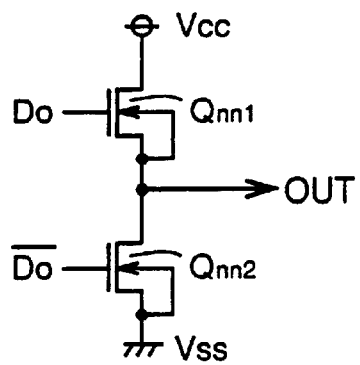
Figure 46:
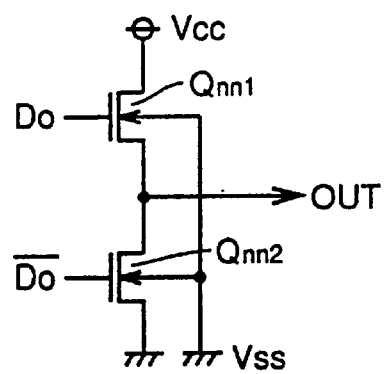

FIGS. 45 and 46 are circuit diagrams showing a structure of an N—N buffer of a DRAM according to embodiment 35 and embodiment 36, respectively, of the present invention.

Figure 47:
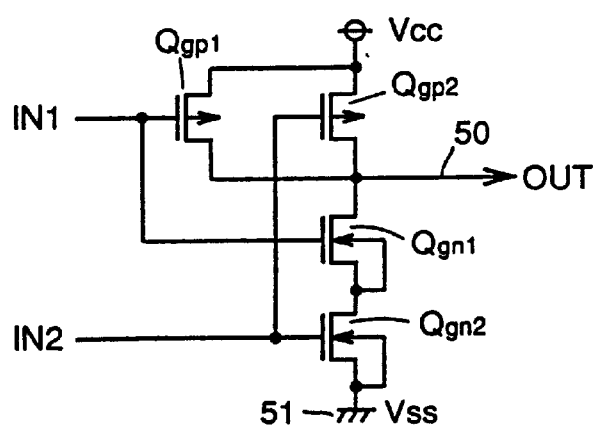

FIG. 47 is a circuit diagram showing a structure of a NAND circuit of a DRAM according to embodiment 37 of the present invention.

Figure 48:
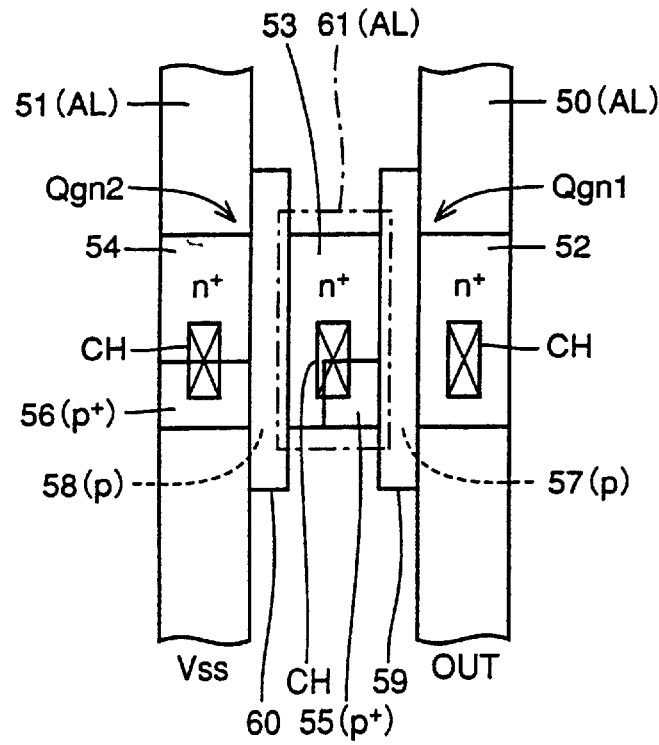

FIG. 48 is a plan view showing a partial structure of the NAND circuit of FIG. 47.

FIGS. 49–52 are plan views showing a partial structure of the NAND circuit of a DRAM according to embodiments 38–41, respectively, of the present invention.

Figure 52:
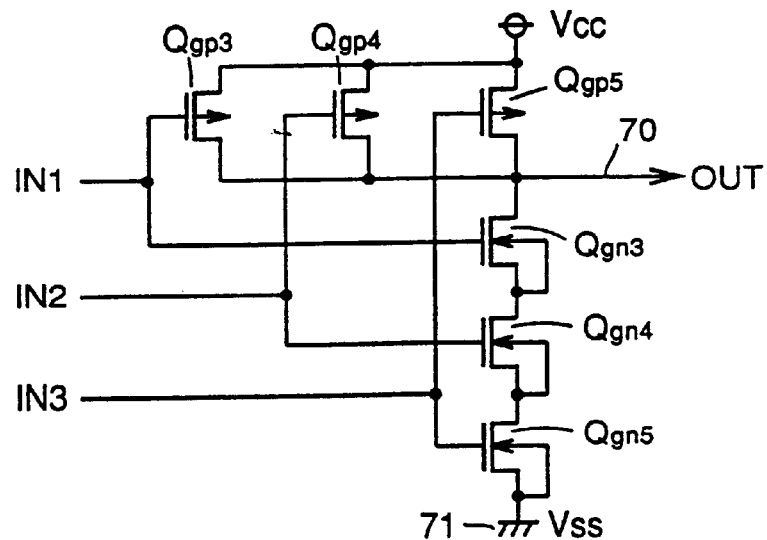
Figure 53:
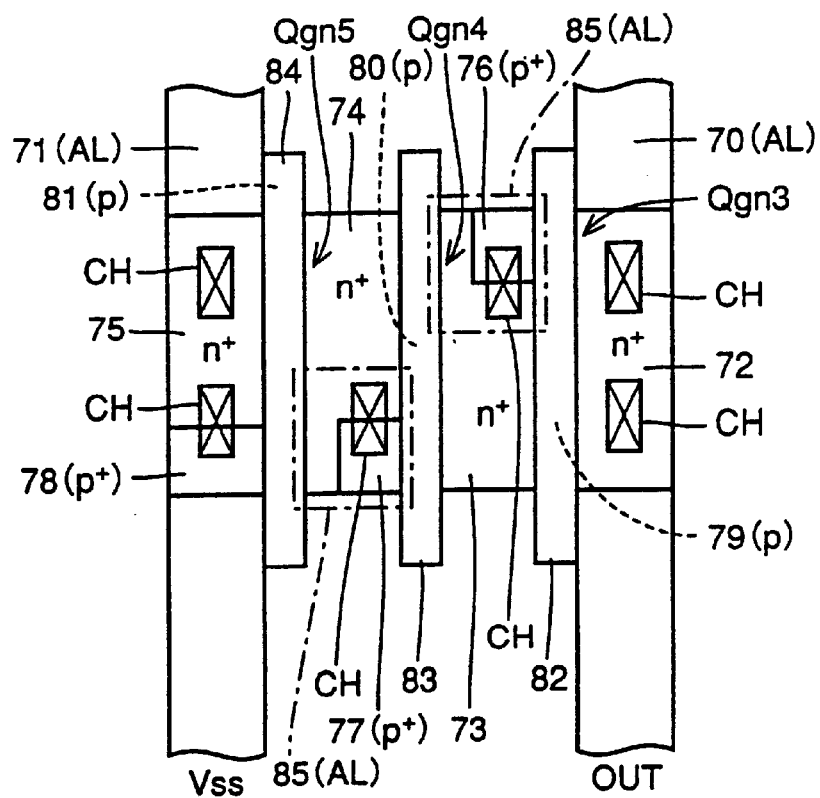

FIGS. 53 is a plan view showing a partial structure of the NAND circuit of FIG. 52.

FIGS. 54–59 are circuit diagrams showing a structure of a NAND circuit of a DRAM according to embodiments 42–47, respectively, of the present invention.

Figure 60:
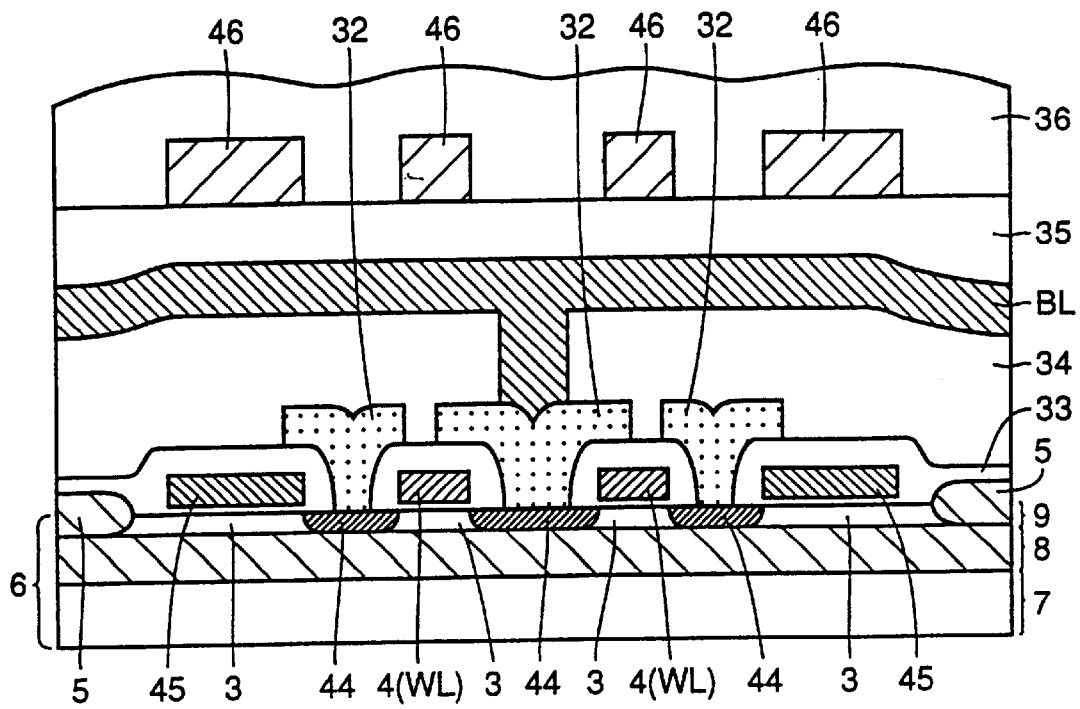

FIG. 60 is a sectional view of a memory cell in a DRAM according to embodiment 48 of the present invention.

Figure 61:
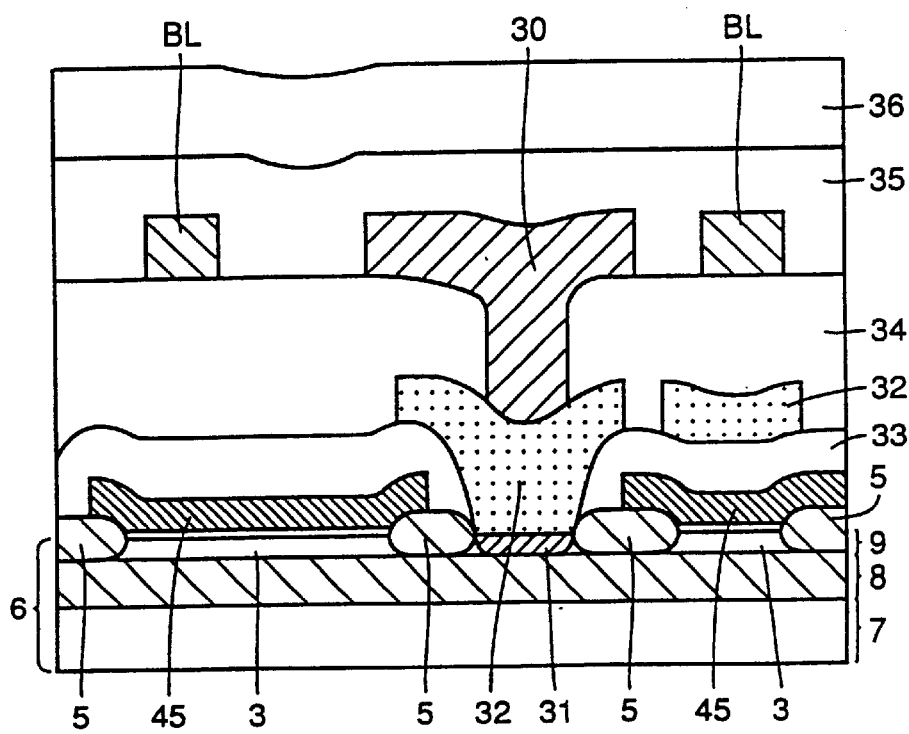

FIG. 61 is a sectional view of the memory cell of FIG. 60 taken along the direction of a word line.

Figure 62:
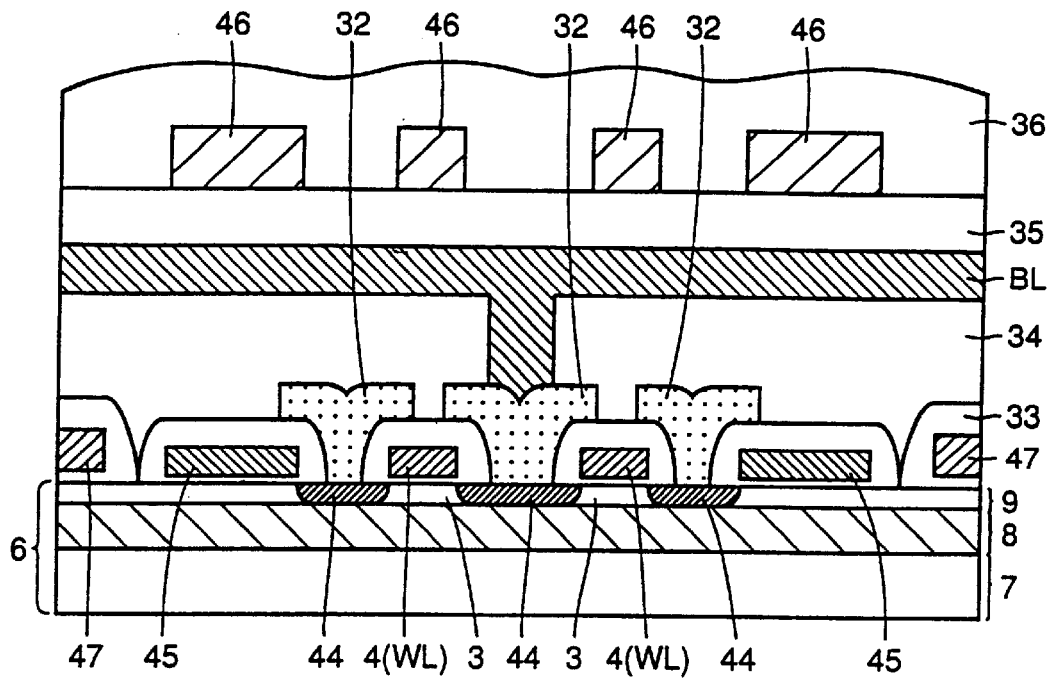

FIG. 62 is a sectional view showing a structure of a memory cell in a DRAM according to embodiment 49 of the present invention.

Figure 63:
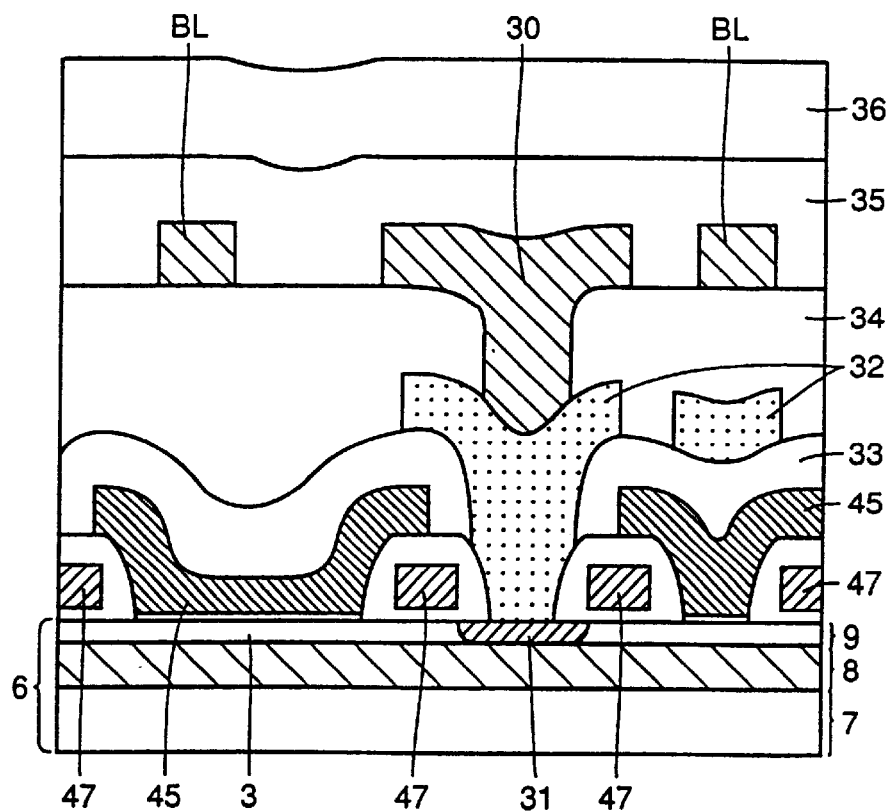

FIG. 63 is a sectional view of the memory cell of FIG. 62 taken along the direction of a word line.

Figure 64:
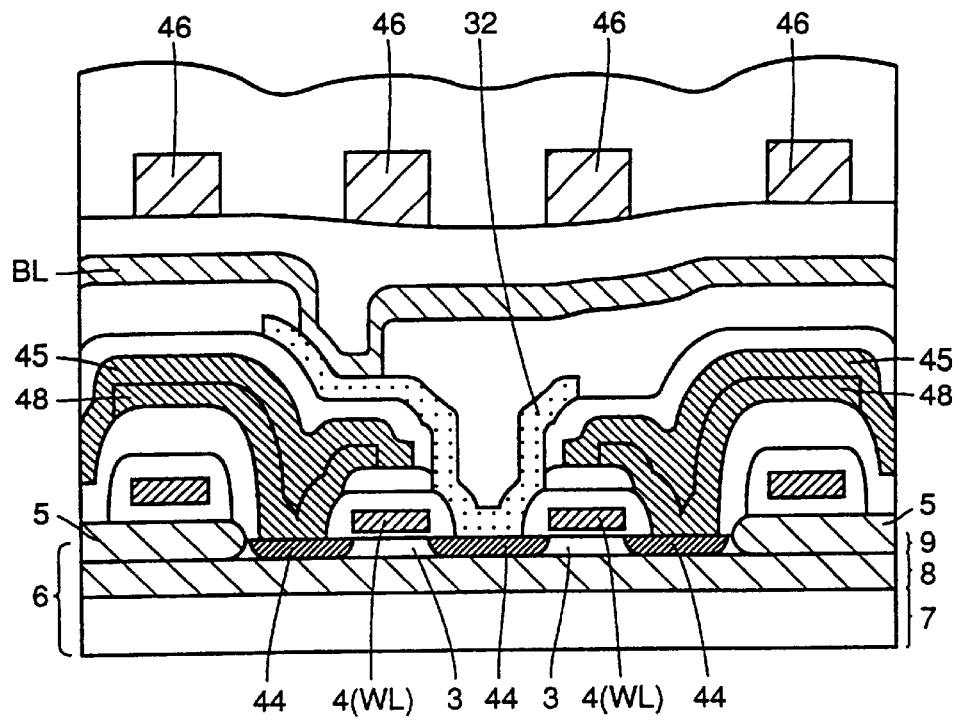
Figure 65:
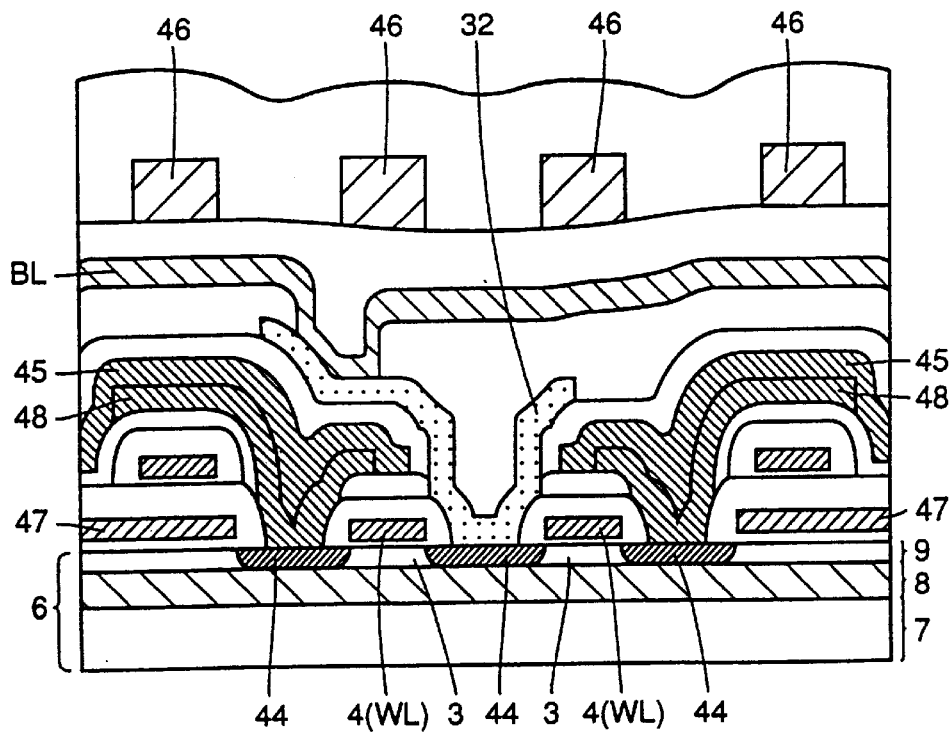

FIGS. 64, 65 are sectional view of a memory cell of a DRAM according to embodiment 50 and embodiment 51, respectively of the present invention.

FIGS. 66–69 are layout diagrams showing the entire structure of a DRAM according to embodiments 52–55, respectively of the present invention.

FIGS. 70–76 are diagrams showing the concept of a DRAM according to embodiments 56–62, respectively, of the present invention.

Figure 76:
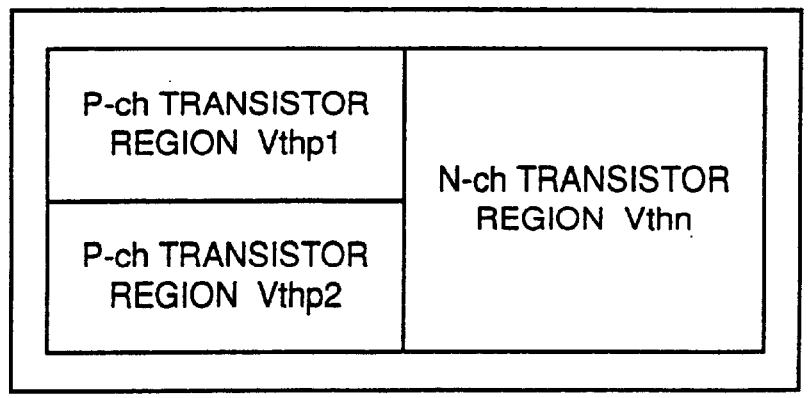
Figure 77:
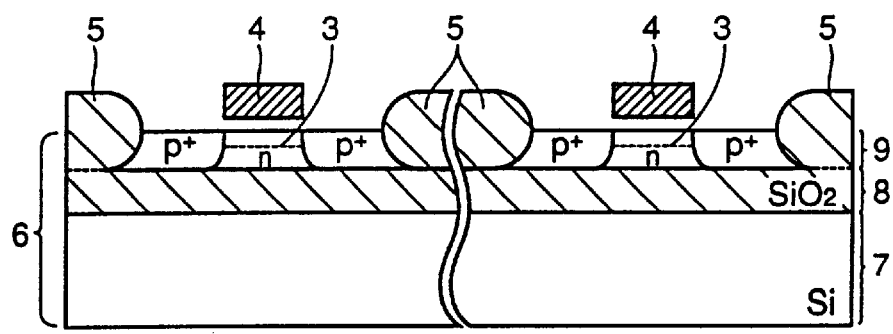

FIG. 77 is a sectional view of two P channel MOS transistors in a DRAM shown in FIG. 76.

Figure 78:
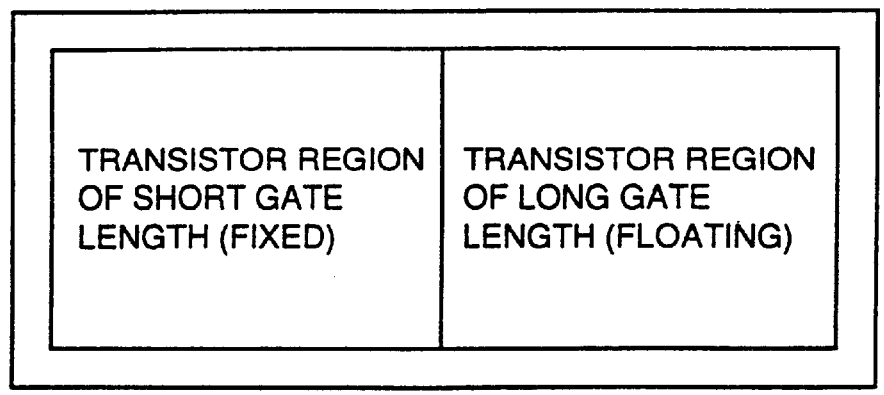

FIG. 78 is a diagram showing the concept of a DRAM according to embodiment 63 of the present invention.

Figure 79:
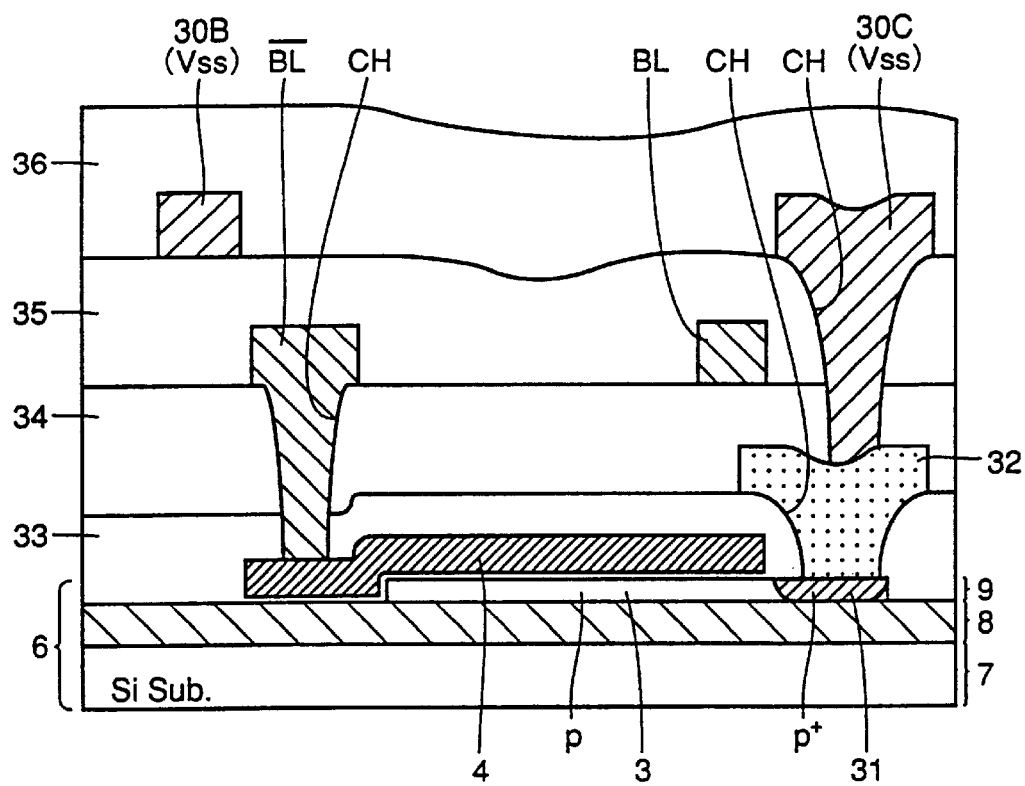

FIG. 79 is a sectional view of a sense amplifier of a DRAM according to embodiment 64 of the present invention.

Figure 80:
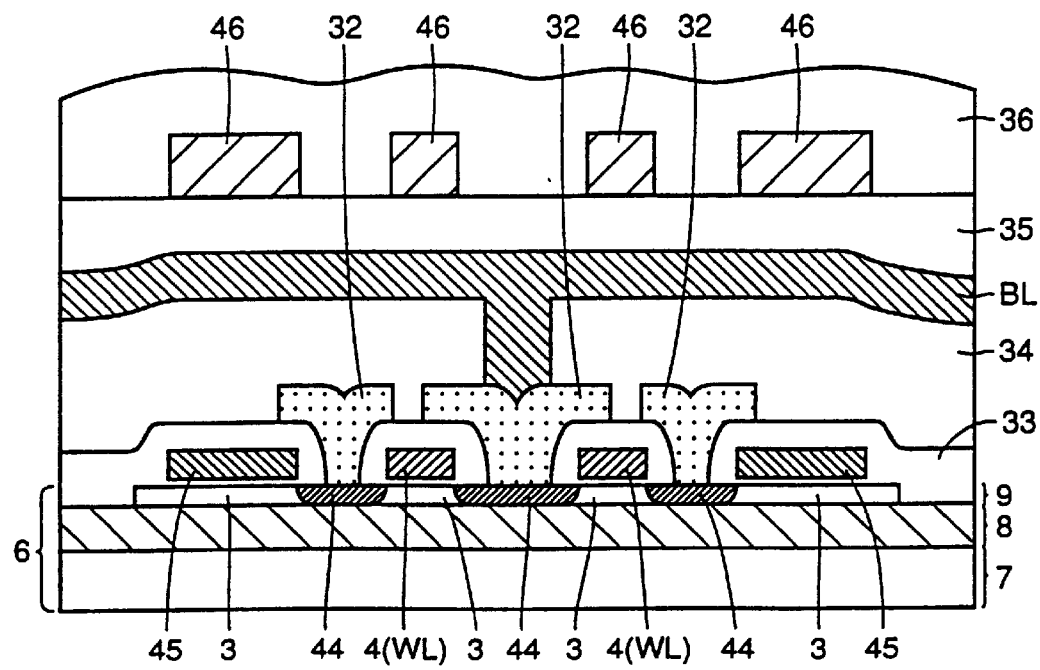

FIG. 80 is a sectional view of a memory cell of a DRAM of FIG. 79.

Figure 81:
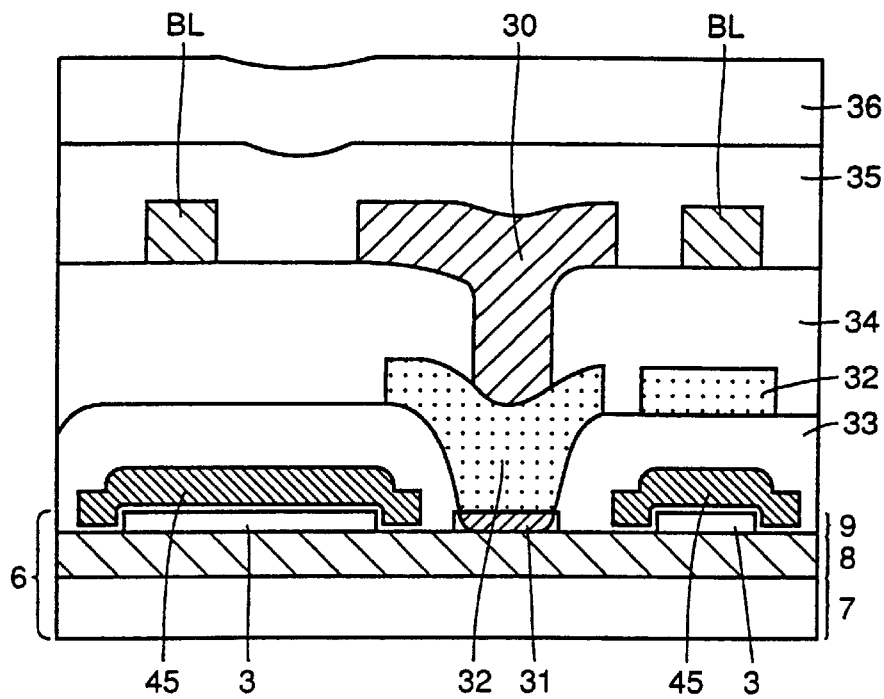

FIG. 81 is a sectional view of a memory cell of FIG. 80 taken along the direction of a word line.

Figure 82:
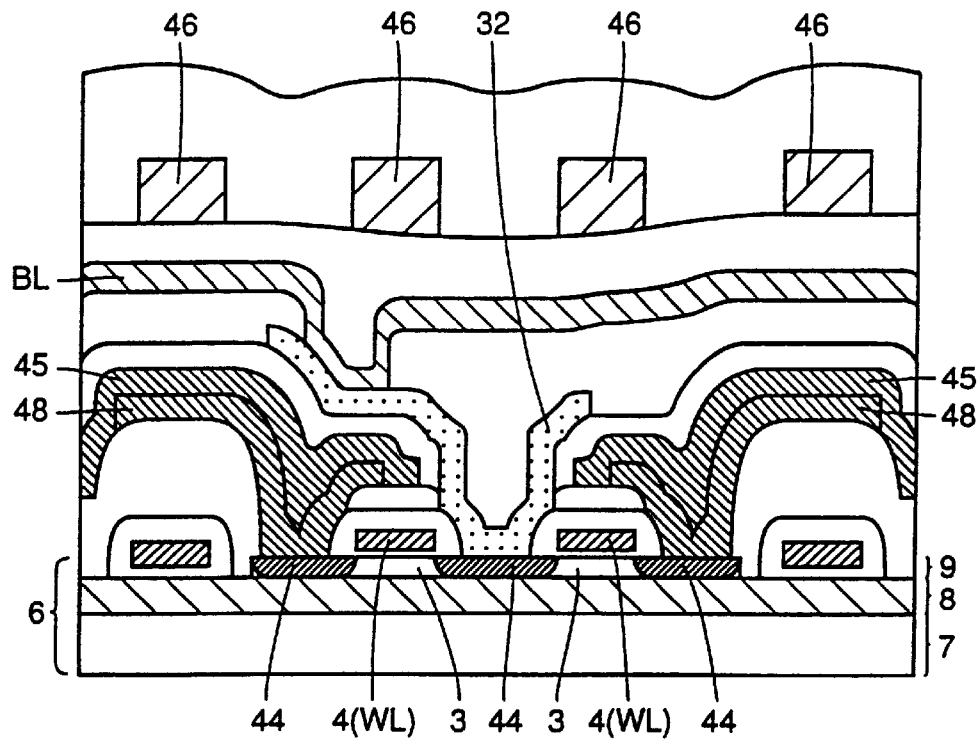

FIG. 82 is a sectional view showing a structure of a memory cell of a DRAM according to embodiment 65 of the present invention.

Figure 83:
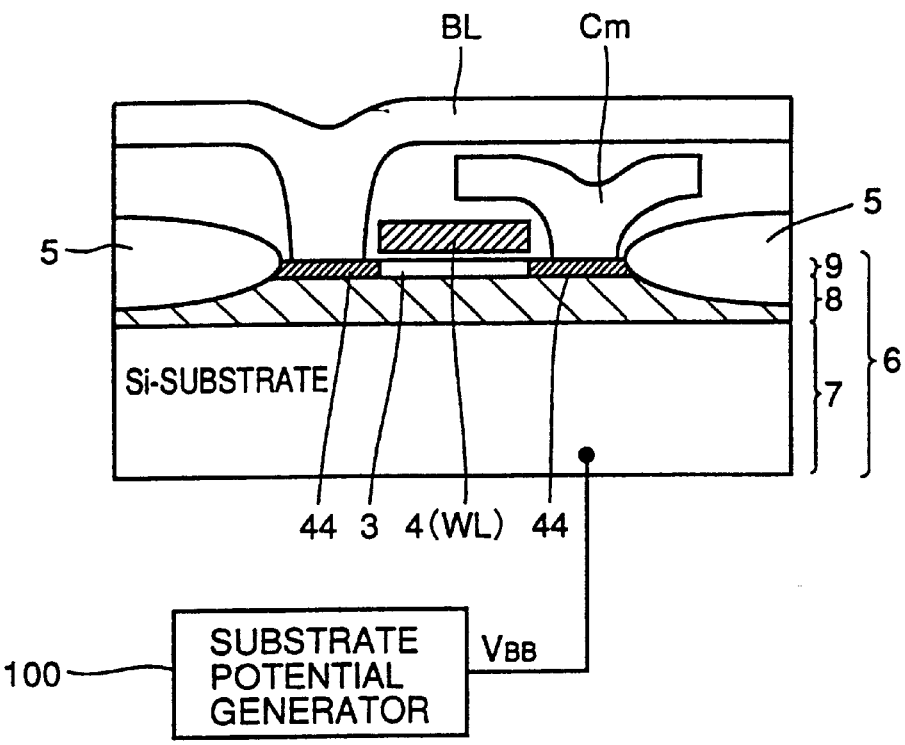

FIG. 83 is a diagram showing the concept of a partial structure of a DRAM according to embodiment 66 of the present invention.

Figure 84:
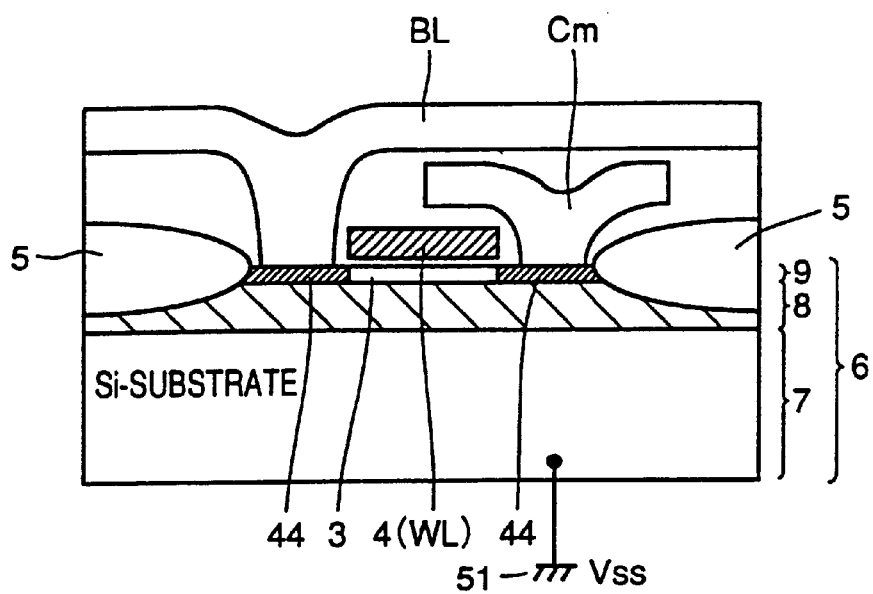

FIG. 84 is a sectional view showing a partial structure of a DRAM according to embodiment 67 of the present invention.

Figure 85:
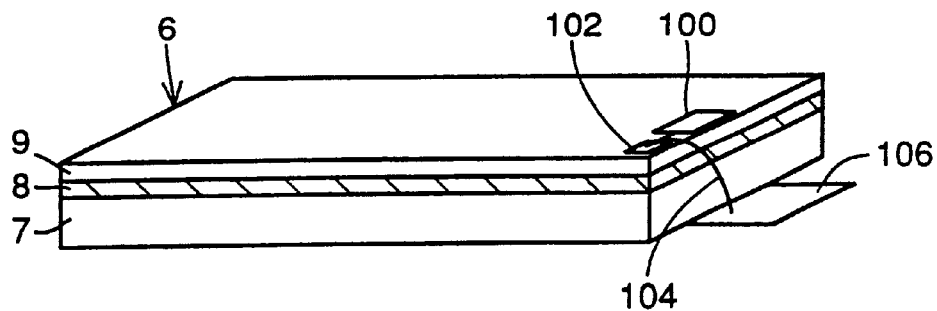
Figure 86:
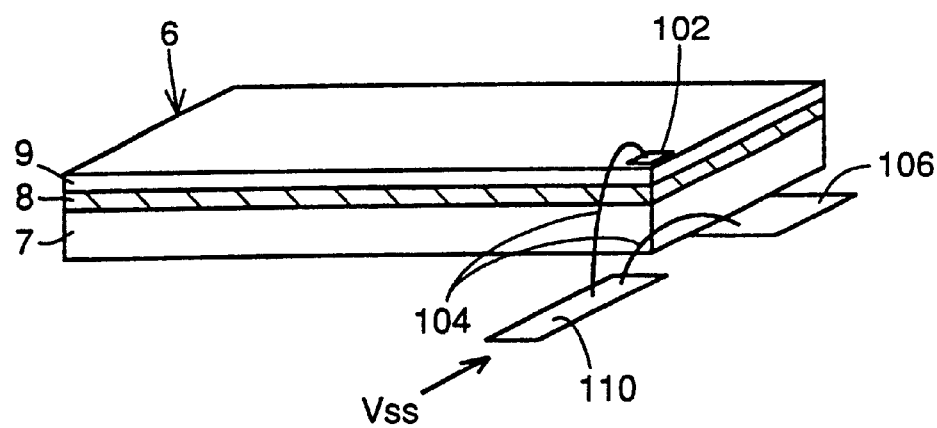
Figure 87:
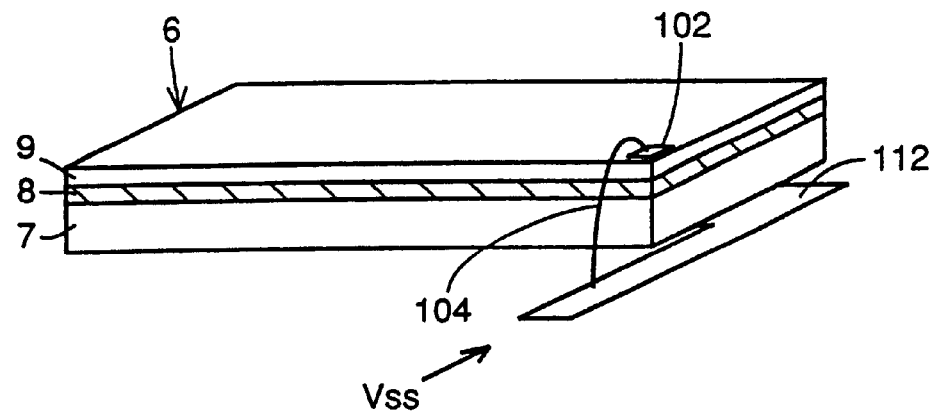

FIGS. 85–87 are perspective views showing a structure of a DRAM according to embodiments 68–70, respectively, of the present invention.

Figure 88:
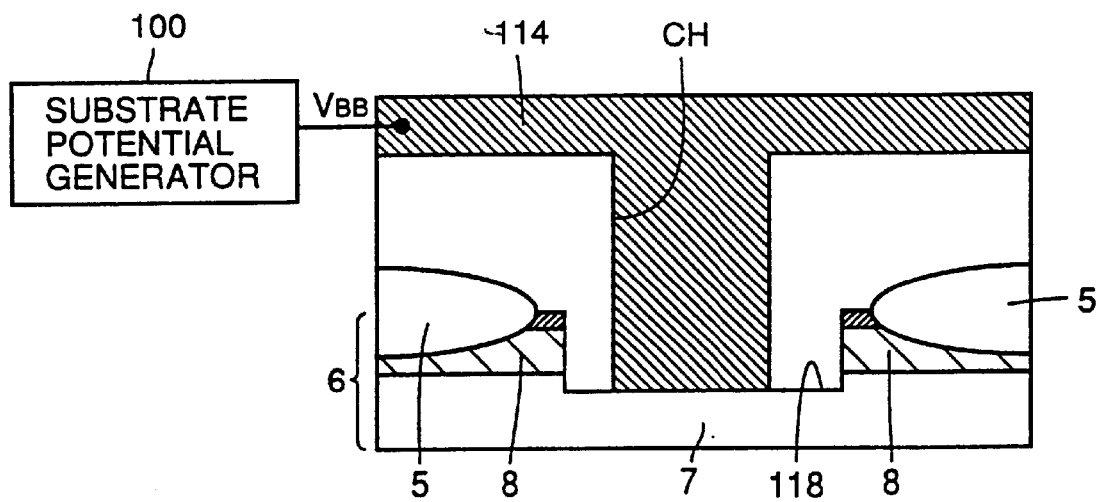
Figure 89:
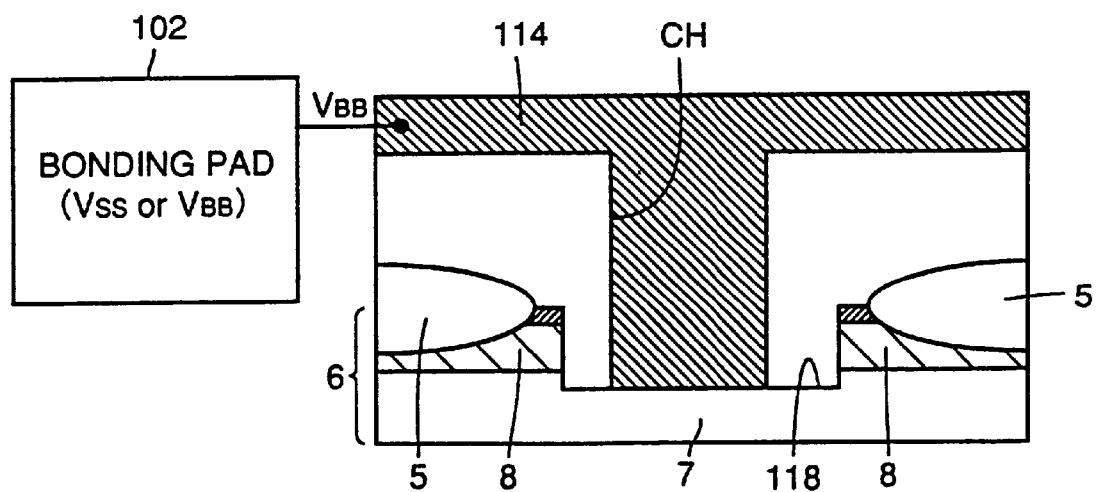

FIGS. 88 and 89 are diagrams of the concept of a partial structure of a DRAM according to embodiments 71 and 72, respectively, of the present invention.

Figure 90:
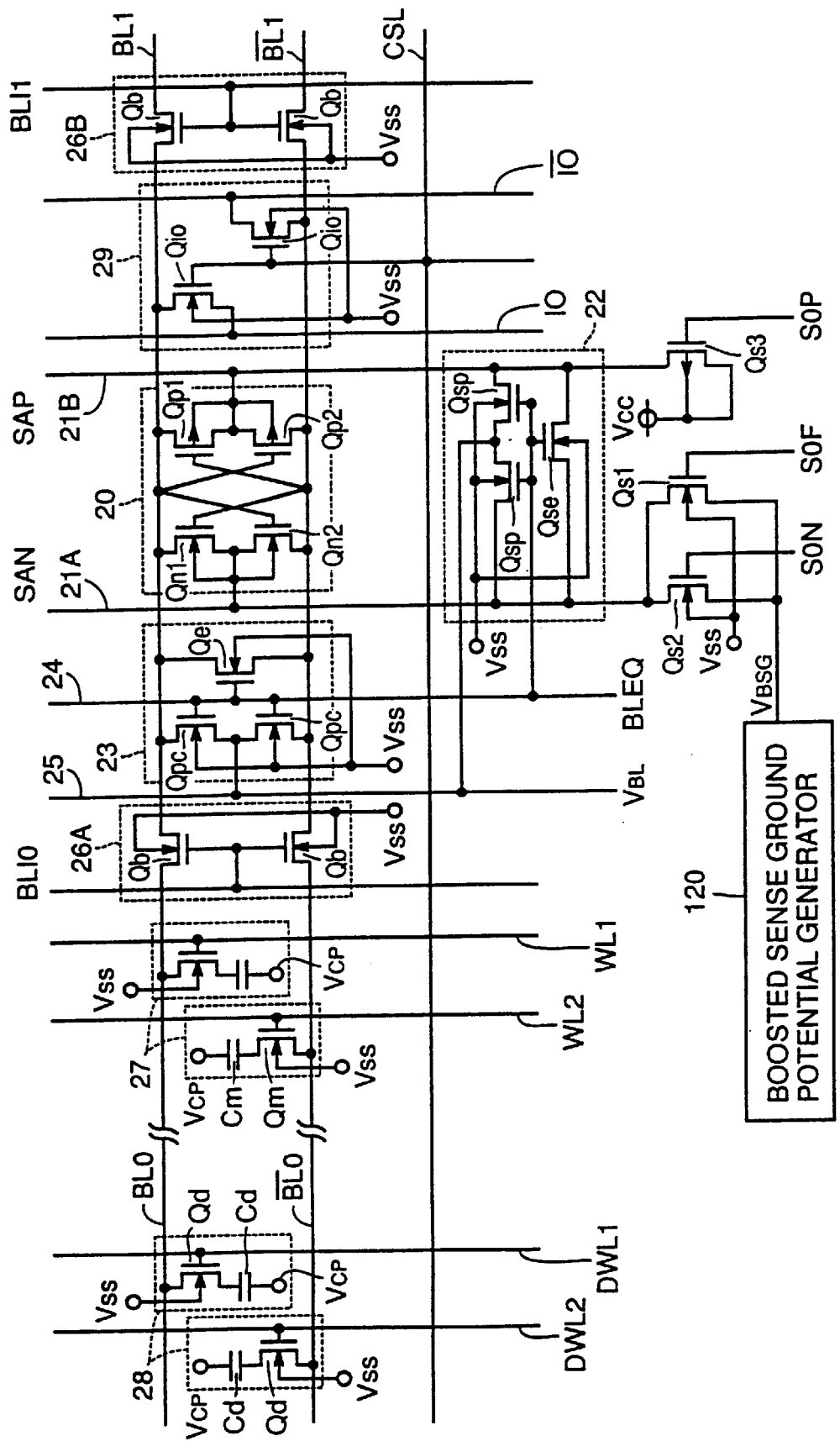

FIG. 90 is a circuit diagram showing a partial structure of a memory cell, a sense amplifier, and an input/output circuit of a DRAM according to embodiment 73 of the present invention.

Figure 91:
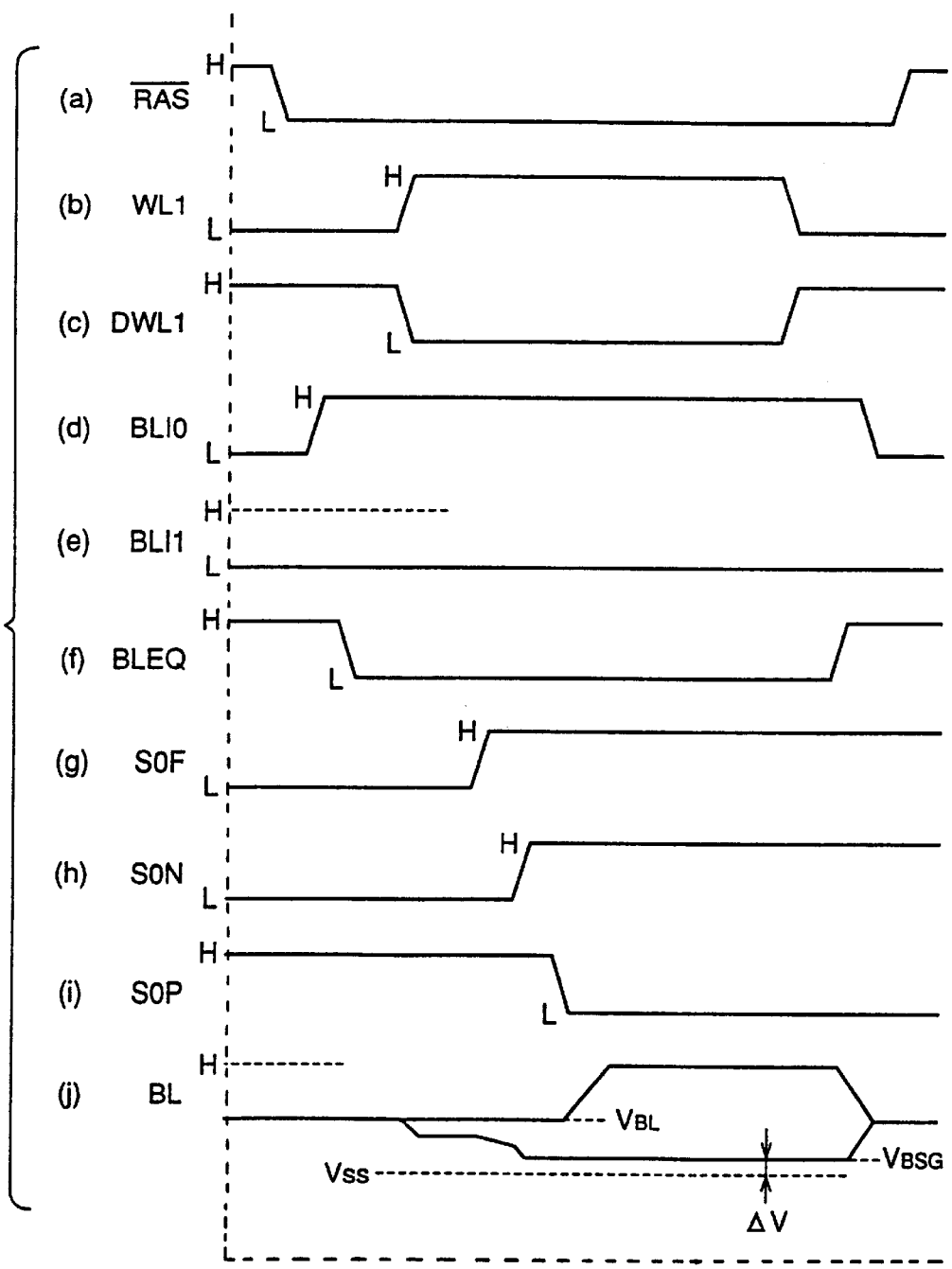

FIG. 91 is a timing chart showing an operation of the DRAM of FIG. 90.

Figure 92:
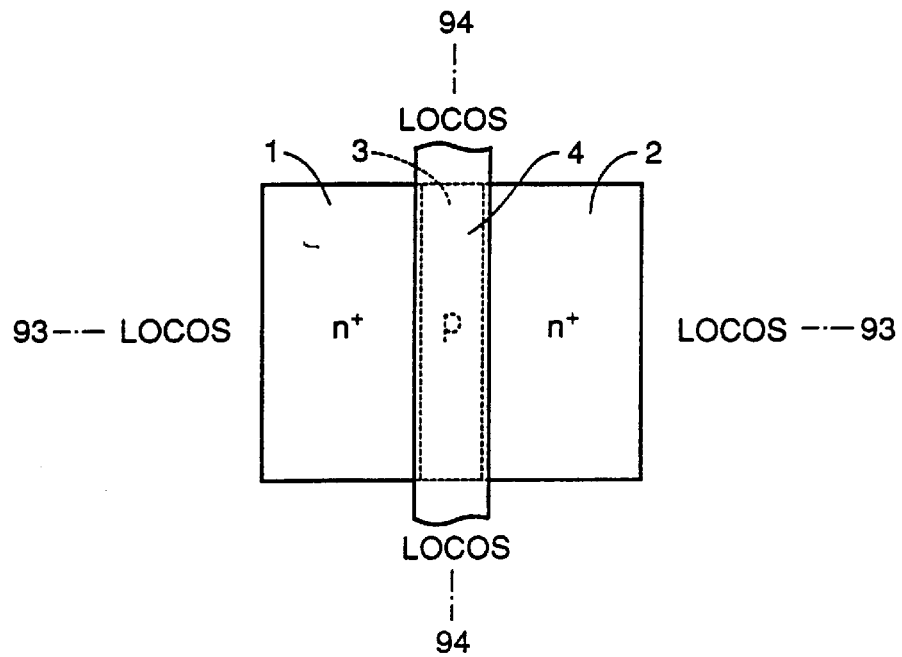

FIG. 92 is a plan view showing a structure of a conventional N channel MOS transistor formed on an SOI substrate.

Figure 93:
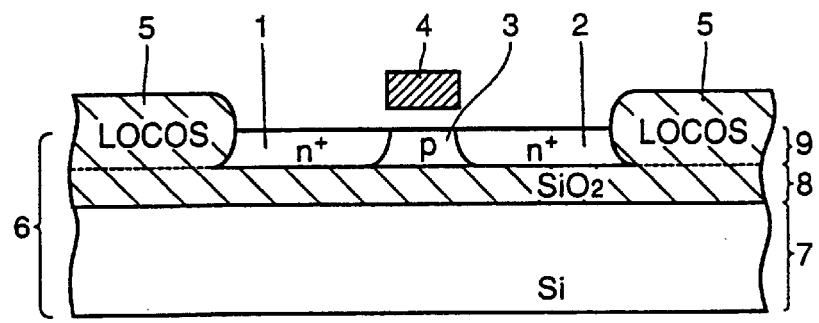
Figure 94:
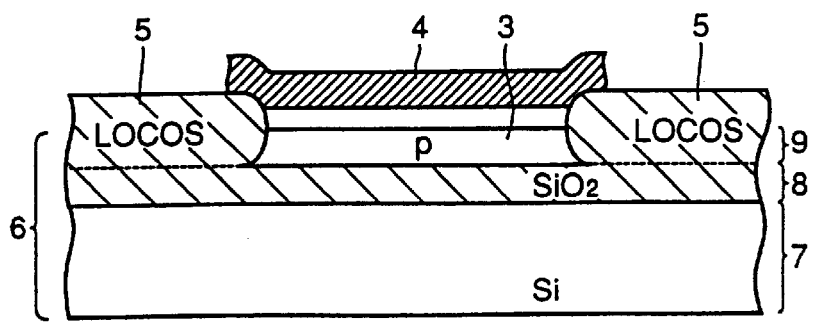

FIGS. 93 and 94 are sectional views of the transistor of FIG. 92 taken along lines 93—93, and 94—94, respectively.

DESCRIPTION OF THE PREFERRED EMBODIMENTS

The embodiments of the present invention will be described hereinafter with reference to the drawings. In the drawings, the same reference characters denote the same or corresponding components.

Embodiment 1

Figure 2:
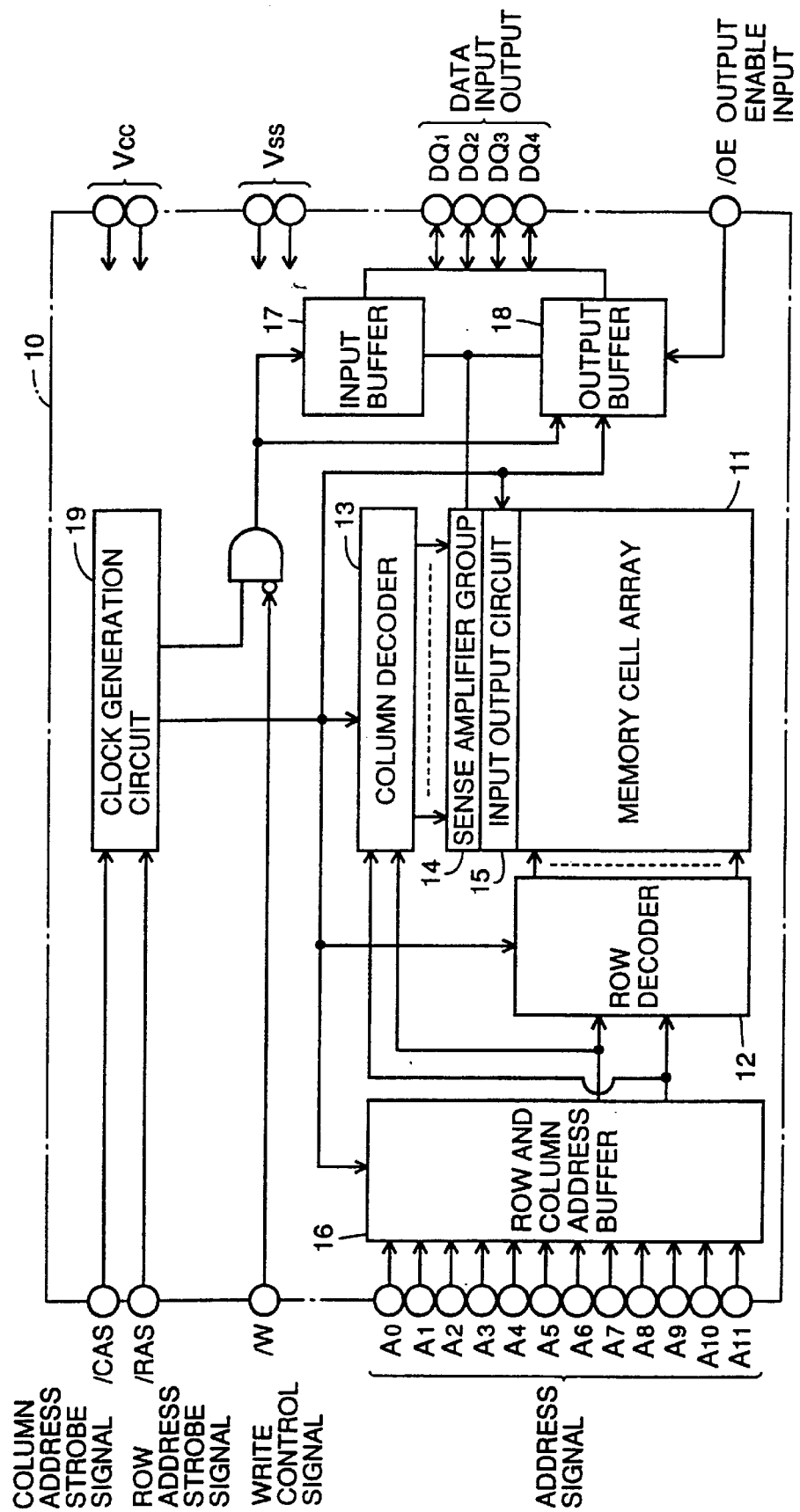
FIG. 2 is a block diagram showing the entire structure of a DRAM.

FIG. 2 is a block diagram showing an entire structure of a DRAM according to embodiment 1 of the present invention. Referring to FIG. 2, a DRAM 10 includes a memory cell array 11, a row decoder 12, a column decoder 13, a sense amplifier group 14, an input/output circuit 15, a row-and-column address buffer 16, an input buffer 17, an output buffer 18, and a clock generation circuit 19.

In memory cell array 11, a plurality of word lines (not shown) are disposed along the row direction, and a plurality of bit line pairs (not shown) are disposed along the column direction, with a plurality of memory cells (not shown) at the crossings thereof. Row decoder 12 responds to a row address signal from address buffer 16 to select and drive one of the plurality of word lines. Column decoder 13 responds to a column address signal from address buffer 16 to select one of the plurality of bit line pairs. Sense amplifier group 14 includes a plurality of sense amplifiers. The plurality of sense amplifiers are provided corresponding to the plurality of bit line pairs. Each sense amplifier amplifies the potential difference of a corresponding bit line pair. Input/output circuit 15 provides the potential of the bit line pair selected by column decoder 13 to output buffer 18. Output buffer 18 amplifies the provided potential to output the same as output data $DQ_1$–$DQ_4$. Input buffer 17 amplifies externally applied input data $DQ_1$–$DQ_4$. Input/output circuit 15 provides the input data amplified in input buffer 17 to the bit line pair selected by column decoder 13. Address buffer 16 selectively provides externally applied address signals A0–A11 to row decoder 12 and column decoder 13.

Figure 1:
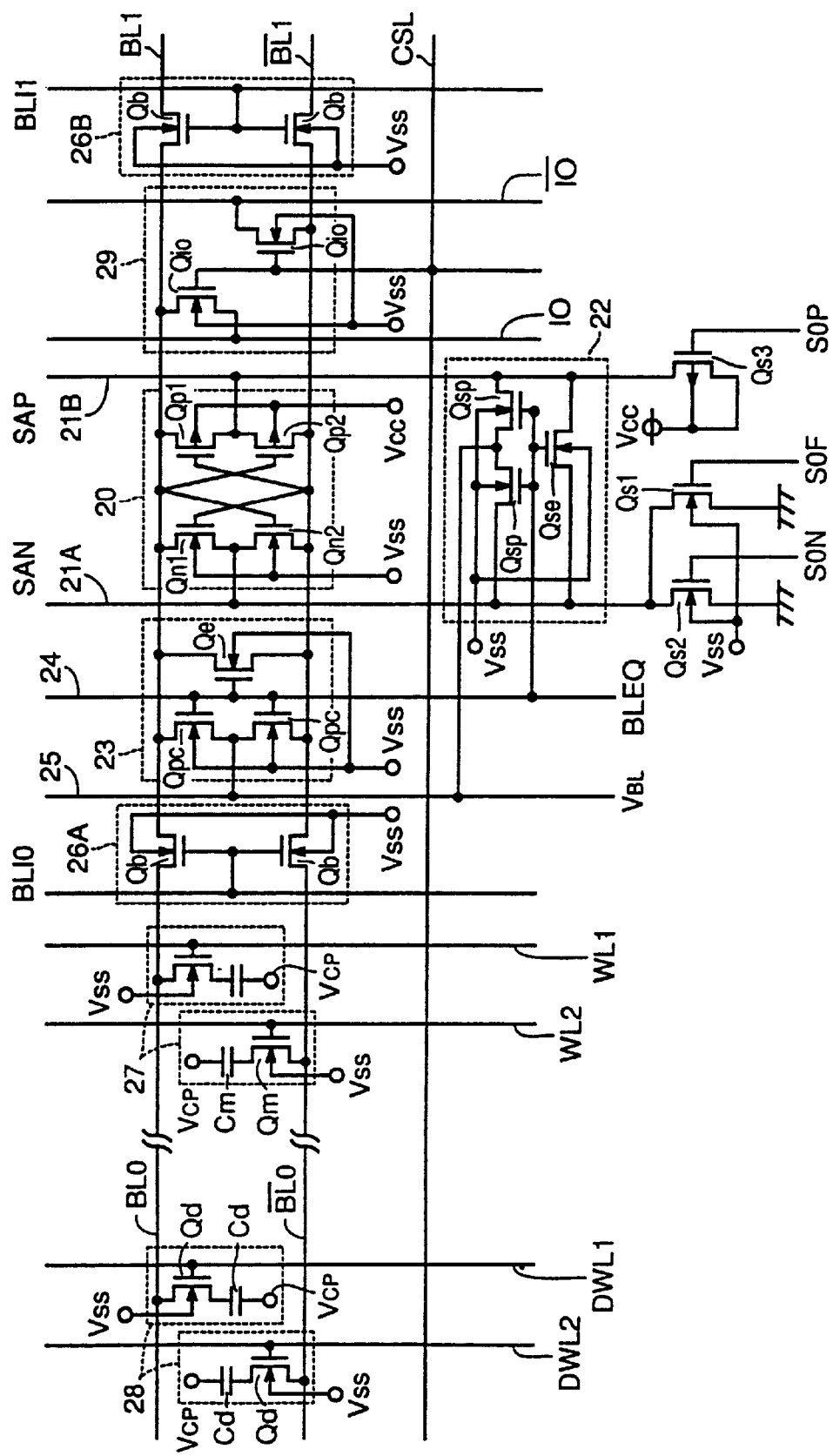
FIG. 1 is a circuit diagram showing partially a structure of a memory cell, a sense amplifier, and an input/output circuit in a DRAM according to embodiment 1 of the present invention.

FIG. 1 is a circuit diagram showing in detail memory cell array 11, sense amplifier group 14 and input/output circuit 15 of FIG. 12 partially. Referring to FIG. 1, word lines WL1, WL2, . . . and bit line pairs BL0, /BL0, BL1, /BL1 crossing these word lines are disposed in memory cell array 11. A memory cell 27 is disposed at the crossing between bit lines BL0, /BL0 and word lines WL1, WL2.

One sense amplifier 20 is disposed corresponding to two bit line pairs BL0, /BL0 and BL1, /BL1. Bit lines BL0 and /BL0 are connected to sense amplifier 20 via a bit line select circuit 26A. Bit lines BL1 and /BL1 are connected to sense amplifier 20 via a bit line select circuit 26B. Bit line select circuit 26A responds to a bit line select signal BLI0 to connect bit line pair BL0, /BL0 to sense amplifier 20, whereby sense amplifier 20 amplifies the potential difference between bit lines BL0 and /BL0. Bit line select circuit 26B responds to a bit line select signal BLI1 to connect bit lines BL1 and /BL1 to sense amplifier 20, whereby sense amplifier 20 amplifies the potential difference between bit lines BL1 and /BL1. Thus, embodiment 1 employs the so-called shared sense amplifier system.

One bit line precharge circuit 23 is provided corresponding to sense amplifier 20. Precharge circuit 23 corresponds to a bit line equalize signal BLEQ to precharge bit line pairs BL0, /BL0, BL1, /BL1 to a predetermined potential $V_{BL}$.

Also, one column select circuit 29 is provided corresponding to one or a plurality of sense amplifiers 20. Column select circuit 29 responds to a column select signal CSL to connect bit line pairs BL0, /BL0, BL1, /BL1 to an input/output line pair IO and /IO.

A drive line precharge circuit 22 is provided between sense amplifier drive lines 21A and 21B to drive sense amplifier 20. Precharge circuit 22 responds to an equalize signal BLEQ to precharge sense amplifier drive lines 21A and 21B to a predetermined potential $V_{BL}$. Sense amplifier drive line 21A is also connected to a ground node via an N channel MOS transistor Qs1 which becomes conductive in response to control signal SOF. Sense amplifier drive line 21A is also connected to a ground node via an N channel MOS transistor Qs2 which becomes conductive in response to control signal SON. Sense amplifier drive line 21B is connected to a power supply node via a P channel MOS transistor Qs3 which becomes conductive in response to a control signal SOP.

Dummy word lines DWL1 and DWL2 are disposed parallel to word lines WL1 and WL2. A dummy cell 28 is disposed at the respective crossings between dummy word lines DWL1, DWL2 and bit lines BL0, /BL0. When word lines WL1 and WL2 rise, dummy cell 28 cancels the noise generated in bit lines BL0 and /BL0.

Sense amplifier 20 includes N channel MOS transistors Qn1 and Qn2 connected in series between a bit line pair, and P channel MOS transistors Qp1 and Qp2 connected in series between a bit line pair. Transistors Qn1 and Qp1 have their gate electrodes connected to bit lines /BL0 and /BL1, and transistors Qn2 and Qp2 have their gate electrodes connected to bit lines BL0 and BL1. Transistors Qn1 and Qn2 have their source electrodes connected to sense amplifier driven line 21a, and transistors Qp1 and Qp2 have their source electrodes connected to sense amplifier drive line 21b.

Each memory cell 27 includes an N channel MOS transistor Qm that serves as a transfer gate, and a capacitor Cm for storing data. Transistor Qm has its gate electrode connected to a corresponding word line WL1 or WL2, and one of the source/drain electrodes connected to a corresponding bit line BL0 or /BL0. Capacitor Cm has one electrode connected to the other source/drain electrode of transistor Qm. Cell plate potential Vcp is supplied to the other electrode of capacitor Cm.

Similar to memory cell 27, each dummy cell 28 includes an N channel MOS transistor Qd and a capacitor Cd. Transistor Qd has its gate electrode connected to a corresponding dummy word line DWL1 or DWL2, and one source/drain electrode connected to a corresponding bit line BL0 or /BL0. Capacitor Cd has one electrode connected to the other source/drain electrode. Cell plate potential Vcp is supplied to the other electrode of capacitor Cd.

Bit line select circuit 26A includes two N channel MOS transistors Qb which become conductive in response to bit line select signal BLI0. Bit line select circuit 26B includes two N channel MOS transistors Qb that become conductive in response to bit line select signal BLI1.

Bit line precharge circuit 23 includes an N channel MOS transistor Qe connected between a bit line pair, and two N channel MOS transistors Qpc connected in series between a bit line pair. Transistors Qe and Qpc have their gate electrodes connected to an equalize line 24. Transistors Qpc have their source electrodes connected to precharge line 25.

Column select circuit 29 includes an N channel MOS transistor Qio connected-between bit lines BL0, BL1 and input/output line IO, and which becomes conductive in response to column select signal CSL, and an N channel MOS transistor Qio connected between bit lines /BL0, /BL1 and input/output line /IO, and which becomes conductive in response to column select signal CSL.

A drive dedicated precharge circuit 22 includes an N channel MOS transistor Qse connected between drive lines 21A and 21B, and two N channel MOS transistors Qsp connected in series between drive lines 21A and 21B. Transistors Qse and Qsp have their gate electrodes connected to equalize line 24. Transistors Qsp have their source electrodes connected to precharge line 25.

Figure 3:
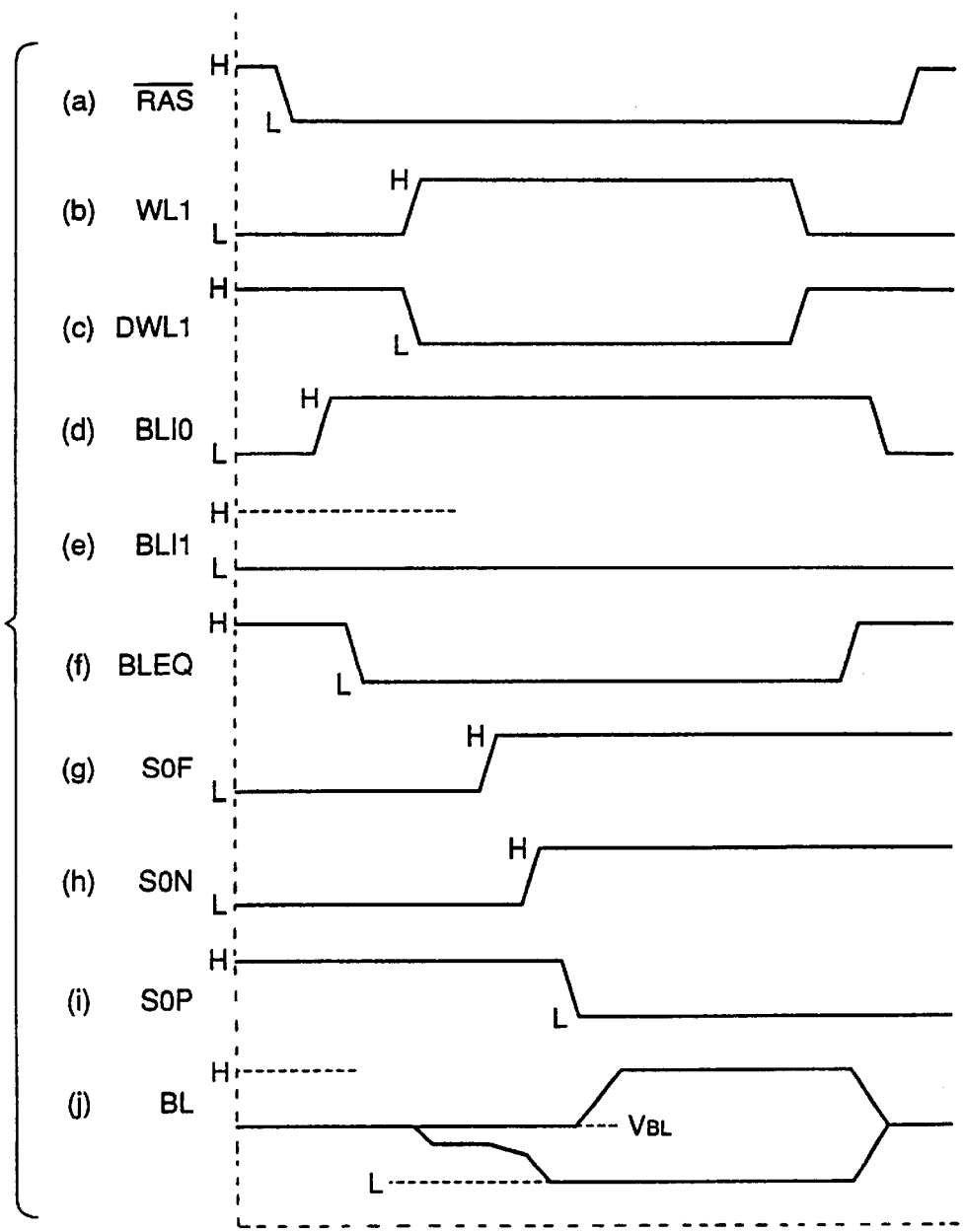
FIG. 3 is a timing chart showing an operation of the DRAM of FIG. 1.

The operation of the circuitry shown in FIG. 1 will be described with reference to the timing chart of FIG. 3.

Referring to FIG. 3(a), address signals A0–A11 are strobed in response to a fall of external row address strobe signal /RAS. When bit line pair BL0, /BL0 is selected according to that address signal, bit line select signal BLI0 rises as shown in FIG. 3(d). Bit line select signal BLI1 is maintained at a L level (logical low). Therefore, bit line pair BL0, /BL0 is connected to sense amplifier 20.

Since bit line equalize signal BLEQ attains a H level (logical high) as shown in FIG. 3(f), transistors Qpc of bit line precharge circuit 23 are both conductive. Therefore, precharge potential Vb1 is applied to bit line pair BL0, /BL0. Because transistor Qe of bit line precharge circuit 23 is also conductive, the potentials of bit lines BL0 and /BL0 are equal to each other. The potential of bit line pair BL0, /BL0 takes an intermediate level between a H level and a L level as shown in FIG. 3(j) because a potential $V_{CC}/2$ which is half the power supply potential is supplied as precharge potential Vb1.

This equalize signal BLEQ of a H level is also applied to the gate electrodes of transistors Qse and Qsp of drive dedicated precharge circuit 22, so that sense amplifier drive lines 21A and 21B are precharged to potential $V_{cc}/2$ which is half the power supply potential, similar to bit line pair BL0, /BL0.

Then, when word line WL1 rises as shown in FIG. 3(b), transistor Qd of a corresponding memory cell 27 is rendered conductive, whereby the charge in capacitor Cm is read out on bit line BL0. When data of a L level is stored in memory cell 27, the potential of bit line BL0 becomes slightly lower than precharge potential vb1 as shown in FIG. 3(j). As a result, a potential difference is generated between bit lines BL0 and /BL0.

Then, when control signal SOF rises as shown in FIG. 3(g), transistor Qs1 is rendered conductive, whereby the charge of sense amplifier drive line 21A flows to the ground node via transistor Qs1. This causes potential SAN of sense amplifier drive line 21A to decrease towards ground potential $V_{SS}$.

Then, when control signal SON rises as shown in FIG. 3(h), transistor Qs2 is rendered conductive, whereby the charge of sense amplifier drive line 21A flows to the ground node via transistor Qs2. As a result, potential SAN of sense amplifier drive line 21A further decreases towards ground potential $V_{SS}$.

When control signal SOP falls as shown in FIG. 3(i), transistor Qs3 is rendered conductive, whereby charge is supplied from the power supply node to sense amplifier drive line 21B via transistor Qs3. As a result, potential SAB of sense amplifier drive line 21B gradually increases towards power supply potential $V_{CC}$.

Because sense amplifier drive signal SAN gradually decreases towards ground potential $V_{SS}$ and sense amplifier drive signal SAP gradually increases towards power supply potential $V_{CC}$ as described above, sense amplifier 20 reduces the potential of bit line BL0 to a L level, and the potential of bit line /BL0 to a H level, as shown in FIG. 3(j). Therefore, sense amplifier 20 latches complementary data corresponding to the data of memory cell 27.

Then, when column select signal CSL rises, transistors Qio of column select circuit 29 both attain a conductive state. This causes the potential of bit line BL0 to be provided to input/output line IO via transistor Qio and the potential of bit line /BL0 to input/output line /IO via transistor Qio. The potentials at input/output lines IO and /IO are amplified by output buffer 18 to be output as output data.

Although the case where a bit line pair is precharged to $V_{CC}/2$ is described here, the bit line pair may be precharged to $V_{CC}$. In this case, the capacitance of capacitor Cd in dummy cell 28 must be different from that of capacitor Cm in memory cell 27. For example, the capacitance of capacitor Cd may be half that of capacitor Cm.

Figure 4:
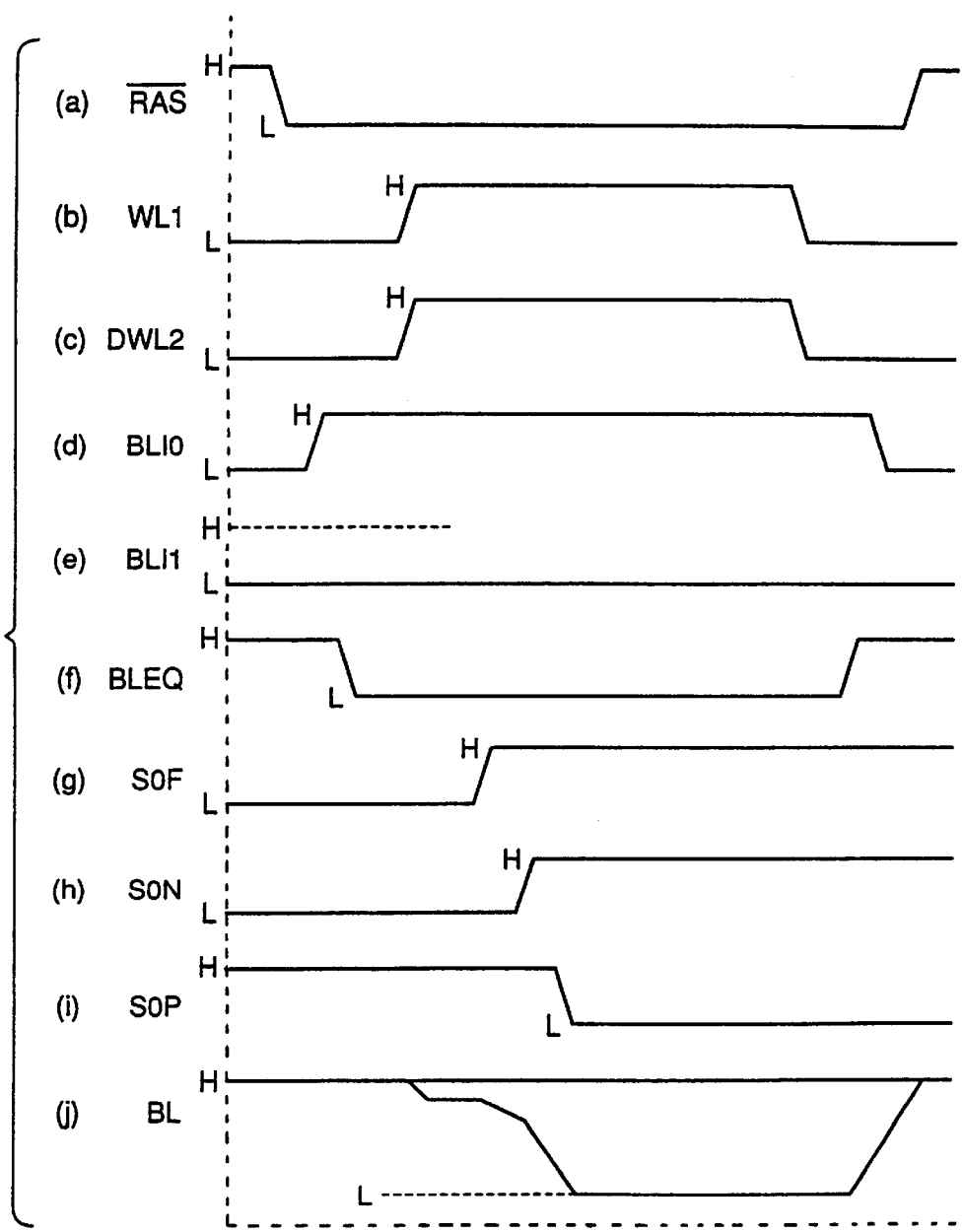
FIG. 4 is a timing chart showing another operation of the DRAM of FIG. 1.

FIG. 4 is a timing chart of a bit line pair precharged to $V_{CC}$. When bit line equalize signal BLEQ attains a H level as shown in FIG. 4(f), the bit line pair is precharged to a H level, i.e. to power supply potential $V_{CC}$, as shown in FIG. 4(j). By pulling up DWL2 simultaneously to the rise of word line WL1, a potential difference is generated between the bit line pair.

When the power supply level is established in a hierarchical manner, an internal power supply potential is generated by down-converting external power supply potential, and an internal ground potential is generated by boosting the external ground potential. In this case, sense amplifier drive signal SAN gradually decreases from precharge potential towards internal ground potential which is higher than external ground potential, and sense amplifier drive signal SAP gradually increases towards internal power supply potential which is lower than the external power supply potential. Therefore, sense amplifier 20 raises the potential of one sense amplifier to the level of internal power supply potential, and the potential of the other bit line to the level of internal power supply potential.

In sense amplifier 20 of embodiment 1, a constant ground potential $V_{SS}$ is applied to the body regions of N channel MOS transistors Qn1 and Qn2, whereby the body regions are electrically fixed. Also, a constant power supply potential $V_{CC}$ is applied to the body regions of P channel MOS transistors Qp1 and Qp2, whereby the body regions are electrically fixed.

Therefore, a kink will not be generated in these transistors Qn1, Qn2, Qp1, and Qp2, so that a stable Id-Vd characteristic is obtained. Thus, sense amplifier 20 carries out a stable analog operation.

Because the body regions of transistors Qn1, Qn2, Qp1 and Qp2 are fixed, the leakage current between the source and drain is reduced. Therefore, the charge of bit lines BL0, /BL0, BL1 and /BL1 will not leak via transistors Qn1, Qn2, Qp1 and Qp2. Thus, the potential difference generated between a bit line pair when data is read out from memory cell 27 can be maintained at a sufficient high level.

In memory cell 27 of embodiment 1, a constant ground potential $V_{SS}$ is applied to the body region of an N channel MOS transistor, so that the body region is electrically fixed. Therefore, the subthreshold characteristic is improved, and the leakage current approximates the physical limit value. Thus, charge that leaks from capacitor Cm via transistor Qm is determined by the leakage at the PN junction. In a transistor formed on a thin film SOI, there is at least no PN junction plane that is parallel with an SOI substrate. The leakage current at a PN junction is proportional to the surface area of the PN junction, so that data retaining time period is increased. In dummy memory cell 28, a constant ground potential $V_{SS}$ is applied to the body region of N channel MOS transistor Qd, so that the body region is electrically fixed, similar to memory cell 27.

In bit line precharge circuit 23 of embodiment 1, constant ground potential $V_{SS}$ is applied to the body regions of N channel MOS transistors Qe and Qpc, so that the body regions are electrically fixed. Therefore, the charge in the bit line will not leak via these transistors Qe and Qpc. This prevents the read out potential difference generated between bit lines from being reduced, so that the potential difference is reliably amplified by a sense amplifier.

In drive dedicated precharge circuit 22, a constant ground potential $V_{SS}$ is applied to the body regions of transistors Qse and Qsp, so that the body regions are electrically fixed, similar to bit line precharge circuit 23. Also, constant ground potential $V_{SS}$ is applied to the body regions of N channel MOS transistors Qs1 and Qs2, so that the body regions are electrically fixed. Power supply potential $V_{CC}$ is applied to the body region of P channel MOS transistor Qs3, so that the body region is electrically fixed.

In bit line select circuits 26A and 26B in embodiment 1, a constant ground potential $V_{SS}$ is applied to the body region of N channel MOS transistor Qp, so that the body region is electrically fixed. The charge in the bit lines do not leak via transistor Qb, so that the read out potential difference is maintained sufficiently.

In column select circuit 29 of embodiment 1, a constant ground potential $V_{SS}$ is applied to the body region of N channel MOS transistor Qio, so that the body region is electrically fixed. Therefore, the charge in the bit lines will not leak via transistor Qio, so that the read out potential difference is maintained sufficiently. Thus, correct data is read out to input/output lines IO and /IO via column select circuit 29.

Figure 5:
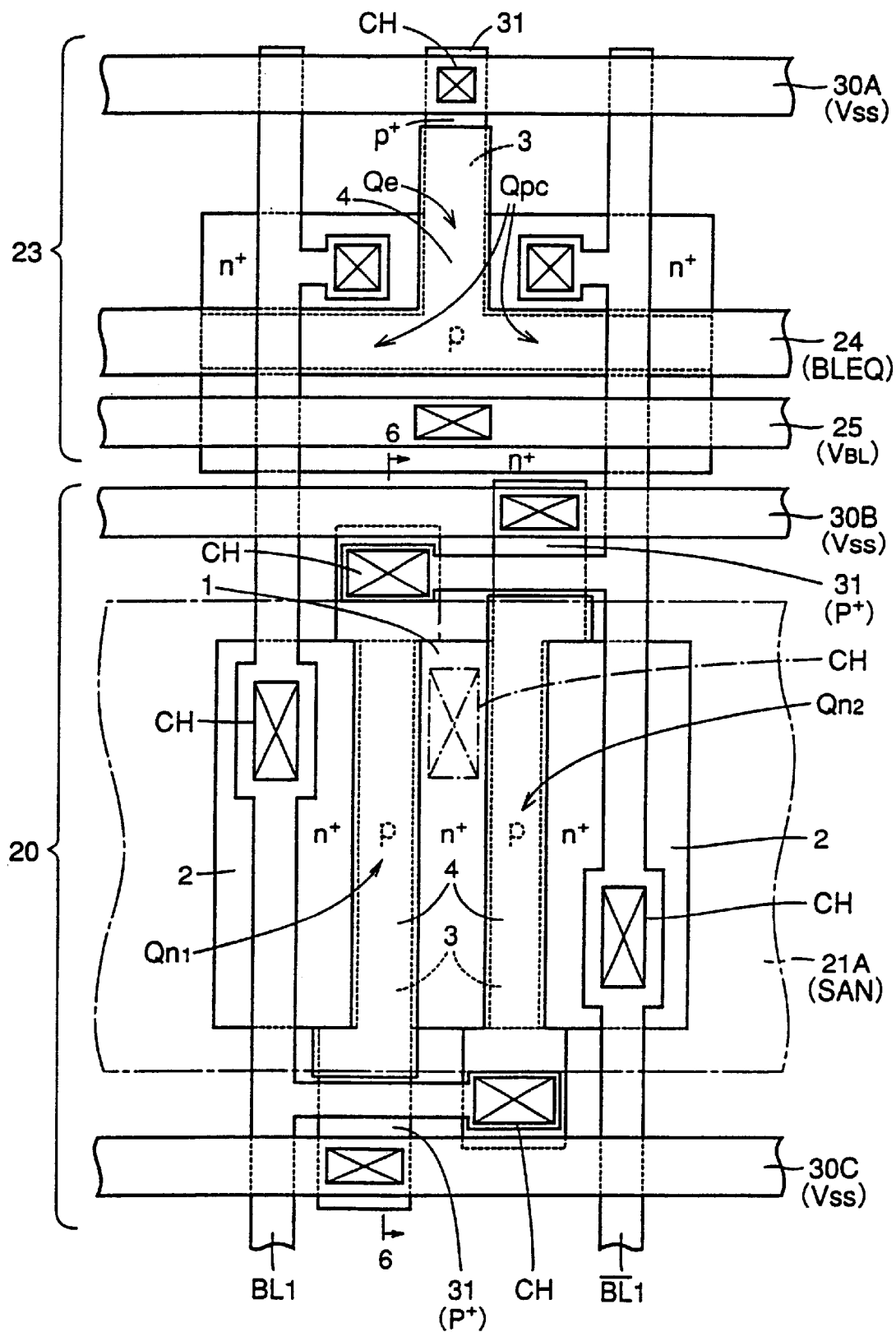
FIG. 5 is a plain view showing a structure of the sense amplifier and the precharge circuit of FIG. 1.
Figure 6:
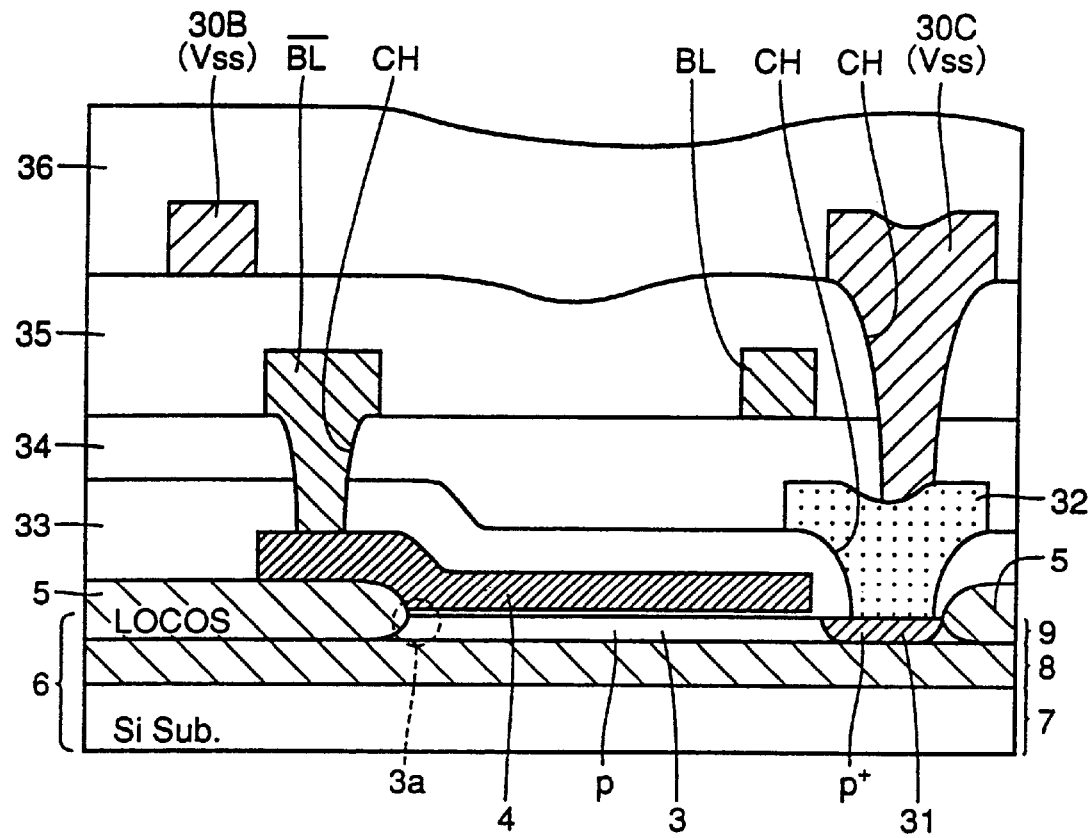
FIG. 6 is a sectional view of the sense amplifier of FIG. 1 taken along line 6—6.

FIG. 5 is a plan view of sense amplifier 20 partially and precharge circuit 23 entirely shown in FIG. 1. FIG. 6 is a sectional view of sense amplifier 20 of FIG. 5 taken along line 6—6. In FIG. 5, only an N channel sense amplifier formed of N channel MOS transistors Qn1 and Qn2 is shown.

Referring to FIGS. 5 and 6, an $n^+$ type source region 1 of transistor Qn1 is common to the source region of transistor Qn2. Source region 1 is connected to sense amplifier drive line 21A to which a sense amplifier drive signal SAN is provided via contact hole CH.

An $n^+$ type drain region 2 of transistor Qn1 is connected to bit line BL1 via a contact hole CH. $n^+$ type drain region 2 of transistor Qn2 is connected to bit line /BL1 via contact hole CH. Transistor Qn1 has its gate electrode 4 connected to bit line /BH1 via contact hole CH. Transistor Qn2 has gate electrode 4 connected to bit line BL1 via contact hole CH.

A $p^+$ type contact region 31 is formed on a p type body region 3 of transistor Qn1. Contact region 31 is connected to a body fix line 30C via an intermediate layer 32 such as of a polypad. Ground potential $V_{SS}$ is supplied to body fix line 30C. A constant ground potential $V_{SS}$ is supplied to body region 3. Contact region 31 is also formed in body region 3 of transistor Qn2. Body region 3 of transistor Qn2 is connected to body fix line 30B via contact region 31 and intermediate layer 32. Ground potential $V_{SS}$ is also supplied to body fix line 30B. Therefore, ground potential $V_{SS}$ is also provided to body region 3 of transistor Qn2.

Referring to FIG. 6, a first interlayer insulation film 33 is formed on gate electrode 4. Contact hole CH is formed at a predetermined position in interlayer insulation film 33.

Intermediate layer 32 is formed on contact hole CH. A second interlayer insulation film 34 is formed on first interlayer insulation film 33 and intermediate layer 32. Contact hole CH is formed at a predetermined position of second interlayer insulation film 34. Bit lines BL and /BL are formed on second interlayer insulation film 34.

A third interlayer insulation film 35 is formed on second interlayer insulation film 34 and bit lines BL and /BL. Contact hole CH is formed at a predetermined position of third interlayer insulation film 35. Contact hole CH is provided above intermediate layer 32. Body fix lines 30B and 30C are formed on third interlayer insulation film 35. Body fix line 30C is formed above contact hole CH to form contact with intermediate layer 32. A fourth interlayer insulation film 36 is formed on third interlayer insulation film 35 and body fix lines 30B and 30C.

Transistor Qn1 of sense amplifier 20 is formed on an SOI substrate 6. Because a buried oxide layer 8 is provided at a shallow region in this SOI substrate, the thickness of an SOI active layer 9 is small. As a result, the bottom of LOCOS oxide film 5 reaches buried oxide layer 8. Source region 1 and drain region 2 of transistor Qn1 also reach buried oxide layer 8. As a result, body fix line 30C is connected to body region 3 of transistor Qn1 which is completely isolated from its periphery by LOCOS oxide film 5 and buried oxide film 8. Therefore ground potential $V_{SS}$ is provided thereto.

In precharge circuit 23, equalize line 24 forms the gate electrodes of all transistor Qe and Qpc. Therefore, p type body region 3 of these transistors Qe and Qpc are common to each other. A p$^+$ type contact region 31 is formed in body region 3. Contact region 31 is connected to body fix line 30A via contact hole CH. Ground potential $V_{SS}$ is supplied to body fix line 30A. Therefore, ground potential $V_{SS}$ is applied to body regions 4 of transistors Qe and Qpc.

Drive precharge circuit 22 has a structure similar to that of bit line precharge circuit 23.

Figure 7:
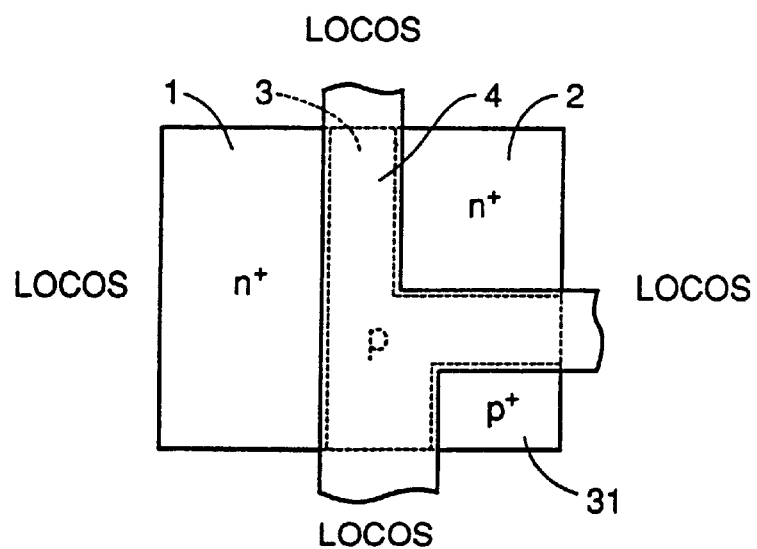
FIG. 7 is a plan view showing a general structure of a transistor in the bit line select circuit, the column select circuit or the memory cell shown in FIG. 1.

FIG. 7 is a plan view showing a general structure of transistors Qm, Qd, Qb and Qio of memory cell 27, dummy cell 28, bit line select circuits 26A and 26B, and column select circuit 29. Referring to FIG. 7, p$^+$ type contact region 31 is formed in p type body region 3 of these transistors. Ground potential $V_{SS}$ is supplied to contact region 31. As a result, body region 3 is fixed electrically.

Because a DRAM according to embodiment 1 is formed on an SOI substrate so that a silicon substrate 7 is electrically isolated by SOI active layer 9 and buried oxide layer 8, the charge generated in silicon substrate 7 due to α particles impinging thereto will not flow into source region 1, drain region 2, and body region 3. Furthermore, there is almost no generation of charges due to α particles in source region 1, drain region 2, and body region 3 since the regions 1, 2 and 3 are extremely small. Thus, there is almost no generation of the so-called soft error.

Because the bottom of the source/drain region of transistor Qm forming memory cell 27 also reaches buried oxide layer 8, there is no PN junction plane parallel to SOI substrate 6. Only a PN junction plane perpendicular to SOI substrate 6 exists. The leakage current in a PN junction is proportional to the surface area of the PN junction. Therefore, the charge leaking from capacitor Cm via the source/drain regions is reduced according to the surface area, and the retaining time period of data is increased accordingly. Furthermore, because the junction capacitance of the source/drain region is also reduced, the read out potential difference generated between the bit lines is increased, and power consumption becomes lower.

The charge of the bit line will not leak via a transistor connected to the bit line since its body region is fixed. Therefore, the read out potential difference generated between the bit lines is maintained sufficiently. Furthermore, there are almost no kinks in this transistors since the body region of the transistor of sense amplifier 20 is also fixed. Thus, sense amplifier 20 amplifies the read out potential difference stably.

Embodiment 2

FIG. 8 is a plan view showing a structure of sense amplifier 20 partially and precharge circuit 23 entirely in a DRAM according to embodiment 2 of the present invention. Referring to FIG. 8, embodiment 2 has both body regions 3 protruding in the same direction with a contact region 31 formed at that protruding portion. Both contact regions 31 are connected to one body fix line 30C via respective contact holes CH. Also, both gate electrodes 4 protrude in the same direction. The protruding portions thereof are connected to bit lines BL1 and /BL1 via respective contact holes CH.

Embodiment 2 has a layout area smaller than that of embodiment 1 since body fix line 30C for fixing body regions 3 of transistors Qn1 and Qn2 are common.

Embodiment 3

FIG. 9 is a plan view showing a structure of sense amplifier 20 partially and precharge circuit 23 entirely of a DRAM according to embodiment 3 of the present invention. Referring to FIG. 9, precharge circuit 23 differs from the precharge circuit of embodiment 1 in that it is disposed in a 180° rotated position. Body regions 3 of transistors Qe and Qpc in precharge circuit 23 are connected to body fix line 30B via contact region 31 and contact hole CH. Body region 3 of transistor Qn2 of sense amplifier 20 is also connected to body fix line 30B via contact region 31 and contact hole CH.

Embodiment 3 has a layout area smaller than that of embodiment 1 since body fix line 30B for fixing body region 3 of transistor Qn2 of sense amplifier 20 is common to the body fix line for fixing body region 3 of transistors Qe and Qpc in precharge circuit 23.

Embodiment 4

FIG. 10 is a circuit diagram showing a memory cell array, a sense amplifier, and an input/output circuit partially of a DRAM according to embodiment 4. Referring to FIG. 10, embodiment 4 has a negative potential $V_{BB}$ supplied to the body region of transistor Qm of memory cell 27, different from the potential of embodiment 1. Negative potential $V_{BB}$ is also applied to the body region of transistor Qd in dummy cell 28. Therefore, the N channel MOS transistors in embodiment 4 have two types of threshold voltages.

Because only the threshold voltages of transistors Qm and Qd in memory cell 27 and dummy cell 28 are great, sub threshold current does not easily flow in transistors Qm and Qd in embodiment 4. Therefore, the dynamic data retention of the bit line amplitude according to a sense operation is further improved in a deselect memory cell. Therefore, the data retaining time period of a memory cell is increased.

Embodiment 5

FIG. 11 is a circuit diagram showing a memory cell array, a sense amplifier, and an input/output circuit partially of a DRAM according to embodiment 5 of the present invention. Referring to FIG. 11, embodiment 5 has negative potential $V_{bb}$ applied to the body regions of all N channel MOS transistors Qm, Qd, Qb, Qpc, Qe, Qn1, Qn2, and Qio. A negative potential Vbb may be applied to the body region of all N channel MOS transistors as in embodiment 5.

Embodiment 6

FIG. 12 is a circuit diagram showing a memory cell array, a sense amplifier, and an input/output circuit partially of a DRAM according to embodiment 6 of the present invention.

Referring to FIG. 12, embodiment 6 has the body regions of four transistors Qn1, Qn2, Qp1, and Qp2 of sense amplifier 20 connected to its own source electrode. More specifically, the body regions of transistors Qn1 and Qn2 are connected to sense amplifier drive line 21A. The body regions of transistors Qp1 and Qp2 are connected to sense amplifier drive line 21B. Therefore, a variable potential is applied to the body regions of transistors Qn1 and Qn2 that gradually decreases towards ground potential $V_{SS}$ from precharge potential $V_{BL}$. Also, a variable potential is provided to the body regions of transistors Qp1 and Qp2 that increases towards power supply potential $V_{CC}$ from precharge potential $V_{BL}$. Therefore, the so-called body effect is not generated in transistors Qn1, Qn2, Qp1 and Qp2 since the same voltage is always applied to the PN junction between the body region and the source region. Therefore, the sensitivity of sense amplifier 20 is improved in comparison with that of embodiment 1. Sense amplifier 20 can operate speedily even in the case where a low power supply voltage is supplied.

When a DRAM is formed on a silicon substrate 1, the sense amplifier must be completely isolated from the substrate and other wells in order to provide synchronization between the substrate potential of the transistor in the sense amplifier and the source potential as shown in FIG. 12. Therefore, a triple well structure is generally employed. Furthermore, in order to reduce leakage current by subthreshold in a writing operation, the well must be fixed at a constant potential. This causes increase in power consumption since the charge in the junction capacitance of that well is charged/discharged. Furthermore, a region for fixing the well potential is required when a triple well structure is employed. This results in increase in the layout area.

In contrast, embodiment 6 has the bottom of the body region brought into contact with the buried oxide layer, so that the junction capacitance is extremely small. Also, leakage current due to subthreshold will not increase since the body region is fixed. Furthermore, the layout area is small since it is not necessary to form a well or the like.

FIG. 13 is a plan view showing sense amplifier 20 partially and precharge circuit 23 of FIG. 12. Referring to FIG. 13, a p$^+$ type common region 38 is formed at a portion of source region 1. Body region 3 of transistor Qn1 is connected to source region 1 via common region 38. Body region 3 of transistor Qn2 is connected to source region 1 via common region 38. Because sense amplifier drive signal SAN is provided to this source region 1 via contact hole CH, these body regions 3 are electrically fixed during the application of forward voltage in the PN junction between common region 38 and source region 1. More specifically, the potential of body region 3 is always higher than the potential of source region 1 by the barrier potential of the PN junction. Because body fix lines 30B and 30C do not have to be provided in the embodiment 6, the layout area is smaller than that of embodiment 1.

Embodiment 7

FIG. 14 is a plan view showing a sense amplifier and a precharge circuit of a DRAM according to embodiment 7 of the present invention. Referring to FIG. 14, embodiment 7 has a p$^+$ type common region 38 of a size substantially equal to that of source region 1 formed between body regions 3. Source region 1 is connected to sense amplifier drive line 21A via contact hole CH. Common region 38 is also connected to sense amplifier drive line 21A via contact hole CH. Body region 3 of transistor Qn1 is connected to sense amplifier drive line 21A via common region 38 and contact hole CH. Body region 3 of transistor Qn2 is connected to sense amplifier drive line 21A via common region 38 and contact hole CH. Therefore, body regions 3 are always electrically fixed since the potentials of common region 38 and source region 8 are always the same.

Embodiment 8

FIG. 15 is a plan view showing a sense amplifier and a precharge circuit of a DRAM according to embodiment 8. Referring to FIG. 15, a p$^+$ type common region 38 is connected to either side of source region 1. Also, two contact hole CH are formed over source region 1 and common region 38. Therefore, body region 3 of transistor Qn1 is connected to sense amplifier drive line 21A via two common regions 38 and two contact holes CH, and body region 3 of transistor Qn2 is connected to sense amplifier drive line 21A via two common regions 38 and two contact holes CH. In embodiment 8, the effective channel length of transistors Qn1 and Qn2 is increased since a small common region 38 is formed at either side of source region 1. Body regions 3 of transistors Qn1 and Qn2 are reliably fixed even when the effective channel length thereof is long by virtue of the provision of two common regions 38. The potential of body region 3 promptly follows potential SAN of sense amplifier drive line 21A even when located remote from common region 38. As a result, this sense amplifier operates more stably than that of embodiment 7 of FIG. 14.

Embodiment 9

Figure 16:
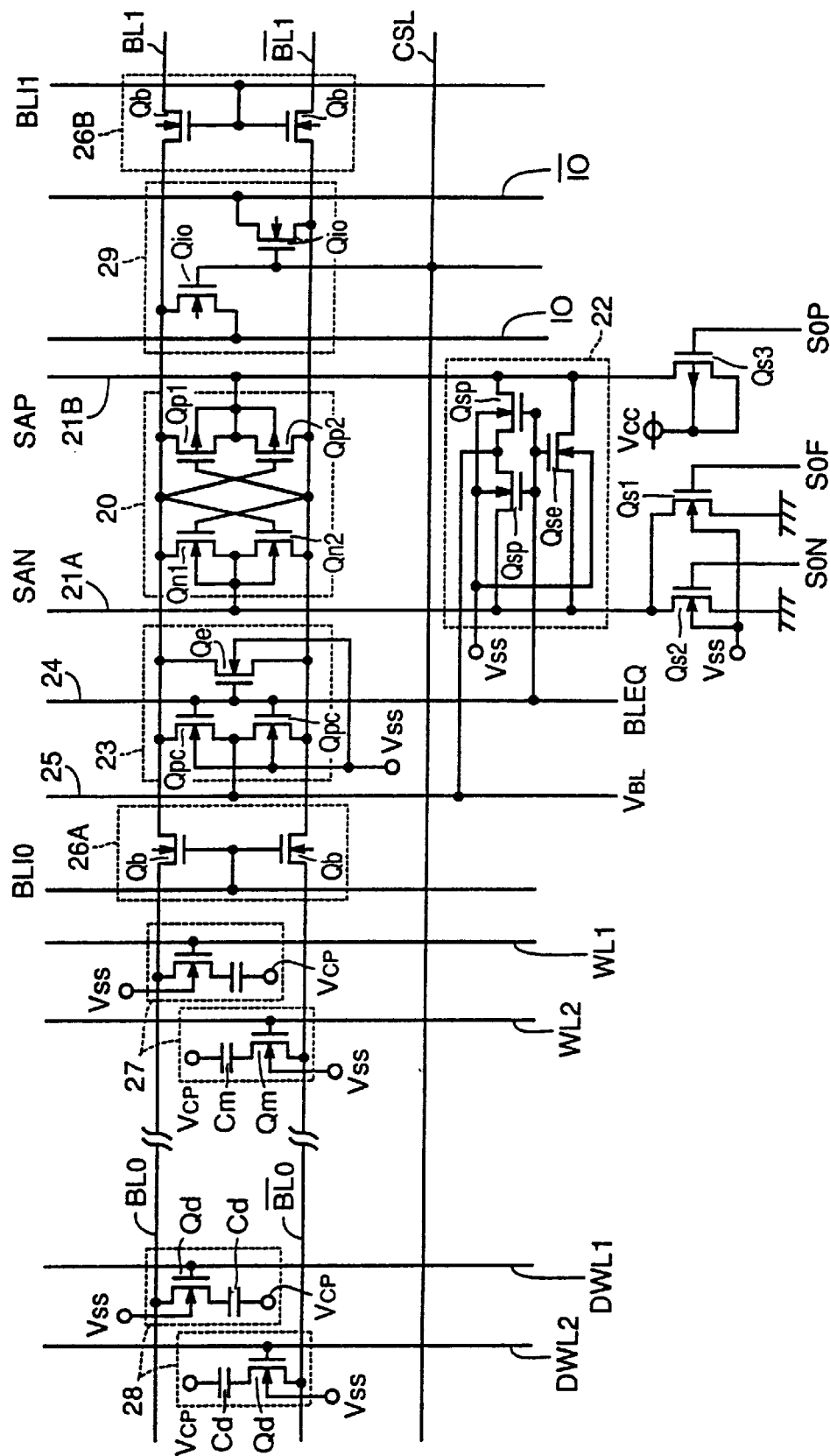

FIG. 16 is a circuit diagram showing a memory cell array, a sense amplifier, and an input/output circuit partially of a DRAM according to embodiment 9. Referring to FIG. 16, embodiment 9 the body regions of transistors Qb and Qio in bit line select circuits 26A and 26B and column select circuit 29 are set to a floating state electrically. A great amount of leakage current will not flow in these transistors Qb and Qio even when rendered to a floating state.

Embodiment 9 has the number of the body fix lines reduced in comparison with that of embodiment 6 of FIG. 12 since the body regions of several N channel MOS transistors are electrically fixed, and the body regions of the remaining n channel MOS transistors are rendered floating. Therefore, the region for a body fix line is reduced, resulting in a smaller layout area.

Embodiment 10

Figure 17:
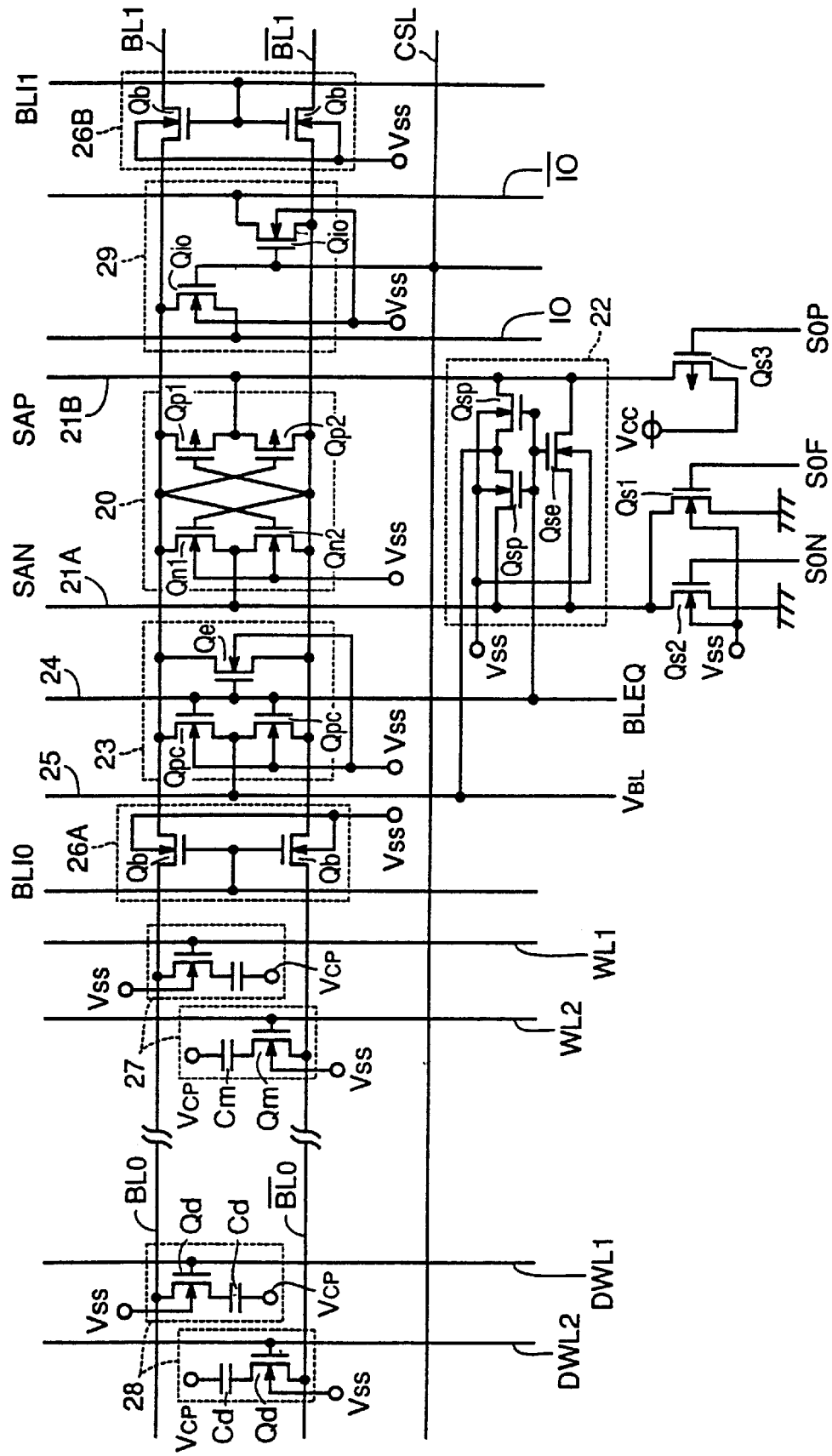

FIG. 17 is a circuit diagram showing a memory cell array, a sense amplifier, and an input/output circuit of a DRAM according to embodiment 10 of the present invention. Referring to FIG. 17, embodiment 10 has the body regions of all P channel MOS transistors set to a floating state electrically. More specifically, the body regions of transistors Qp1 and Qp2 in sense amplifier 20 are rendered floating. The body regions of all N channel MOS transistors are fixed electrically.

Because the breakdown voltage between the source and drain of a P channel MOS transistor is generally higher than that of an N channel MOS transistor, the body region of an N channel MOS transistor should be fixed. Embodiment 10 has a layout area smaller than that of embodiment 1 since a body fix region and a body fix line for fixing the body region of a P channel MOS transistor are not required.

Embodiment 11

Figure 18:
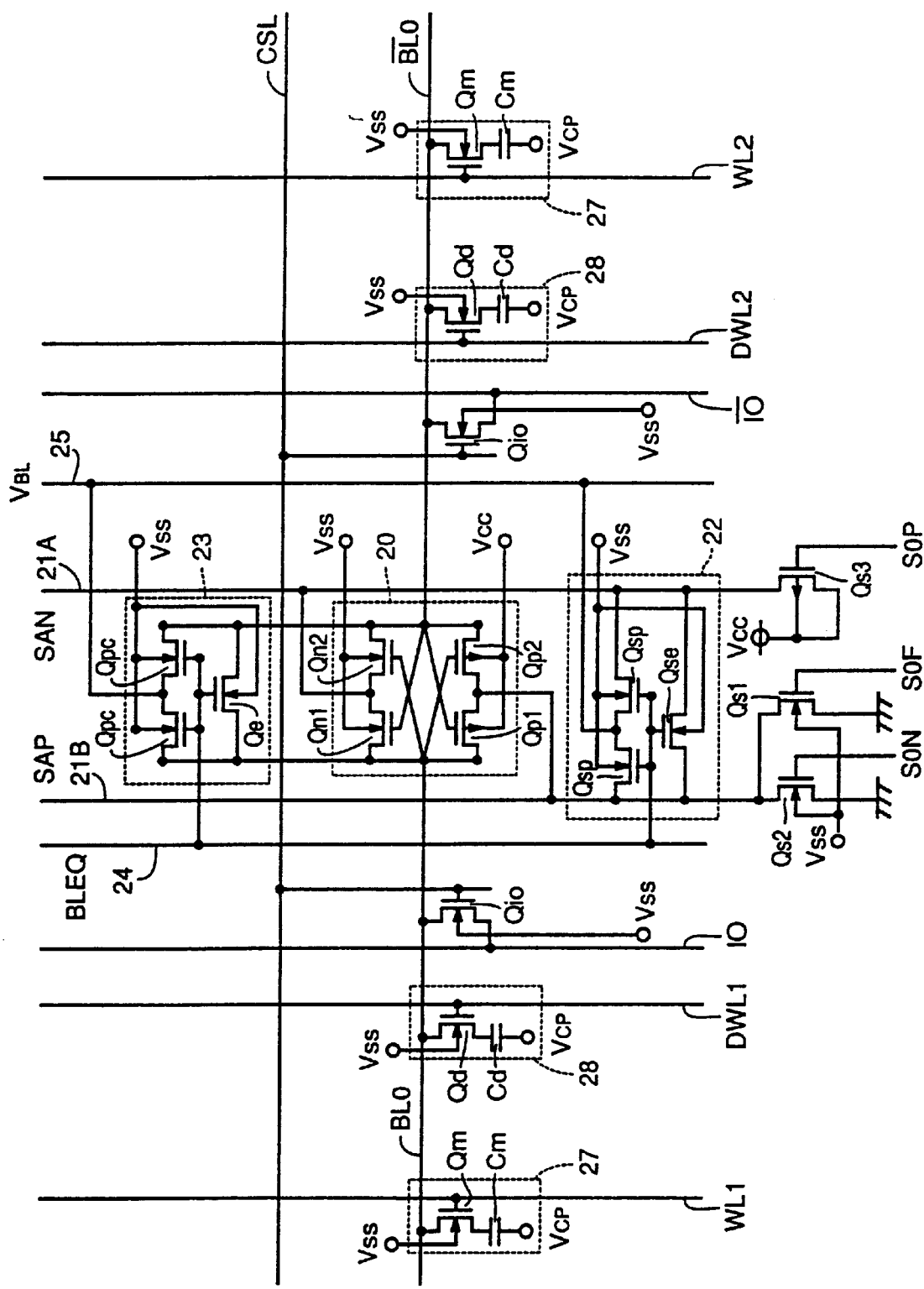

FIG. 18 is a circuit diagram showing a structure of memory cell array, a sense amplifier, and an input/output circuit of a DRAM according to embodiment 11 of the present invention. Referring to FIG. 18, embodiment 11 has bit lines BL0 and /BL0 disposed at either side of sense amplifier 20. In other words, the so-called open bit line structure is employed.

Similar to the above-described embodiment 1, in embodiment 11, ground potential $V_{SS}$ is applied to the body regions of N channel MOS transistors Qn1 and Qn2 in sense amplifier 20, and power supply potential $V_{CC}$ is applied to the body regions of P channel MOS transistors Qp1 and Qp2. Ground potential $V_{SS}$ is applied to the body regions of N channel MOS transistors Qe and Qpc in bit line precharge circuit 23. Also, ground potential $V_{SS}$ is applied to the body regions of N channel MOS transistors Qse and Qsp in sense amplifier drive line precharge circuit 22. Ground potential $V_{SS}$ is applied to the body region of N channel MOS transistor Qio in column select circuit. Ground potential $V_{SS}$ is also applied to the body region of N channel MOS transistor Qm of memory cell 27. Ground potential $V_{SS}$ is also applied to the body region of N channel MOS transistor Qd in dummy cell 28.

In addition to the advantages of embodiment 1, embodiment 11 can have a memory cell 27 disposed at all the crossings of a word line and a bit line since the open bit line structure is employed.

Embodiment 12

Figure 19:
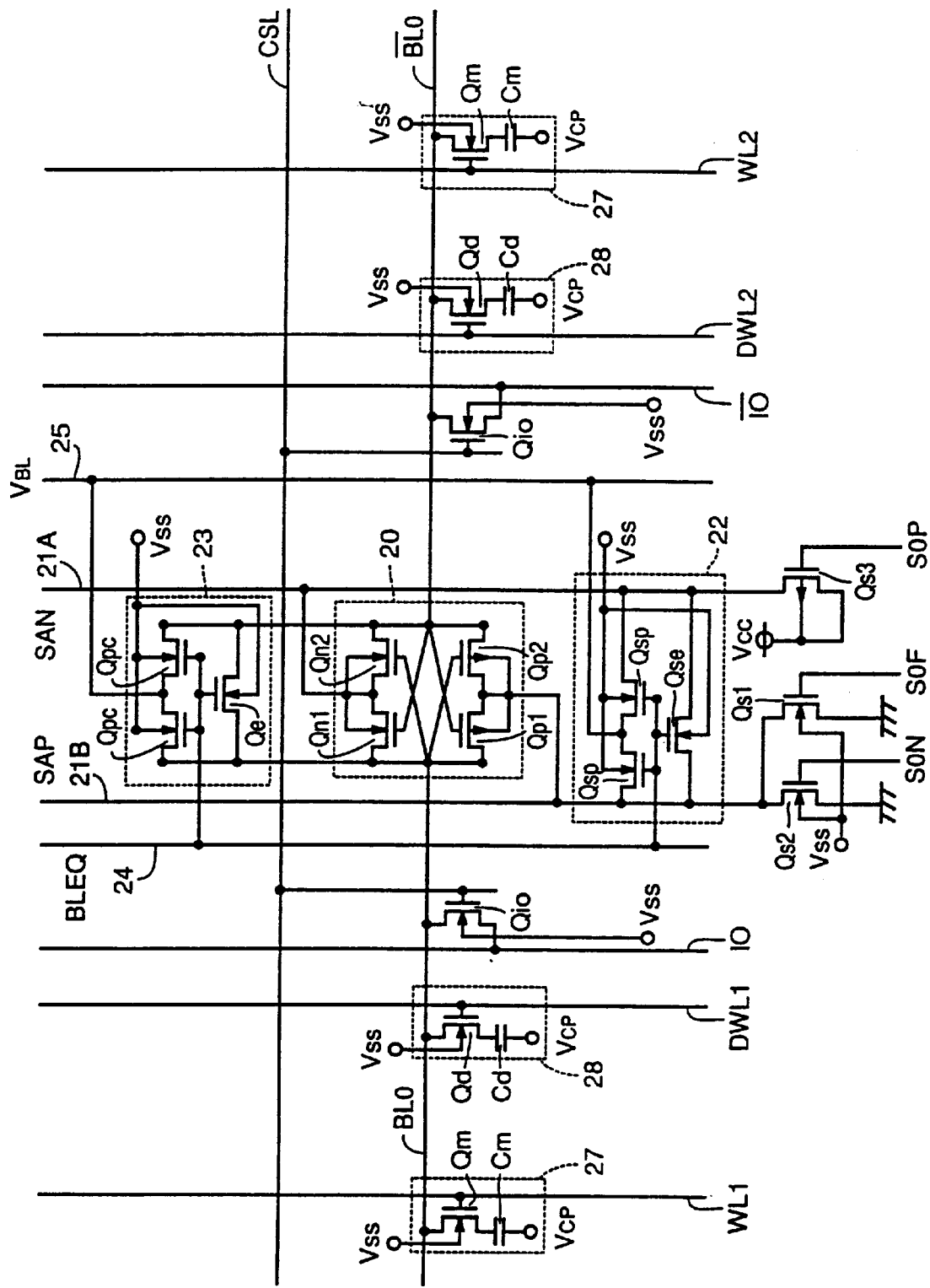

FIG. 19 is a circuit diagram showing a structure of a memory cell array, a sense amplifier, and an input/output circuit of a DRAM according to embodiment 12 of the present invention. Referring to FIG. 19, the body regions of four transistors Qn1, Qn2, Qp1, and Qp2 of sense amplifier 20 are connected to its own source electrode. Therefore, sense amplifier drive signal SAN is applied to the body regions of N channel MOS transistors Qn1 and Qn2. Sense amplifier drive signal SAP is applied to the body regions of P channel MOS transistors Qp1 and Qp2.

In addition to the advantages of embodiment 6 of FIG. 12, embodiment 12 can have memory cell 27 provided at all the crossings between a word line and a bit line since an open bit line structure is employed.

Embodiment 13

FIG. 20 is a circuit diagram showing a row decoder partially of a DRAM according to embodiment 13 of the present invention. Referring to FIG. 20, a word line drive circuit in a row decoder includes eight N channel MOS transistors Qr1–Qr8 at the final stage. Transistors Qr1–Qr2 are connected in series, and the source electrode of transistor Qr1 is connected to word line WL0. Transistors Qr3 and Qr4 are connected in series, and the source electrode of transistor Qr3 is connected to word line WL1. Transistors Qr5 and Qr6 are connected in series, and the source electrode of transistor Qr5 is connected to word line WL2. Transistors Qr7 and Qr8 are connected in series, and, the source electrode of transistor Qr7 is connected to word line WL3.

This word line drive circuit is activated in response to signals Xj, Xk and Xl which are predecoded row address signals. When the word line drive circuit is activated and one of boost signals RX0–RX3 is applied to the drain electrode of a corresponding transistor, a corresponding one of word lines WL0–WL3 rises. Because boost signals RX0–RX3 are atpotentials higher than power supply potential $V_{CC}$, word lines WL0–WL3 rise to a potential higher than power supply potential $V_{CC}$. Therefore, a voltage greater than the power supply voltage is applied between the source and drain of transistors Qr1–Qr8.

When boost signals RX0–RX3 are applied when this word line drive circuit is not activated, the potential of the body regions of transistors Qr1, Qr3, Qr5 and Qr7 rise due to coupling of the parasitic capacitance, resulting in reduction of the threshold value. This causes leakage of the boosted potential via transistors Qr1, Qr3, Qr5 and Qr7, so that the boosted potential becomes insufficient. When the leaking boosted potential is applied to a de-select word line, data will leak from the de-select memory cell.

In embodiment 13, ground potential $V_{SS}$ is applied to the body regions of transistors Qr1–Qr12, whereby the body regions thereof are electrically fixed. This causes increase in the breakdown voltage between the source and drain of transistors Qr1–Qr12, so that this word line drive circuit operates properly. This word line drive circuit operates stably since reduction in the threshold value due to coupling of the parasitic capacitance is suppressed.

Embodiment 14

FIG. 21 is a circuit diagram showing a row decoder partially of a DRAM according to embodiment 14 of the present invention. Referring to FIG. 21, embodiment 14 has the body regions of transistors Qr1–Qr12 connected to its own source region. More specifically, the body regions of transistors Qr1, Qr3, Qr5, and Qr7 are connected to word lines WL0–WL3. The body regions of transistors Qr2, Qr4, Qr6 and Qr8 are connected to the ground node. The body regions of transistors Qr9–Qr12 are connected to the node located at the side where the potential does not rise by self bootstrap.

FIG. 22 is a plan view showing a general structure of transistors Qr1–Qr12 of the word line drive circuit shown in FIG. 21. Referring to FIG. 22, transistors Qr1–Qr12 include an $n^+$ type source region 1, an $n^+$ type drain region 2, a p type body region 3, a gate electrode 4, and a $p^+$ type common region 38. Common region 38 is formed adjacent to source region 1 and body region 3. Therefore, body region 3 is connected to source region 1 via common region 38 to be electrically fixed.

Because embodiment 14 has the body regions of transistors Qr1, Qr3, Qr5 and Qr7 connected to word lines WL0–WL3, the potentials of the body regions 3 follow the potentials of word lines WL0–WL3. This suppresses generation of a body effect in transistors Qr1, Qr3, Qr5 and Qr7, so that the potentials of word lines QL0–WL3 promptly rise.

It is not necessary to provide a body fix line since the body regions 3 of transistors Qr1–Qr12 are connected to its own source region. Accordingly, the layout area of embodiment 14 is smaller than that of embodiment 13 of FIG. 20.

Embodiment 15

FIG. 23 is a circuit diagram showing a structure of a boost signal predecode circuit according to a embodiment 15 of the present invention. This boost signal predecode circuit serves to provide boost signals RX0–RX3 to the word line drive circuit shown in FIGS. 20 and 21.

Referring to FIG. 23, this boost signal predecode circuit includes transistors Qr13–Qr15, and inverters I1 and I2. Transistors Qr13 and Qr14 are connected in series. Boost signal RX which is an output of the boost voltage generation circuit is provided to the drain electrode of transistor Qr13. Row address signal X is applied to one source/drain electrode of transistor Qr15 via inverters I1 and I2. The output of inverter I1 is provided to the gate electrode of transistor Qr14.

This boost signal predecode circuit is activated in response to a row address signal X. When a boost signal RX is applied during its activation, the gate potential of transistor Qr13 rises by self bootstrap, so that transistor Qr13 attains a complete conductive state. Therefore, the applied boost signal RX is output as boost signals RX0–RX3 via transistor Qr13.

As apparent from the above-described operation, a voltage greater than the power supply voltage is applied between the source and drain of transistors Qr13–Qr15. In embodiment 15, ground potential $V_{SS}$ is applied to the body regions of transistors Qr13–Qr15, so that the body region is electrically fixed. This causes increase in the breakdown voltage between the source and drain of transistors Qr13–Qr15, so that this boost signal predecode circuit operates properly.
Embodiment 16

FIG. 24 is a circuit diagram showing a structure of a boost signal predecode circuit of a DRAM according to embodiment 16 of the present invention. Referring to FIG. 24, the body regions of transistors Qr13–Qr15 are connected to its own source region.

In embodiment 16, the body region of transistor Qr13, in particular, is connected to its own source region. Therefore, the potential of the body region of transistor Qr13 rises following the output boost signals RX0–RX3. This suppresses generation of the body effect in transistor Qr13, so that boost signals RX0–RX3 rise promptly. It is not necessary to provide a body fix line since each body region is connected to its own source region. Therefore, the layout area of embodiment 16 is smaller than that of embodiment 15 of FIG. 23.
Embodiment 17

FIG. 25 is a plan view showing a structure of an N channel MOS capacitor of a DRAM according to embodiment 17 of the present invention. This MOS capacitor is used in a word line drive circuit, a boost signal predecode circuit, a circuit for generating a voltage $V_{PP}$ which is a boosted power supply voltage, and the like.

Referring to FIG. 25, this MOS capacitor includes an $n^+$ type source region 1, a p type body region 3 enclosed by source region 1, a gate electrode 4, and a $p^+$ type common region 38. Common region 38 is inserted in a part of source region 1. In other words, common region 38 is formed adjacent to source region 1 and body region 3. Therefore, body region 3 is connected to source region 1 via common region 38. This causes body region 3 to be fixed electrically, so that this MOS capacitor operates stably. Furthermore, it is not necessary to provide a body fix line since body region 3 is connected to source region 1 via common region 38 which is partially inserted into source region 1. Therefore, the layout area of embodiment 17 is similar to that of the conventional case.

The present invention is not limited to the above-described embodiment 17 where common region 38 is inserted into a portion of source region 1. Source region 1 and common region 38 may be connected to the body fix line via a contact hole by forming one contact hole above the joining portion of source region 1 and common region 38. This provides the advantage that body region 3 can be electrically fixed even when the potential of source region 1 becomes higher than the potential of common region 38.
Embodiment 18

FIG. 26 is a plan view showing a structure of a P channel MOS capacitor in a DRAM according to embodiment 18 of the present invention. Referring to FIG. 26, this P channel MOS capacitor includes a $p^+$ type source region 1, an n type body region 3 enclosed by source region 1, a gate electrode 4, and an $n^+$ type common region 38. Embodiment 18 has the conductivity type of each region opposite to those in embodiment 17 of FIG. 25.
Embodiment 19

FIG. 27 is a plan view showing a structure of an N channel MOS capacitor of a DRAM according to embodiment 19 of the present invention. Referring to FIG. 27, this N channel MOS capacitor includes two $n^+$ type source region 1, a p type body region 3 located between these source regions 1, a gate electrode 4, and a $p^+$ type contact region 31. The two source regions 1 are connected to each other. Contact region 31 is inserted into a portion of body regions, and is formed adjacent to only that body region 3.

A potential identical to that applied to source region 1 is provided to contact region 31, whereby body region 3 is connected to source region 1 via contact region 31. Therefore, this N channel MOS capacitor operates stably since that body region 3 is electrically fixed.

Because a potential identical to that applied to source region 1 is provided to contact region 31 in embodiment 19, ground potential $V_{SS}$ or negative potential $V_{BB}$ may be applied to contact region 31.
Embodiment 20

FIG. 28 is a plan view showing a structure of a P channel MOS capacitor of a DRAM according to embodiment 20 of the present invention. Referring to FIG. 28, this P channel MOS capacitor includes two $p^+$ type source regions 1, an n type body region 3 located therebetween, a gate electrode 4, and an $n^+$ type contact region 31. A predetermined potential is provided to contact region 31, whereby body region 3 is electrically fixed. Embodiment 20 has the conductivity type of each region opposite to that of embodiment 19 of FIG. 27.
Embodiment 21

FIG. 29 is a circuit diagram showing a structure of a boost power supply generation circuit of a DRAM according to embodiment 20 of the present invention. Referring to FIG. 29, this boost power supply generation circuit includes three MOS capacitors Cbs1–Cbs3, and an N channel MOS transistor Qbs at the final stage. This boost power supply generation circuit generates a boost potential $V_{PP}$ higher than power supply potential $V_{CC}$ in response to a clock signal CK.

In transistor Qbs of this boost power supply generation circuit, the potential of the drain electrode (output node) is always higher than the potential of the source electrode. Therefore, the body region of transistor Qbs is connected to its own source region. As a result, the breakdown voltage between the source and drain of transistor Qbs is increased. There is also the advantage that a body fix line does not have to be provided since the body region is connected to the source region. Therefore, the layout area according to embodiment 21 is substantially equal to that of a conventional one.
Embodiment 22

FIG. 30 is a circuit diagram showing a structure of an output preamplifier and a write circuit of a DRAM according to embodiment 22 of the present invention. Referring to FIG. 30, a current mirror type output preamplifier 40 includes P channel MOS transistors Qp5–Qp11, and N channel MOS transistors Qn5–Qn12. An output preamplifier is generally susceptible to a kink since the potentials of input/output lines IO and /IO are amplified in an analog manner. Therefore, the body regions of P channel MOS transistors Qp5–Qp11 are connected to its own source region. The body regions of N channel MOS transistor Qn5–Qn12 are connected to its own source region.

Because embodiment 22 has the body regions of transistors Qp5–Qp11 and Qn5–Qn12 electrically fixed, a kink will not be generated in these transistors. Accordingly, output preamplifier 40 can amplify stably the potential of input/output lines IO and /IO.

Write circuit 41 includes four N channel MOS transistors Qn13–Qn16. Ground potential $V_{SS}$ is applied to the body region of transistors Qn13–Qn16, so that these body regions are electrically fixed. Therefore, a great leakage current will not flow between the source and drain of transistors Qn13–Qn16.
Embodiment 23

FIG. 31 is a circuit diagram showing a structure of an input/output line precharge circuit and an input/output line equalize circuit of a DRAM according to embodiment 23. Referring to FIG. 31, an input/output line precharge circuit 42 includes P channel MOS transistors Qp21 and Qp22, and N channel MOS transistors Qn21 and Qn22. P channel MOS transistor Qp21 and N channel MOS transistor Qn21 form a transfer gate. Also, P channel MOS transistor Qp22 and N channel MOS transistor Qn22 also form a transfer gate. Input/output line precharge circuit 42 responds to a precharge signal YN to precharge input/output lines IO and /IO to a predetermined potential.

The input/output line equalize circuit includes a P channel MOS transistor Qp20 and an N channel MOS transistor Qn20. Transistors Qp20 and Qn20 form a transfer gate. This input/output line equalize circuit responds to input/output line equalize signals IOEQ and /IOEQ to equal the potential of input/output lines IO and /IO to each other.

In embodiment 23, power supply potential $V_{CC}$ is applied to the body regions of P channel MOS transistors Qp20–Qp22. Ground potential $V_{SS}$ is applied to the body regions of N channel MOS transistors Qn20–Qn22. As a result, the body regions of transistors Qp20–Qp22 and Qn20–Qn22 are electrically fixed. Therefore, a great amount of leakage current will not flow between the source and drain of these transistors. Thus, correct data is transmitted via input/output lines IO and /IO.

Embodiment 24

FIG. 32 is a circuit diagram showing a row address buffer in a DRAM according to embodiment 24 of the present invention. Referring to FIG. 32, this dynamic latch type row address buffer includes P channel MOS transistors Qp25–Qp28, and N channel MOS transistors Qn25–Qn30. This address buffer responds to an external address signal ext. An to generate internal row address signals RAn and /RAn. This address buffer compares external address signal ext.An to a reference signal VREF to make determination whether external address signal ext.An attains a H level or a L level.

In embodiment 24, the body regions of transistors Qp25–Qp28 are connected to the source electrode. Ground potential $V_{SS}$ is applied to the body regions of transistors Qn25, Qn26, Qn29 and Qn30. This dynamic latch type row address buffer responds to a fall of control signal /RADBE to latch an address signal. In an active state, a reverse voltage will not be applied to the PN junction between the body region and the source region. Therefore, it is possible to connect the body regions of transistors Qn27 and Qn28 to its own source region.

Because the body regions of transistors Qp25–Qp28 and Qn25–Qn30 are electrically fixed, this row address buffer carries out an analog operation stably. Because transistors Qp27 and Qp28 are impervious to the body effect, this row address buffer can make determination whether external address signal ext.An attains a H level or a L level stably and speedily.

Embodiment 25

Figure 33:
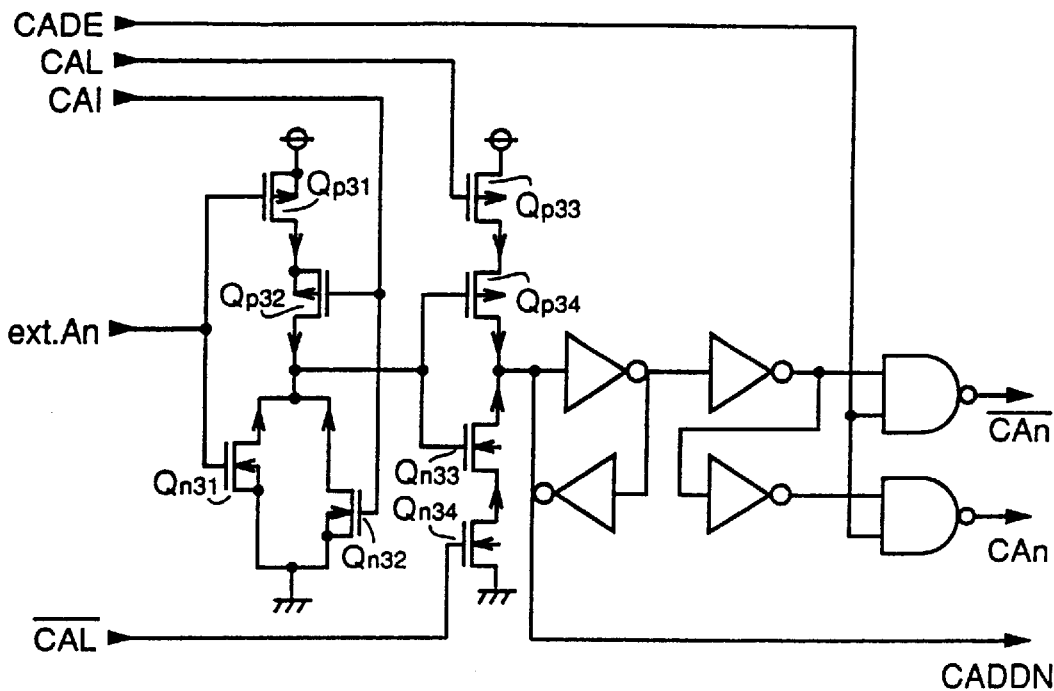

FIG. 33 is a circuit diagram showing a structure of a column address buffer of a DRAM according to embodiment 25 of the present invention. Referring to FIG. 33, this column address buffer includes P channel MOS transistors Qp31–Qp34, and N channel MOS transistors Qn31–Qn34. Transistors Qp31, Qp32, Qn31 and Qn32 form an NOR circuit. Transistors Qp33, Qp34, Qn33 and Qn34 form a clocked inverter of a subsequent stage. This column address buffer responds to an external address signal ext.An to generate internal column address signals CAn and /CAn.

The body regions of all transistors Qp31, Qp32, Qn31, Qn32 forming this NOR circuit are connected to its own source region. Therefore, ground potential $V_{SS}$ is applied to the body region of N channel MOS transistors Qn31 and Qn32. The body regions of all transistors Qp33, Qp34, Qn33 and Qn34 forming the inverter are set to a floating state.

In embodiment 25, the body regions of transistors Qp31, Qp32, Qn31, and Qn32 of the input stage are electrically fixed, so that correct determination can be made whether external address signal ext.An attains a H level or a L level. Furthermore, because the body regions of transistors Qp33, Qp34, Qn33 and Qn34 forming the clocked inverter of the subsequent stage, and the body regions of transistors forming other logical gates are set to a floating stage, it is not necessary to provide a body fix line. Therefore, increase in the layout area is suppressed to a minimum.

Embodiment 26

Figure 34:
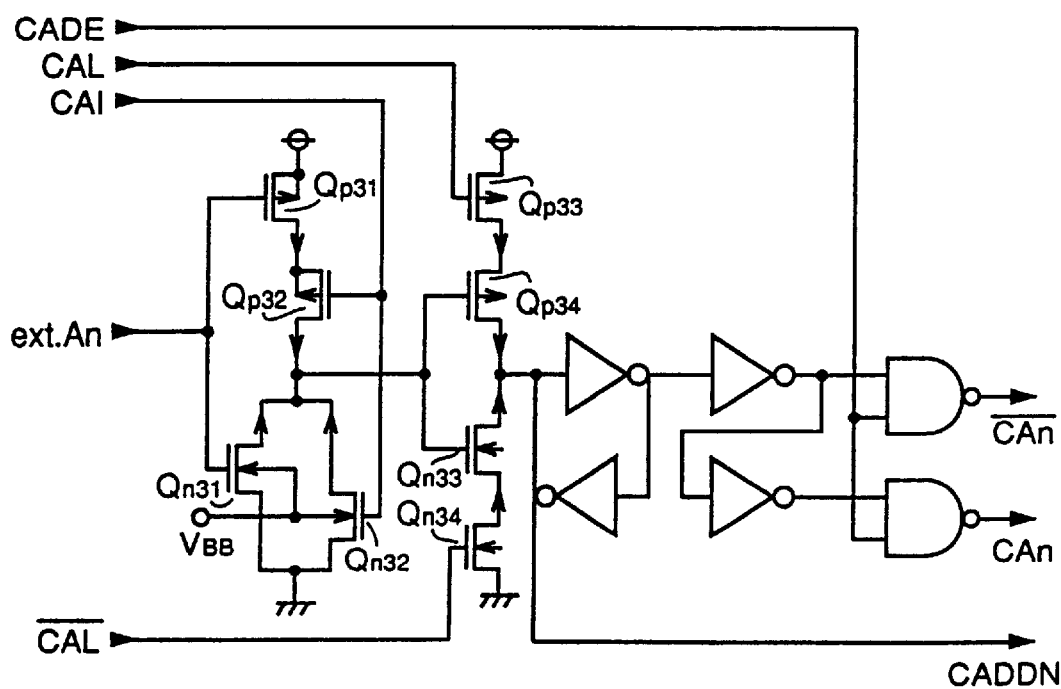

FIG. 34 is a circuit diagram showing a structure of a column address buffer of a DRAM according to embodiment 26 of the present invention. Referring to FIG. 34, embodiment 26 has a negative potential $V_{BB}$ applied to the body regions of N channel MOS transistors Qn31 and Qn32 forming an NOR circuit. As described above, a negative potential $V_{BB}$ instead of ground potential $V_{SS}$ may be applied to the body regions of N channel MOS transistors Qn31 and Qn32.

Embodiment 27

Figure 35:
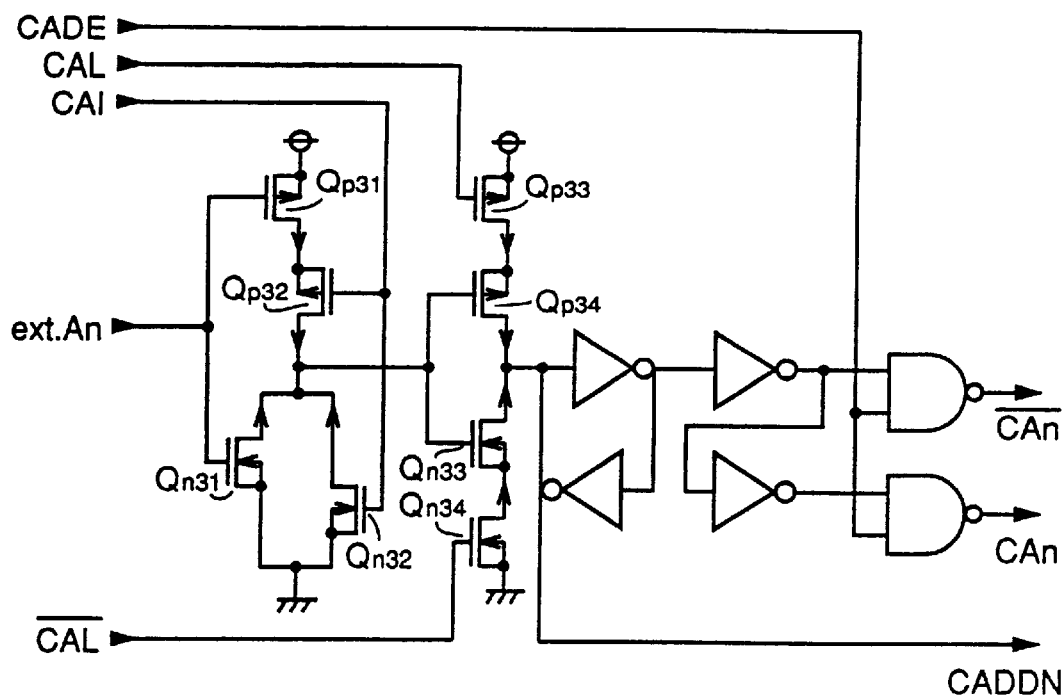
Figure 36:
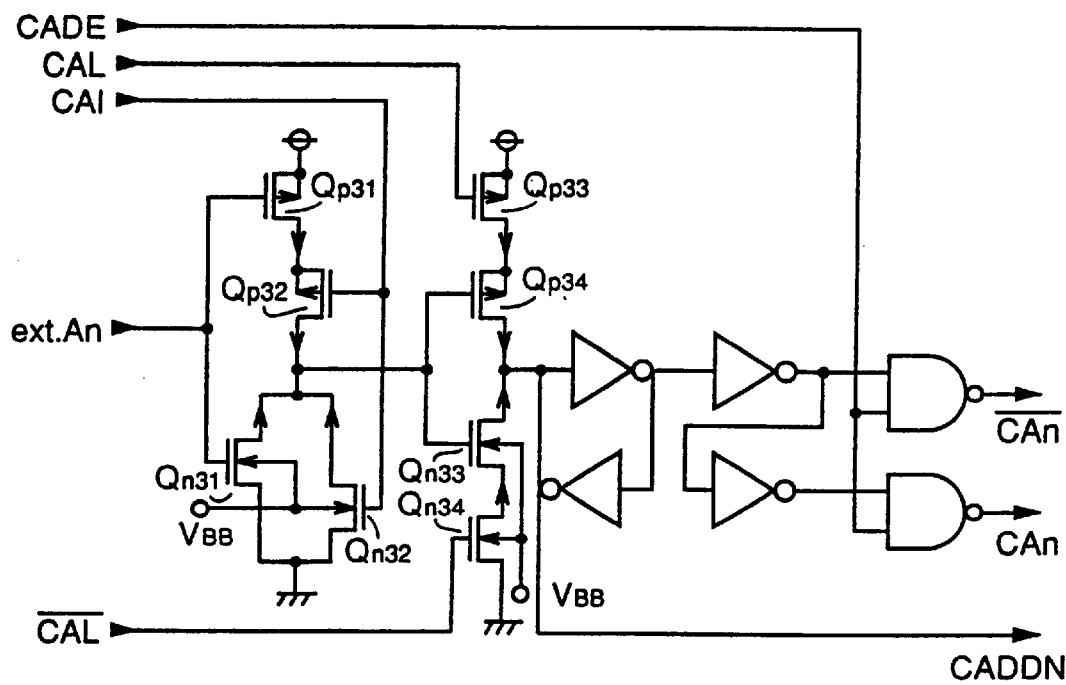

FIG. 35 is a circuit diagram showing a column address buffer of a DRAM according to embodiment 27 of the present invention. Embodiment 27 has the body regions of transistors Qp33, Qp34, Qn33 and Qn34 forming the inverter connected to its own source region. According to embodiment 27, the body regions of the transistors forming the input stage and the clocked inverter of the subsequent stage are electrically fixed. Therefore, although there is a slight increase in the layout area, this column address buffer operates stably in comparison with the case where the body regions thereof are not fixed.

Embodiment 28

FIG. 26 is a circuit diagram showing a structure of a column address buffer of a DRAM according to embodiment 28 of the present invention. Differing from the column address buffer shown in FIG. 27, embodiment 28 has negative potential $V_{BB}$ applied to the body regions of N channel MOS transistors Qn31 and Qn32. Thus, a negative potential $V_{BB}$ may be applied instead of ground potential $V_{SS}$ to the body regions of N channel MOS transistors Qn31 and Qn32.

Embodiment 29

Figure 37:
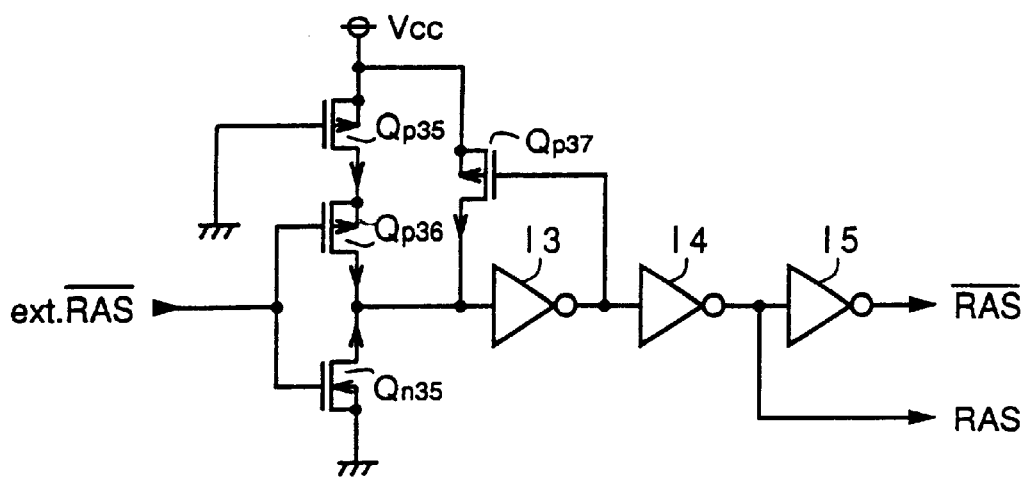

FIG. 37 is a circuit diagram showing a structure of a clock input buffer of a DRAM according to embodiment 29 of the present invention. Referring to FIG. 37, this clock input buffer includes P channel MOS transistors Qp35–Qp37, an N channel MOS transistor Qn35, and inverters I3–I5. This clock input buffer responds to external row address strobe signal ext./RAS of a MOS level or a TTL level to generate internal row address strobe signals RAS and /RAS.

In embodiment 29, the body regions of transistors Qp35–Qp37 of the input stage and transistor Qn35 are connected to its own source region. Therefore, ground potential $V_{SS}$ is applied to the body region of N channel MOS transistors Qn35.

Because the body regions of transistors Qp35–Qp37 and Qn35 are electrically fixed, accurate determination can be made whether external row address strobe signal ext./RAS attains a H level or a L level. Furthermore, it is not necessary to provide a body fix line since the body regions of transistors Qp35–Qp37 and Qn35 are connected to its own source region. Accordingly, the layout area of this clock input buffer is similar to that of a conventional case.

Embodiment 30

Figure 38:
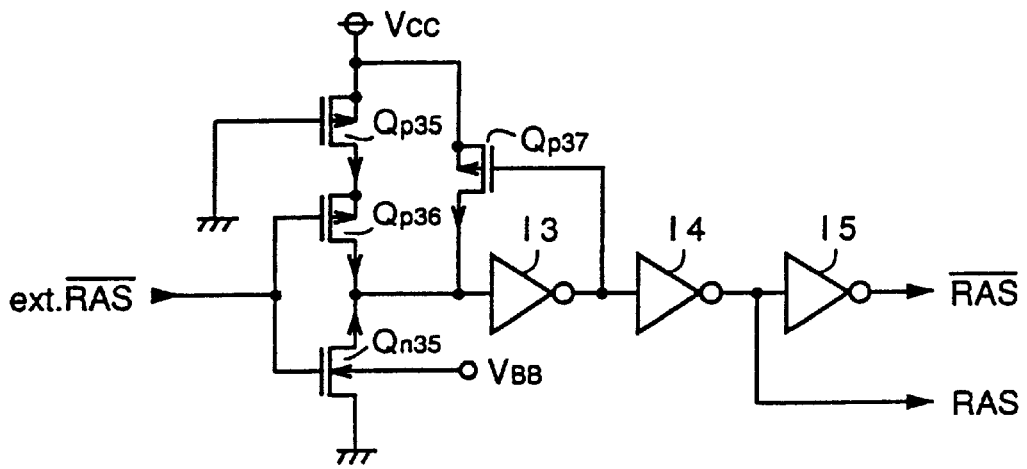

FIG. 38 is a circuit diagram showing a structure of a clock input buffer of a DRAM according to embodiment 30 of the present invention. In embodiment 30, negative potential $V_{BB}$ is applied to the body region of N channel MOS transistor Qn35 of the first input stage. Therefore, negative potential $V_{BB}$ may be applied, instead of ground potential $V_{SS}$, to the body region of N channel MOS transistor Qn35.

Embodiment 31

Figure 39:
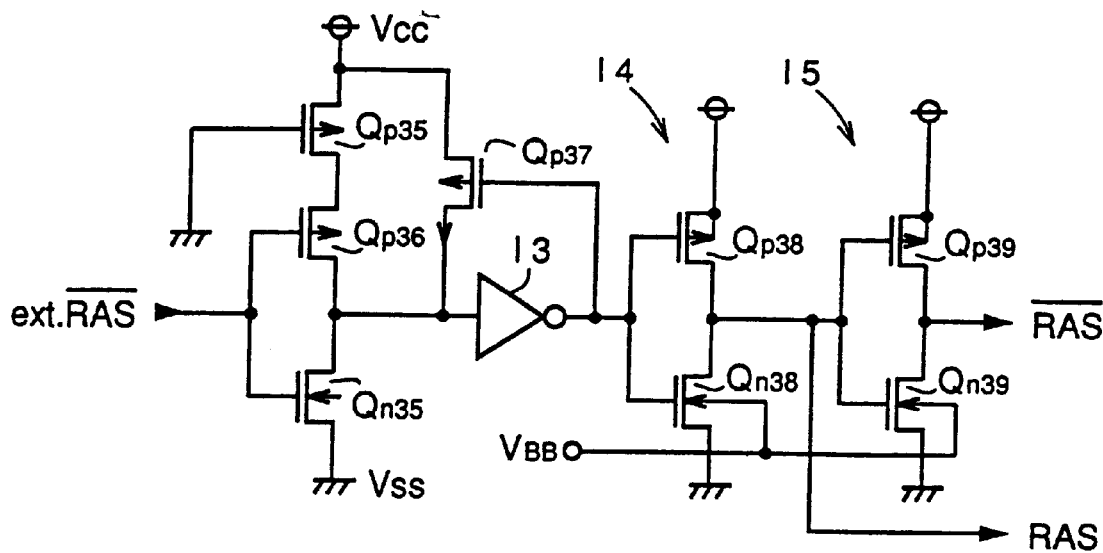

FIG. 39 is a circuit diagram showing a structure of a clock input buffer of a DRAM according to embodiment 31 of the present invention. Similar to embodiment 29 of FIG. 37, this clock input buffer of FIG. 39 includes P channel MOS transistors Qp35–Qp37, an N channel MOS transistor Qn35, and inverters I3–I5. Inverter I4 includes a P channel MOS transistor Qp38, and an N channel MOS transistor Qn38. Inverter I5 includes a P channel MOS transistor Qp39, and an N channel MOS transistor Qn39.

In embodiment 31, the body regions of P channel MOS transistors Qp38 and Qp39 forming inverters I4 and I5 are connected to its own source region. Also, a negative potential $V_{BB}$ is applied to the body regions of N channel MOS transistors Qn38 and Qn39 forming inverters I4 and I5.

Because embodiment 31 has the body regions of transistors Qp38, Qp39, Qn38 and Qn39 of the last stage electrically fixed, the 'clock skew of internal row address strobe signals RAS and /RAS generated by this clock input buffer is reduced.

Embodiment 39

Figure 40:
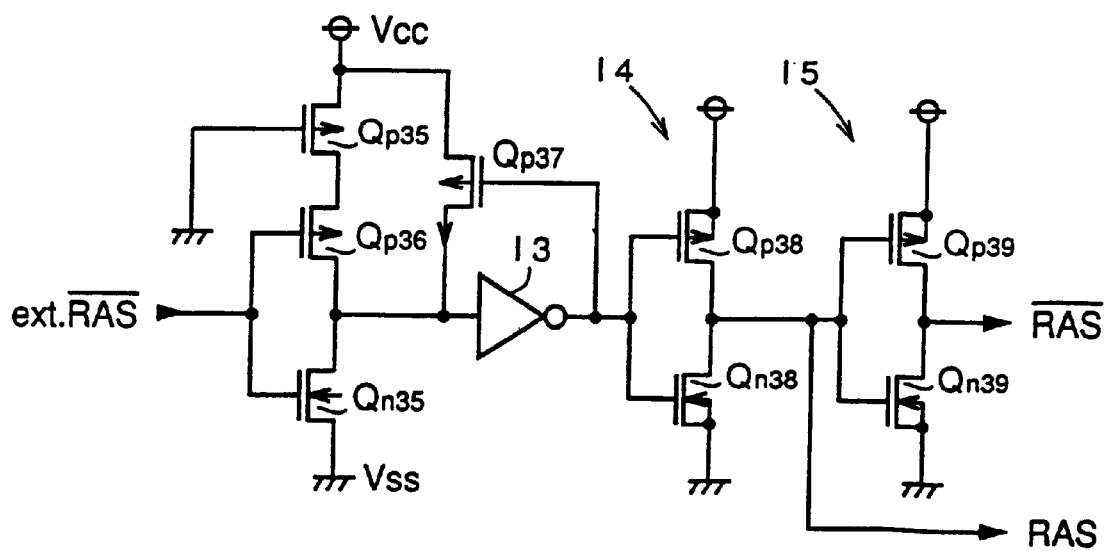

FIG. 40 is a circuit diagram showing a structure of a clock input buffer of a DRAM according to embodiment 32 of the present invention. In embodiment 32, the body regions of N channel MOS transistors Qn38 and Qn39 are connected to its own source region.

Because the body regions of N channel MOS transistors Qn38 and Qn39 are connected to its own source region in embodiment 32, it is not necessary to provide a body fix line. Therefore, increase of the layout area can be suppressed to a minimum. Ground potential $V_{SS}$ may be applied, instead of negative potential $V_{BB}$ to the body regions of transistors Qn38 and Qn39 of the last stage.

Embodiment 33

FIG. 41 is a circuit diagram showing a structure of a sense amplifier drive circuit of a DRAM according to embodiment 33 of the present invention. Referring to FIG. 41, this sense amplifier drive circuit includes a plurality of inverters connected in series, and a plurality of MOS capacitors Csp1–Csp3, and Csn1–Csn3. This sense amplifier drive circuit responds to a boost signal RX to generate control signals SOF, SON, and /SOP to drive sense amplifier 20.

FIG. 42 is a timing chart showing the operation of the sense amplifier drive circuit of FIG. 41. Referring to FIG. 42, control signal SOF rises after a predetermined time period from the rise of boost signal RX. Control signal SON rises after a predetermined time period from the rise of control signal SOF. Then, control signal /SOP falls after a predetermined time period from the rise of control signal SON.

In the sense amplifier drive circuit of embodiment 33, the body regions of all MOS capacitors Csp1–Csp3 and Csn1–Csn3 are electrically fixed. Therefore, the threshold values of MOS capacitors Csp1–Csp3 and Csn1–Csn3 do not become unstable, so that the time period from a rise of boost signal RX to a rise of control signal SOF, or the time period from a rise of control signal SOF to a rise of control signal SON will not be reduced. As a result, there is no reduction in the operation margin of sense amplifier 20.

In embodiment 33, power supply potential $V_{CC}$ is applied to the body regions of P channel MOS capacitors Csp1–Csp3. Ground potential $V_{SS}$ is applied to the body regions of N channel MOS capacitors Csn1–Csn3. However, negative potential $V_{BB}$ may be applied, instead of ground potential $V_{SS}$, to the body regions of N channel MOS capacitors Csn1–Csn3.

Embodiment 34

FIG. 43 is a circuit diagram showing a structure of a CAT (Column Address Transition) circuit of a DRAM according to embodiment 34 of the present invention. Referring to FIG. 43, this CAT circuit includes three inverters I20–I22, three NOR circuits NR1–NR3, two P channel MOS capacitors Ctp1 and Ctp2, and N channel MOS capacitors Ctn1 and Ctn2. This CAT circuit responds to control signal CAD to generate a control signal CAT. Here, power supply potential $V_{CC}$ is applied to the body regions of P channel MOS capacitors Ctp1 and Ctp2. Ground potential $V_{SS}$ is applied to the body regions of N channel MOS capacitors Ctn1 and Ctn2.

FIG. 44 is a timing chart showing an operation of the CAT circuit of FIG. 43. Referring to the timing chart of FIG. 43, the potential of an output node A of NOR circuit NR1 falls immediately when control signal CAD rises. The potential of an output node B of NOR circuit NR3 rises after a predetermined time period from the fall of the potential of node A. Then, the potential of node B falls immediately when control signal CAD falls. The potential of node A rises after a predetermined time period from the fall of the potential of node B.

Control signal CAT rises immediately when the potential of node A falls. Control signal CAT falls immediately when the potential of node B rises. Also, control signal CAT rises immediately when the potential of node B falls. Control signal CAT falls immediately when the potential of node A rises.

If the body regions of MOS capacitors Ctp1, Ctp2, Ctn1 and Ctn2 attain a floating state here, the threshold values of the capacitors thereof becomes unstable due to change in the potential of the body region. There is a possibility that the capacitance of the capacitors thereof becomes unstable. This causes delay in the fall time of control signal CAT1 or an early fall of control signal CAT2 as shown in the timing chart of FIG. 44. The operation margin of this CAT circuit is reduced when control signal CAT2 is delayed in its fall.

In embodiment 34, the body regions of MOS capacitors Ctp1, Ctp2, Ctn1 and Ctn2 are electrically fixed. Therefore, a control signal CAT that is always stable is generated.

Embodiment 35

FIG. 45 is a circuit diagram showing a structure of an N—N buffer of a DRAM according to embodiment 35 of the present invention. Such an N—N buffer is used as a data output buffer of a DRAM.

Referring to FIG. 45, this N—N buffer includes N channel MOS transistors Qnn1 and Qnn2 connected in series. The body regions of N channel MOS transistors Qnn1 and Qnn2 are connected to its own source region. Therefore, the body region of N channel MOS transistor Qnn1 is connected to output node OUT.

In this N—N buffer, complementary signals Do and /Do are connected to the gate electrodes of transistors Qnn1 and Qnn2, respectively. When signal Do attains a H level and signal /Do attains a L level, transistor Qnn1 attains a conductive state, and transistor Qnn2 attains a non-conductive state. Therefore, a signal of a H level is output.

In the N—N buffer of embodiment 35, the body regions of N channel MOS transistors Qnn1 and Qnn2 are electrically fixed, so that the threshold value will not become unstable. As a result, a great leakage current will not flow between the source and drain of transistors Qnn1 and Qnn2. Leakage current will not flow outwards via transistor Qnn1, or flow in from an external source via transistor Qnn2.

Because the body regions of transistors Qnn1 and Qnn2 are connected to its own source region in this N—N buffer, there is no increase in the layout area. Furthermore, because the body region of transistor Qnn1 is connected to the output node, the potential of the body region thereof follows the potential of the output node. Therefore, the threshold value will not rise due to a body effect in transistor Qnn1. The output signal of the present N—N buffer rises promptly to the level of power supply potential $V_{CC}$.

Embodiment 36

FIG. 46 is a circuit diagram showing a structure of an N—N buffer of a DRAM according to embodiment 36 of the present invention. In embodiment 36, ground potential $V_{SS}$ is supplied to the body regions of transistors Qnn1 and Qnn2. Thus, ground potential $V_{SS}$ may be applied, instead of the source potential, to the body regions of transistors Qnn1 and Qnn2.

Embodiment 37

FIG. 47 is a circuit diagram showing a structure of a 2-input NAND circuit of a DRAM according to embodiment 37 of the present invention. Such a NAND circuit is used in various places of a DRAM such as in a clock input buffer that generates an internal row address strobe signal /RAS.

Referring to FIG. 47, this CMOS type NAND circuit includes two input terminals. This NAND circuit includes P channel MOS transistors Qgp1–Qgp2 connected in parallel between the power supply node and output node 50, and N channel MOS transistors Qgn1 and Qgn2 connected in series between output node 50 and ground node 51. An input signal IN1 is applied to the gate electrodes of transistors Qgp1 and Qgn1. An input signal IN2 is applied to the gate electrodes of transistors Qgp2 and Qgn2. Output signal OUT is provided from output node 50.

In the present NAND circuit, the body regions of P channel MOS transistors Qgp1 and Qgp2 are set to a floating state, whereas the body regions of N channel MOS transistors Qgn1 and Qgn2 are connected to its own source region. Therefore, these body regions are electrically fixed. As a result, the threshold value of transistor Qgn1 is stable and reduced, so that this NAND circuit operates at high speed. Thus, this NAND circuit operates properly even when power supply potential $V_{CC}$ is low.

FIG. 48 is a plan view showing a structure of N channel MOS transistors Qgn1 and Qgn2 in the NAND circuit of FIG. 47. Referring to FIG. 48, transistor Qgn1 includes an n⁺ type drain region 52, an n⁺ type source/drain region 53, a p type body region 57, and a gate electrode 59. Transistor Qgn2 includes an n⁺ type source/drain region 53 common to transistor Qgn1, an n⁺ source region 54, a p type body region 58, and a gate electrode 60. Drain region 52 of transistor Qgn1 is connected to output node 50 of aluminum via contact hole CH. Source region 54 of transistor Qgn2 is connected to ground node 51 of aluminum via contact hole CH.

A p⁺ type common region 55 is formed in a portion of source/drain region 53. Contact hole CH is formed above the junction portion of source/drain region 53 and common region 55 with an intermediate layer 61 of aluminum therebetween. Therefore, body region 57 is connected to source/drain region 53 via common region 55 to be electrically fixed.

A p⁺ type common region 56 is formed in a portion of source region 54. Contact hole CH is formed above the junction portion of source region 54 and common region 56. Therefore, body region 58 is connected to source region 54 via common region 56 to be electrically fixed.

Embodiment 38

Figure 49:
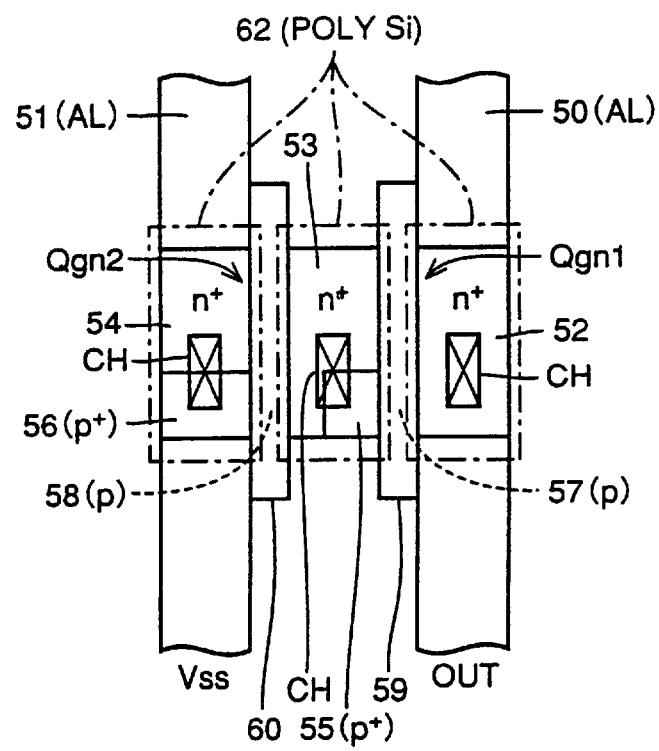

FIG. 49 is a plan view showing another structure of N channel MOS transistors Qgn1 and Qgn2 in the NAND circuit of FIG. 47. Referring to FIG. 49, an intermediate layer 62 of polysilicon is formed on drain region 52, source/drain region 53, and source region 54 in embodiment 38. Intermediate layer 62 serves as an etching stopper. The SOI substrate is prevented from being etched during the formation of contact hole CH by an etching process.

Embodiment 39

Figure 50:
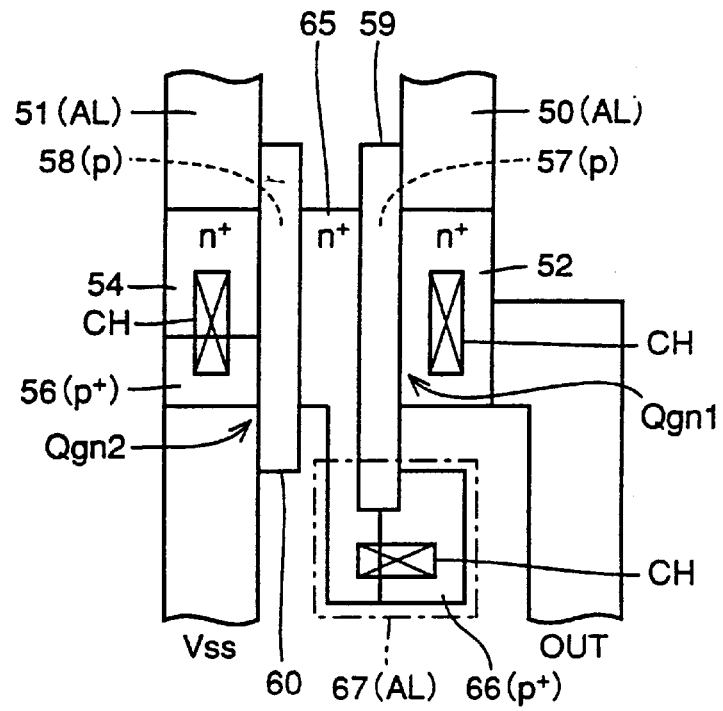

FIG. 50 is a plan view showing another structure of N channel MOS transistors Qgn1 and Qgn2 of the NAND circuit of FIG. 47. Referring to FIG. 50, a source/drain region 65 partially protrudes-between gate electrodes 59 and 60. A p⁺ type common region 66 is formed adjacent to the protruding portion of source/drain region 65. Contact hole CH is formed above the junction portion of the protruding portion of source/drain region 65 and common region 66 with an intermediate layer 67 of aluminum therebetween.

In embodiment 39, body region 57 is connected to source region 65 via common region 66 to be electrically fixed. Because a contact hole is not formed between gate electrodes 59 and 60, the distance between gate electrodes 59 and 60 can be reduced.

Embodiment 40

Figure 51:
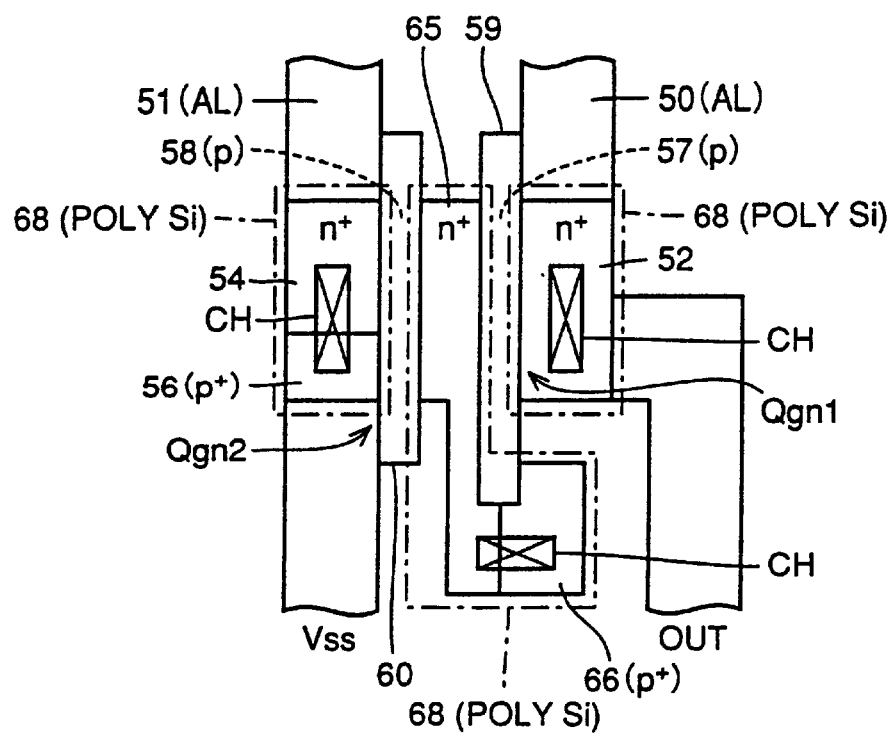

FIG. 51 is a plan view showing another structure of N channel MOS transistors Qgn1 and Qgn2 of the NAND circuit shown in FIG. 47. Referring to FIG. 51, an intermediate layer 68 of polysilicon is formed above drain region 52, source/drain region 65, and source region 54 in embodiment 40. Therefore, the SOI substrate will not be etched during the formation of contact hole CH which is carried out by an etching process.

Embodiment 41

FIG. 52 is a circuit diagram showing a structure of a 3-input NAND circuit of a DRAM according to embodiment 41 of the present invention. Referring to FIG. 52, this 3input NAND circuit includes P channel MOS transistors Qgp5, Qgp4, Qgp3 connected in parallel between the power supply node and an output node 70, and N channel MOC transistors Qgn3, Qgn4, and Qgn5 connected in series between output node 70 and a ground node 71. An input signal IN1 is provided to the gate electrodes of transistors Qgp3 and Qgn3. An input signal IN2 is provided to the gate electrodes of transistors Qgp4 and Qgn4. An input signal IN3 is provided to the gate electrodes of transistors Qgp5 and Qgn5. An output signal OUT is provided from output node 70.

In this NAND circuit, the body regions of transistors Qgp3–Qgp5 are set to a floating state, and the body regions of transistors Qgn3–Qgn5 are connected to the source region to be electrically fixed. This causes reduction in the threshold value of transistors Qgn3 and Qgn4. Thus, this 3-input NAND circuit operates at high speed. Furthermore, it is not necessary to provide a body fix line since the body regions of transistors Qgp3–Qgp5 are set to a floating state. Thus, there is almost no increase in the layout area.

FIG. 53 is a plan view showing a structure N channel MOS transistors Qgn3–Qgn5 in the 3-input NAND circuit shown in FIG. 52. Referring to FIG. 53, transistor Qgn3 includes an n⁺ type drain region 72, an n⁺ type source/drain region 73, a p type body region 79, and a gate electrode 82. Transistor Qgn4 includes a source/drain region 37 common to transistor Qgn3, an N⁺ source/drain region 74, and a p type body region 80. Transistor Qgn5 includes a source/drain region 74 common to transistor Qgn4, an n⁺ type source region 75, a p type body region 81, and a gate electrode 84.

Drain region 72 of transistor Qgn3 is connected to output node 70 via two contact holes CH. p⁺ type common region 76 is formed in a part of source/drain region 73. Therefore, body region 79 of transistor Qgn3 is connected to source/drain region 73 via common region 76 to be electrically fixed. Contact hole CH is formed on the junction portion of source/drain region 73 and common region 76 with an intermediate layer 85 of aluminum therebetween.

p⁺ type common region 77 is formed in a portion of source/drain region 74. Therefore, body region 80 of transistor Qgn4 is connected to source region 74 via common region 77 to be electrically fixed. Contact hole CH is formed on the junction portion of source/drain region 74 and common region 77 with an intermediate layer 85 of aluminum therebetween. Source region 75 of transistor Qgn5 is connected to ground node 71 via two contact holes CH. p⁺ type common region 78 is formed at a portion of source region 75. The body region of transistor Qgn5 is connected to source region 75 via common region 78 to be electrically fixed.

Embodiment 42

Figure 54:
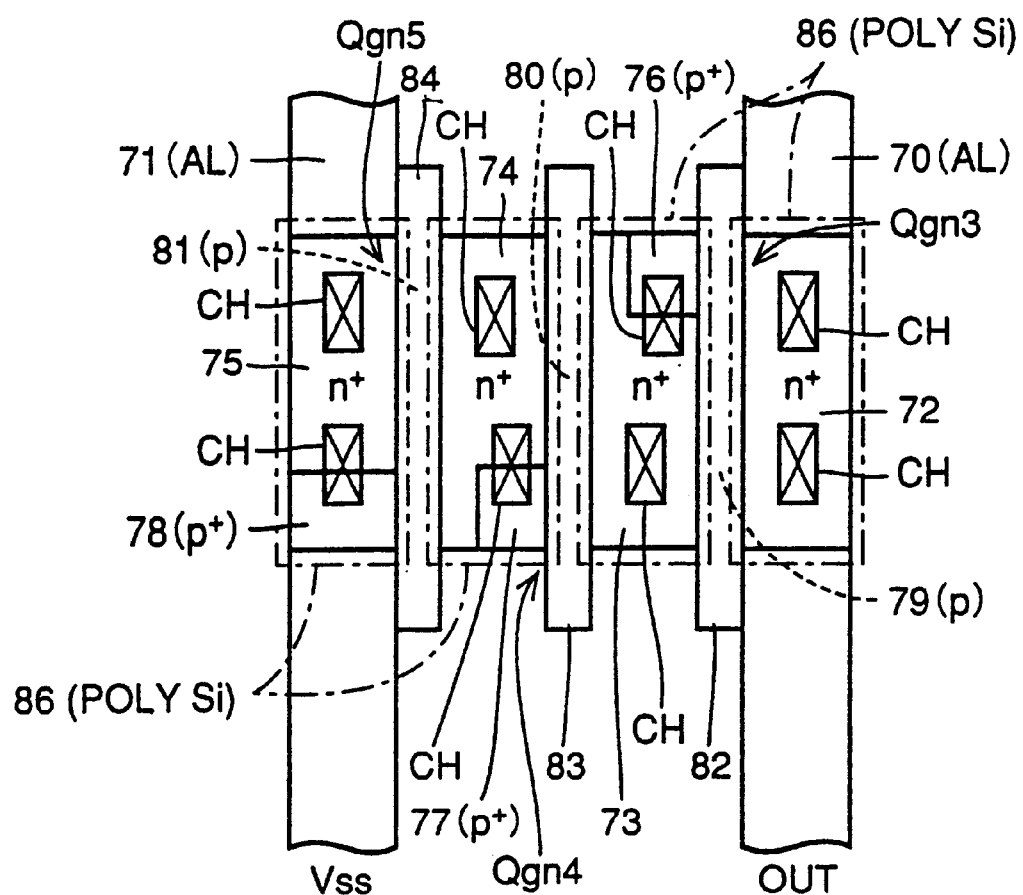

FIG. 54 is a plan view showing another structure of N channel MOS transistors Qgn3–Qgn5 in the 3-input NAND circuit of FIG. 52. Referring to FIG. 54, embodiment 42 has intermediate layer 86 of polysilicon formed on drain region 72, source/drain regions 73, 74 and source region 75. Therefore, the SOI substrate will not be etched during the formation of contact hole CH carried out by an etching process.

Embodiment 43

Figure 55:
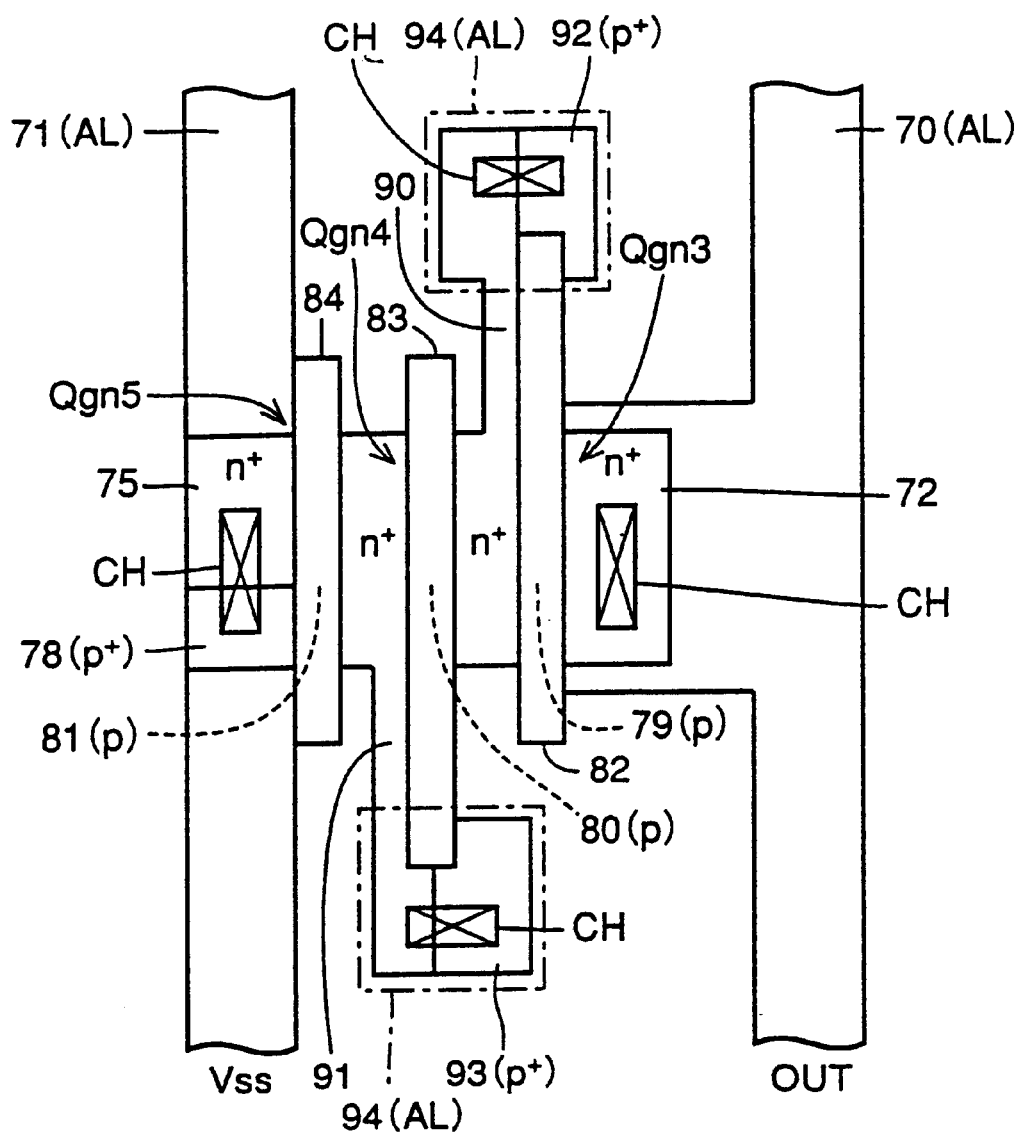

FIG. 55 is a plan view showing another structure of N channel MOS transistors Qgn3–Qgn5 in the 3-input NAND circuit of FIG. 52. Referring to FIG. 55, a source/drain region 90 protrudes from between gate electrodes 82 and 83 in embodiment 43. A source/drain region 91 also protrudes from between gate electrodes 83 and 84. A p⁺ type common region 92 is formed adjacent to the protruding portion of source/drain region 90. Therefore, body region 79 of transistor Qgn3 is connected to source/drain region 90 via common region 92 to be electrically fixed. A p⁺ type common region 93 is formed adjacent to the protruding portion of source/drain region 91. Therefore, body region 80 of transistor Qgn4 is-connected to source/drain region 91 via common region 93 to be electrically fixed. A p⁺ type common region 78 is formed at a portion of source region 75. Therefore, body region 81 of transistor Qgn5 is connected to source region 75 to be electrically fixed.

A contact hole CH is formed on the junction portion of source/drain region 90 and common region 92 with an intermediate layer 94 of aluminum therebetween. A contact hole CH is formed on the junction portion of source/drain region 91 and common region 93 with an intermediate layer 94 of aluminum therebetween.

Because a contact hole is not formed between gate electrodes 82 and 83 in embodiment 43, the distance between gate electrodes 82 and 83 can be made shorter. Also, the distance between gate electrodes 83 and 84 can be made shorter since a contact hole is not formed therebetween.

Embodiment 44

Figure 56:
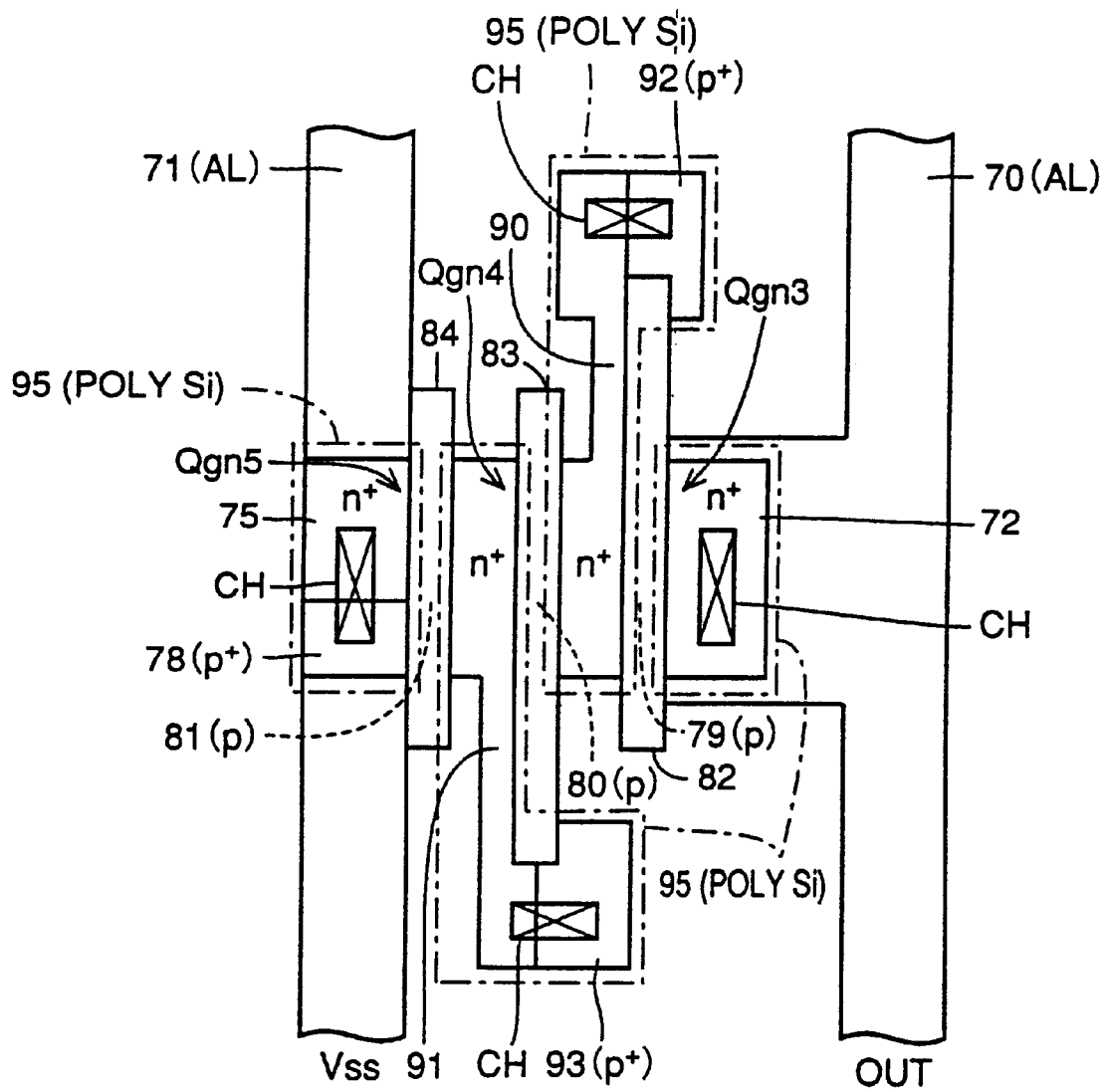

FIG. 56 is a plan view showing another structure of N channel MOS transistors Qgn3–Qgn5 in the 3-input NAND circuit of FIG. 52. Referring to FIG. 56, an intermediate layer 95 of polysilicon is formed on drain region 72, source/drain regions 90, 91 and source region 75 in embodiment 44. Therefore, the SOI substrate is not etched during the formation of contact hole CH which is carried out by an etching process.

Embodiment 45

Figure 57:
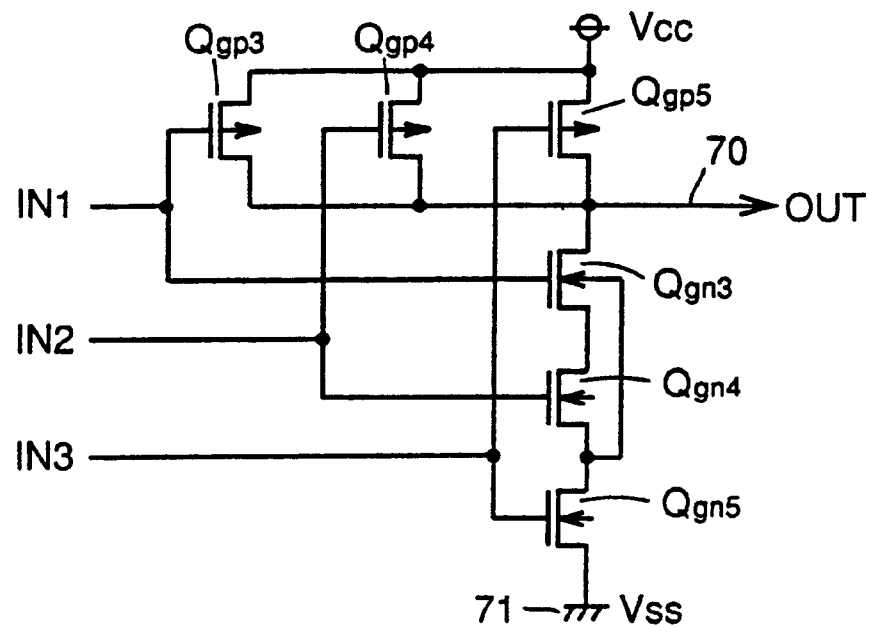

FIG. 57 is a circuit diagram showing a structure of a 3-input NAND circuit of DRAM according to embodiment 45 of the present invention. Referring to FIG. 57, the body region of transistor Qgn3 is connected to the source/drain region common to transistors Qgn4 and Qgn5. Also, the body regions of transistors Qgn4 and Qgn5 are set to a floating state. When the potential of output node 70 falls to a L level in such a NAND circuit, the potential of the body region of transistor Qgn3 is always at the level of the ground potential.

It is appreciated from embodiment 45 that at least the body region of transistor Qgn3 directly connected to output node 70 should be electrically fixed. The body region of transistor Qgn3 may be connected, not to its own source region, but to the source/drain region common to transistors Qgn4 and Qgn5.

In embodiment 45, the potential applied to the body region of transistor Qgn3 is not constant, and rises according to the rise of the potential of output node 70. Therefore, a body effect is not generated in this transistor Qgn3, so that this 3-input NAND circuit operates at high speed.

Embodiment 46

Figure 58:
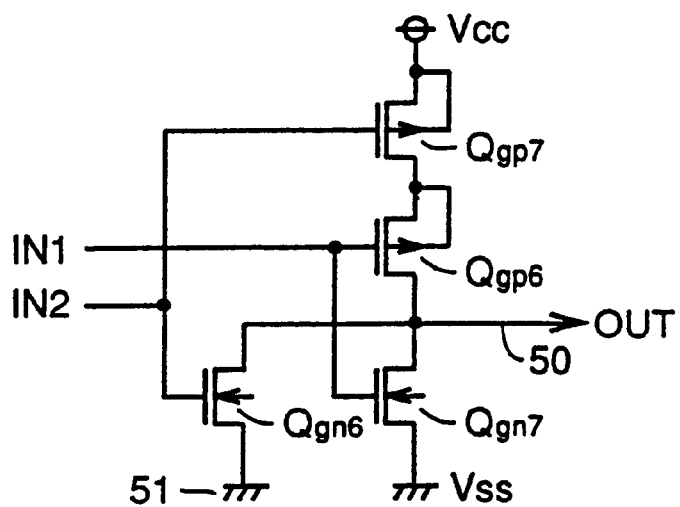

FIG. 58 is a circuit diagram showing a structure of a 2-input NAND circuit of a negative logic (a 2-input NOR circuit of a positive logic) of a DRAM according to embodiment 46 of the present invention. Referring to FIG. 58, this 2-input NAND circuit includes N channel MOS transistors Qgn6 and Qgn7 connected in parallel between ground node 51 and output node 50, and P channel MOS transistor Qgp6 and Qgp8 connected in series between output node 50 and the power supply node. An input signal IN1 is applied to the gate electrodes of transistors Qgn7 and Qgp6. An input signal IN2 is applied to the gate electrodes of transistors Qgn6 and Qgp7. An output signal OUT is provided from output node 50.

In this NAND circuit, the body regions of transistors Qgn6 and Qgn7 are set to a floating state. The body regions of transistors Qgp6 and Qgp7 are connected to its own drain region. Therefore, the body region of transistor Qgp6 is supplied with a drain potential that rises in response to the rise of output signal OUT. A constant ground potential $V_{SS}$ is applied to the drain region of transistor Qgp7. Therefore, this NAND circuit operates at high speed since the threshold value of transistor Qgp6 is reduced. This NAND circuit can operate properly even when the power supply potential $V_{CC}$ is low.

Embodiment 47

Figure 59:
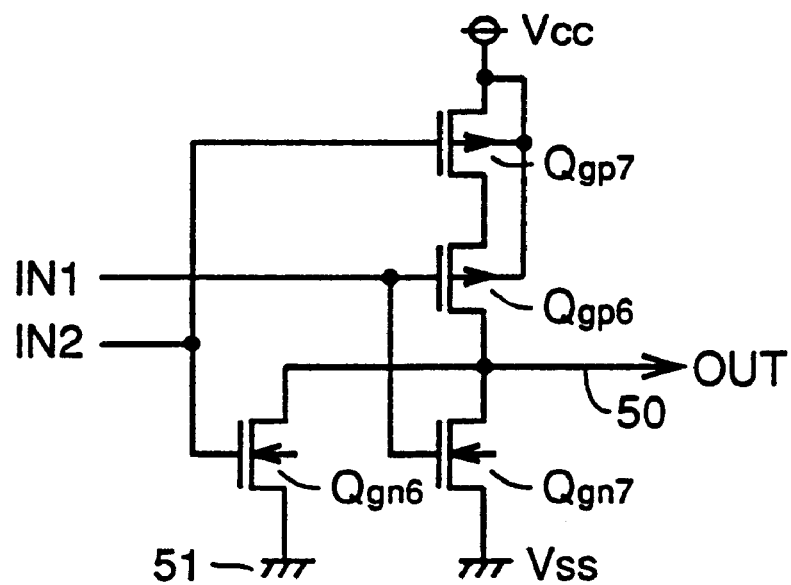

FIG. 59 is a circuit diagram showing a structure of a 2-input NAND circuit of a DRAM according to embodiment 47 of the present invention. Referring to FIG. 59, power supply potential $V_{CC}$ is applied to the body region of P channel MOS transistor Qgp6 to be electrically fixed in this NAND circuit. Although a body effect is generated in transistor Qgp6 in embodiment 47, the body region of transistor Qgp6 may be supplied with power supply potential $V_{CC}$ instead of its own drain potential.

Embodiment 48

FIG. 60 is a sectional view of a planar type memory cell portion taken along the bit line direction of a DRAM according to embodiment 48 of the present invention. FIG. 61 is a sectional view of the memory cell portion of FIG. 60 taken along the word line direction.

As shown in FIGS. 60 and 61, a source/drain region 44, a LOCOS oxide film 5, a gate electrode 4, and a cell plate electrode 45 are formed on an SOI substrate 6. Gate electrode 4 and cell plate electrode 45 are formed within first interlayer insulation film 33. Here, two source/drain regions 44, body region 3 therebetween, and gate electrode 4 form one N channel MOS transistor. One source/drain region 44, body region 3, and cell plate electrode 45 form one N channel MOS capacitor.

Source/drain region 44 common to the two transistors is connected to bit line BL via an intermediate layer 32 of a polypad. A second interlayer insulation film 34 is formed on first interlayer insulation film 33 and intermediate layer 32. Bit line BL is formed on second interlayer insulation film 34. Bit line BL is connected to intermediate layer 32 via a contact hole. A third interlayer insulation film 35 is formed on bit line BL. On third interlayer insulation film 35, a pillar word line 46 of aluminum is formed. Pillar word line 46 is connected to word line WL that forms gate electrode 4 via a contact hole at every constant interval. Therefore, when drive voltage is supplied to word line WL, a signal propagation delay generated by word line WL is reduced.

Referring to FIG. 61, contact region 31 is formed in a portion of body region 3 of the transistor. Therefore, body region 3 is connected to body fix line 30 via contact region 31 and intermediate layer 32 to be electrically fixed. Because body region 3 of the transistor forming a memory cell is electrically fixed, the threshold value of that transistor does not become unstable, and a great leakage current will not flow between the source and drain. Therefore, the data retaining time period in this memory cell is increased. Even when charge is generated in silicon substrate 7 due to introduction of α particles into this SOI substrate 6, the charge will not enter body region 3 because body region 3 and silicon substrate 7 are electrically isolated by buried oxide layer 8. Because this body region 3 is extremely thin, there is almost no generation of charge caused by α particles in body region 3. Therefore, there is almost no generation of the so-called soft error.

Embodiment 49

FIG. 62 is a sectional view of a memory cell portion of a DRAM taken along the bit line direction according to embodiment 49 of the present invention. FIG. 63 is a sectional view of the memory cell portion of FIG. 62 taken along the word line direction. In embodiment 49 shown in FIGS. 62 and 63, a field shield electrode 47 is formed instead of a LOCOS oxide film on SOI substrate 6. This field shield electrode 47 is formed in first interlayer insulation film 33.

Ground potential $V_{SS}$ or a negative potential is applied to field shield electrode 47, whereby the portion of SOI active layer 9 beneath field shield electrode 47 is rendered nonconductive. Therefore, this transistor and this capacitor are electrically isolated from an adjacent element. It is appreciated from embodiment 49 that elements such as a transistor may be isolated, not by a LOCOS, but by other isolation methods such as a field shield.

Embodiment 50

FIG. 64 is a sectional view of a memory cell portion of a DRAM taken along the bit line direction according to embodiment 50 of the present invention. FIG. 64 shows a stacked type memory cell isolated by LOCOS oxide film 5.

Referring to FIG. 64, a source/drain region 44, a LOCOS oxide film 5, and a gate electrode 4 are formed on SOI substrate 6. The two source/drain regions 44, body region 3 located therebetween, and gate electrode 4 form one N channel MOS transistor.

Source/drain region 44 common to the two transistors is connected to bit line BL via intermediate layer 32. A storage node 48 and a cell plate electrode 45 are formed on the other source/drain region 44 of that transistor. Storage node 48 and cell plate 45 form the electrode of the capacitor. Therefore, the above-referred N channel MOS transistor and capacitor form a memory cell.

A contact region (not shown) is formed in a portion of body region 3 of a transistor. Therefore, body region 3 is connected to a body fix line (not shown) via that contact region to be electrically fixed.

Embodiment 51

FIG. 65 is a sectional view of a memory cell unit taken along the bit line direction of a DRAM according to embodiment 51 of the present invention. FIG. 65 shows a stacked type memory cell isolated by a field shield.

Referring to FIG. 65, embodiment 51 has a field shield electrode 47 formed instead of a LOCOS oxide film on SOI substrate 6. Also, a contact region (not shown) is formed at a portion of body region 3 of this transistor. Therefore, body region 3 is connected to a body fix line (not shown) via the contact region. Ground potential $V_{SS}$ or $V_{BB}$ is applied to the body fix line. Therefore, body region 3 of the transistor is electrically fixed.

Embodiment 52

Figure 66:
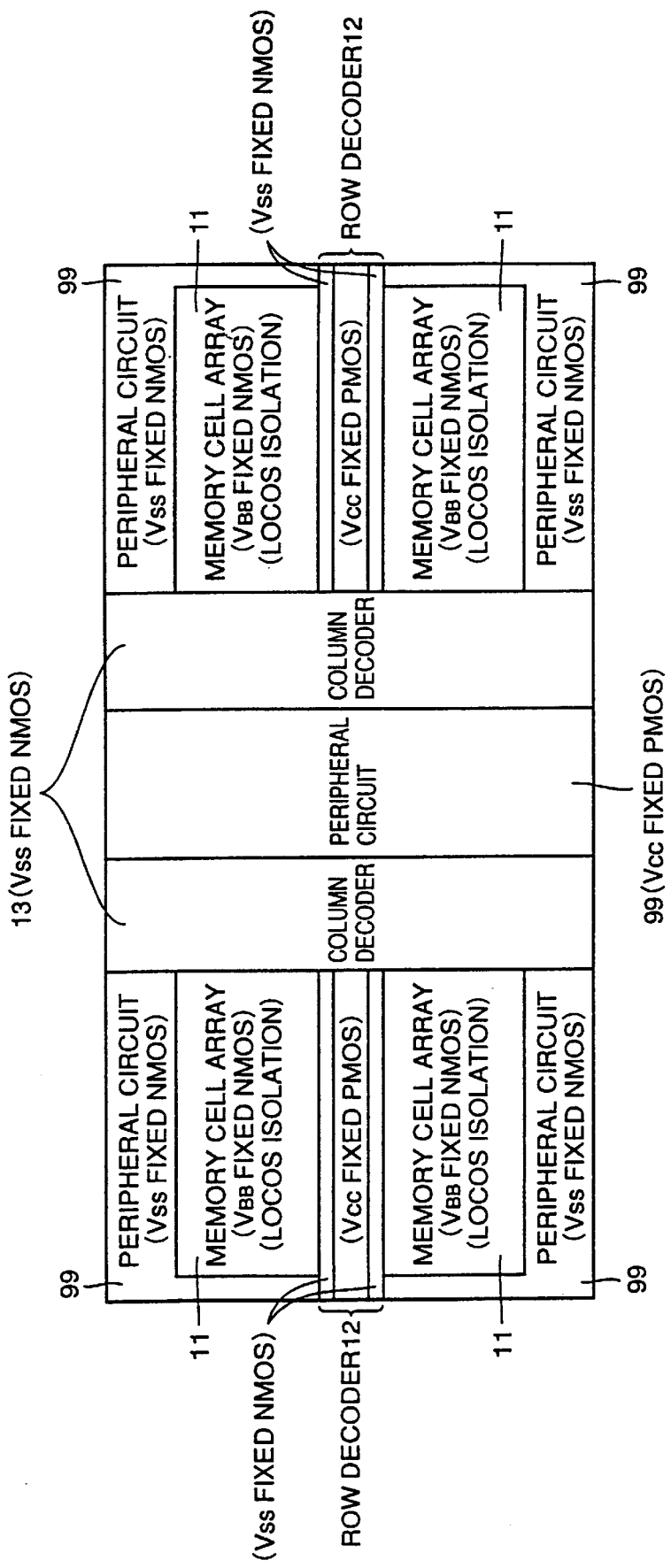

FIG. 66 is a layout diagram showing an entire structure of a DRAM according to embodiment 52 of the present invention. Referring to FIG. 66, this DRAM includes four memory cell arrays 11, two row decoders 12, two column decoders 13, and a peripheral circuit 99. Each row decoder 12 is disposed between two memory cell arrays 11. Each column decoder 13 is disposed at one side of two memory cell arrays 11.

In embodiment 52, the elements in memory cell array 11 are isolated by a LOCOS. A negative potential $V_{BB}$ is applied to the body region of the N channel MOS transistor forming each memory cell in the memory cell array to be electrically fixed.

Row decoder 12 includes a plurality of P channel MOS transistors and a plurality of N channel MOS transistors. The body region of the P channel MOS transistor in row decoder 12 is supplied with power supply potential $V_{CC}$, whereby the body region is electrically fixed. The body region of the N channel MOS transistor in row decoder 12 is supplied with the ground potential $V_{SS}$, whereby the body region is electrically fixed.

Column decoder 13 includes a plurality of N channel MOS transistors. The body region of the N channel MOS transistor in column decoder 13 is supplied with ground potential $V_{SS}$ to be electrically fixed.

Peripheral circuit 99 located between column decoders 13 includes a plurality of P channel MOS transistors. Power supply potential $V_{CC}$ is applied to the body region of the P channel MOS transistor in peripheral circuit 99, whereby the body region is electrically fixed. The other peripheral circuit 99 includes a plurality of N channel MOS transistors. Ground potential $V_{SS}$ is applied to the body region of the N channel MOS transistor in peripheral circuit 99, whereby the body region is electrically fixed.

As described above, all the body regions in the MOS transistors in this DRAM are electrically fixed. It is to be noted that the body region of the P channel MOS transistor is supplied with power supply potential $V_{CC}$. Furthermore, negative potential $V_{BB}$ is applied to the body regions of the transistors in memory cell array 11 out of the N channel MOS transistors. Ground potential $V_{SS}$ is applied to the body regions of the other N channel MOS transistors.

Therefore, the threshold voltage of the N channel MOS transistor in memory cell array 11 becomes greater than that of other N channel MOS transistors. Therefore, the leakage current flowing in the transistors forming the memory cell is reduced, resulting in a longer data retaining time period of the memory cell.

Embodiment 53

Figure 67:
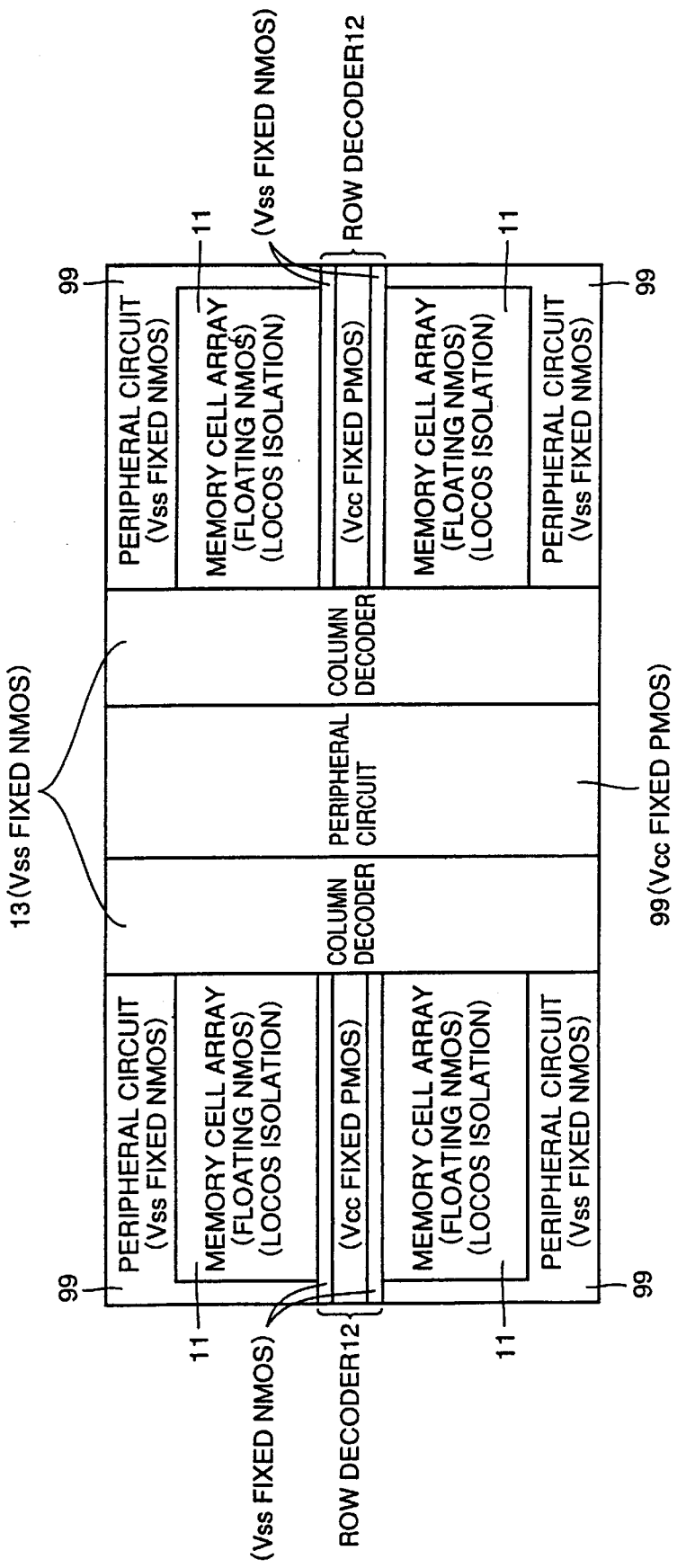

FIG. 67 is a layout diagram showing an entire structure of a DRAM according to embodiment 53 of the present invention. Referring to FIG. 67, all the body regions in the N channel MOS transistors in memory cell array 11 are set to a floating state.

In general, memory cell array 11 has transistors arranged at a density higher than that of peripheral circuit 99. Therefore, there is almost no increase in the layout area even when a body fix line is disposed in row decoder 12, column decoder 13, and peripheral circuit 99. Furthermore, because it is not necessary to provide a body fix line in memory cell array 11, the layout area is similar to that of a conventional one.

Embodiment 54

Figure 68:
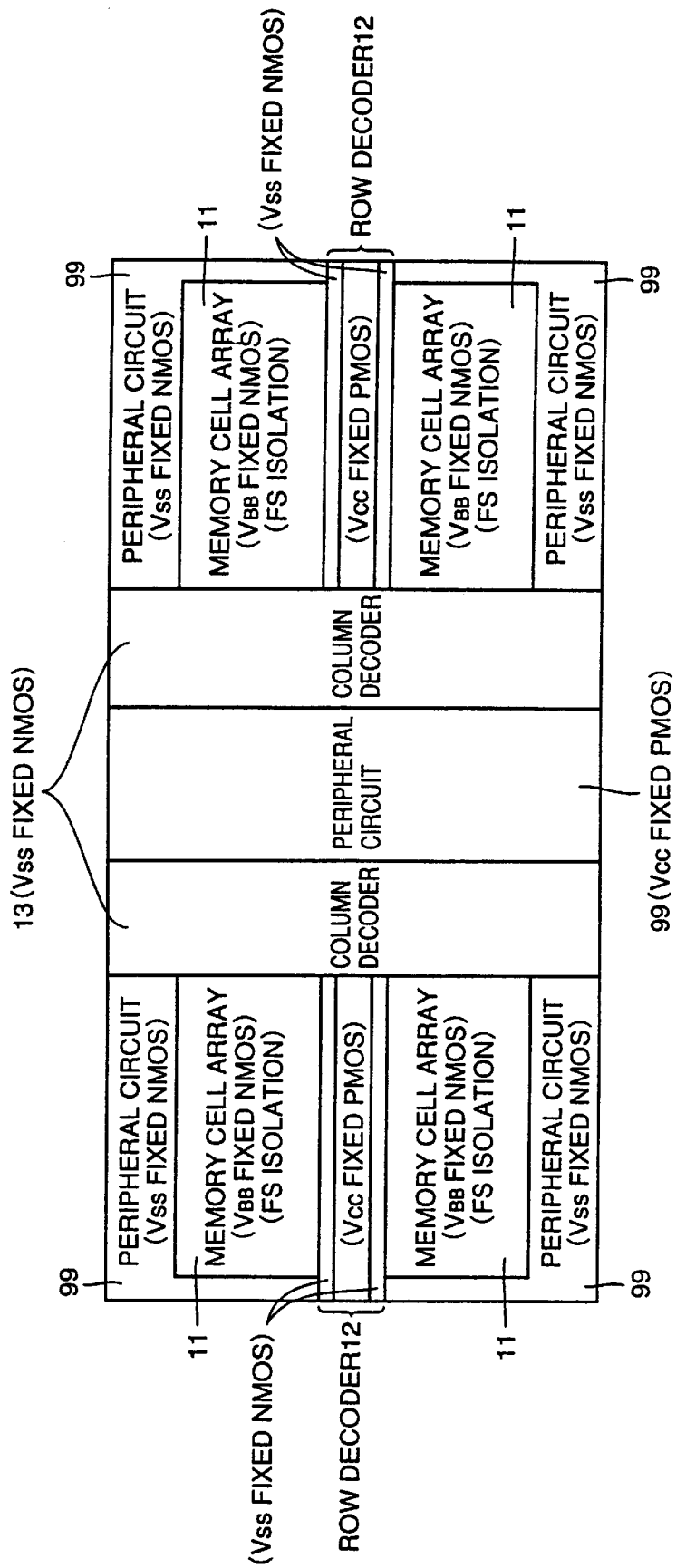

FIG. 68 is a layout diagram showing an entire structure of a DRAM according to embodiment 54 of the present invention. Referring to FIG. 68, the elements in memory cell array 11 are isolated by a field shield in embodiment 54. The body region in the transistor in memory cell array 11 is supplied with negative potential Vbb, as in FIG. 66.

By isolating at least the elements in memory cell array 11, the body region of the transistor in that memory cell array 11 can be electrically fixed without having to provide a body fix line in memory cell array 11. Therefore, the layout area of the DRAM of embodiment 54 is smaller than that of embodiment 52. Although the layout area of embodiment 54 is substantially equal to that of embodiment 53, there is almost no leakage current in the transistors of memory cell array 11 since the body region is electrically fixed. Therefore, the data retaining time period according to embodiment 54 is longer than that of embodiment 53.

Embodiment 55

Figure 69:
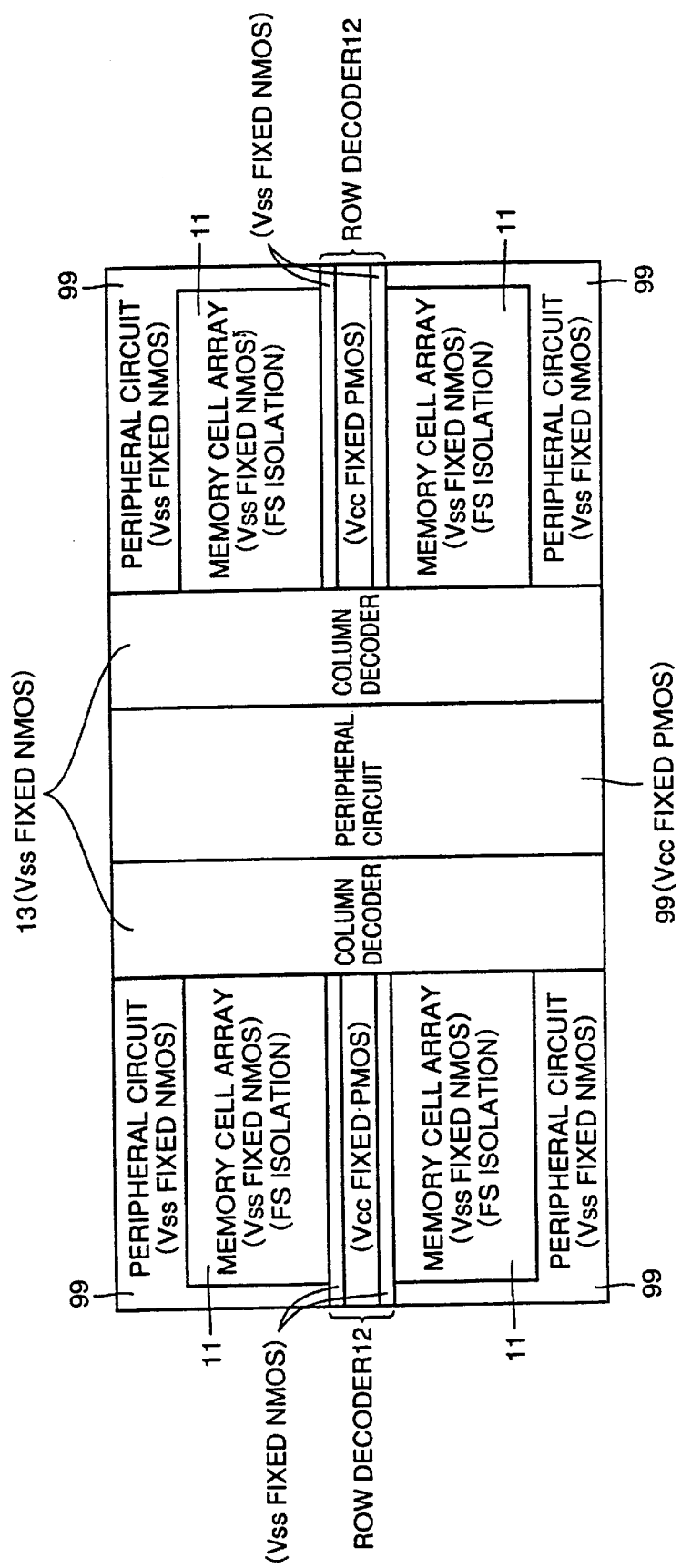

FIG. 69 is a layout diagram showing an entire structure of a DRAM according to embodiment 55. Referring to FIG. 69, the body region of the N channel MOS transistor in memory cell array is supplied with ground potential $V_{SS}$ to be electrically fixed. Therefore, ground potential $V_{SS}$ is applied to all the body regions of N channel MOS transistors, and power supply potential $V_{CC}$ is applied to all the body regions of P channel MOS transistors. Thus, ground potential $V_{SS}$ may be applied to the body region in the transistor of memory cell array 11.

Embodiment 56

Figure 70:
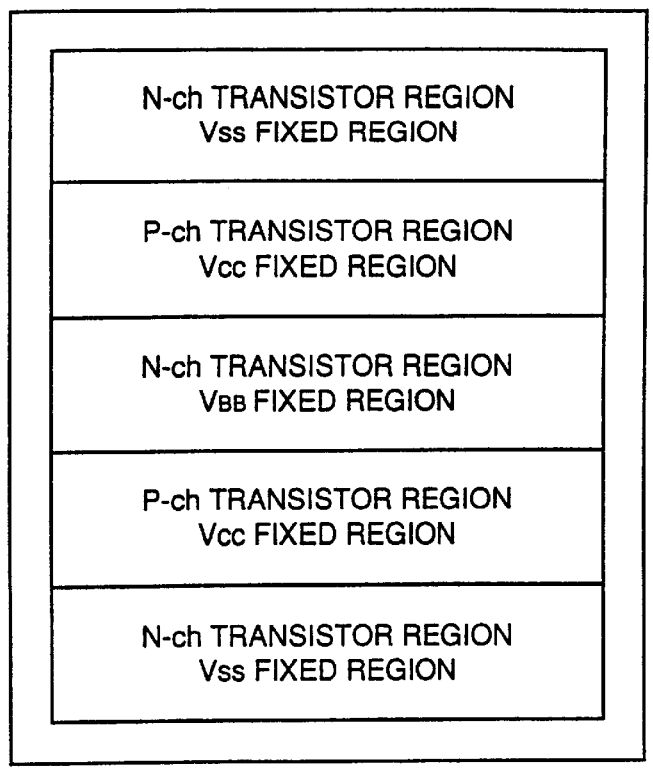

FIG. 70 is a diagram showing the concept of a DRAM according to embodiment 56 of the present invention. Referring to FIG. 70, this DRAM includes a plurality of N channel MOS transistors and a plurality of P channel MOS transistors. Ground potential $V_{SS}$ is applied to the body region of several transistors of the N channel MOS transistors, and negative potential $V_{BB}$ is applied to the body region of the other N channel MOS transistors. Power supply potential $V_{CC}$ is applied to all the body regions of all P channel MOS transistors.

Therefore, in embodiment 56, the body region of all MOS transistors are electrically fixed. Because the threshold voltage of the transistor having a body region to which negative potential $V_{BB}$ is supplied is greater than the threshold voltage of the transistor having a body region to which ground potential $V_{SS}$ is supplied, these plurality of N channel MOS transistors have two types of threshold voltages.

Embodiment 57

Figure 71:
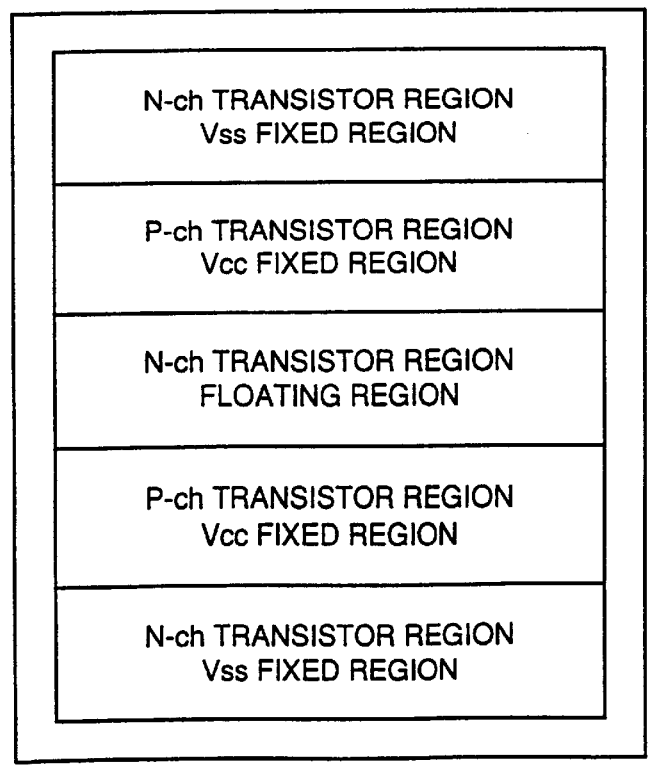

FIG. 71 is a diagram showing the concept of a DRAM according to embodiment 57 of the present invention.

Referring to FIG. 71, the body region of some N channel MOS transistors are set to a floating state. Because it is not necessary to provide a body fix line in the N channel MOS transistor region having a body region of a floating state, the layout area is smaller than that of embodiment 56.

Embodiment 58

Figure 72:
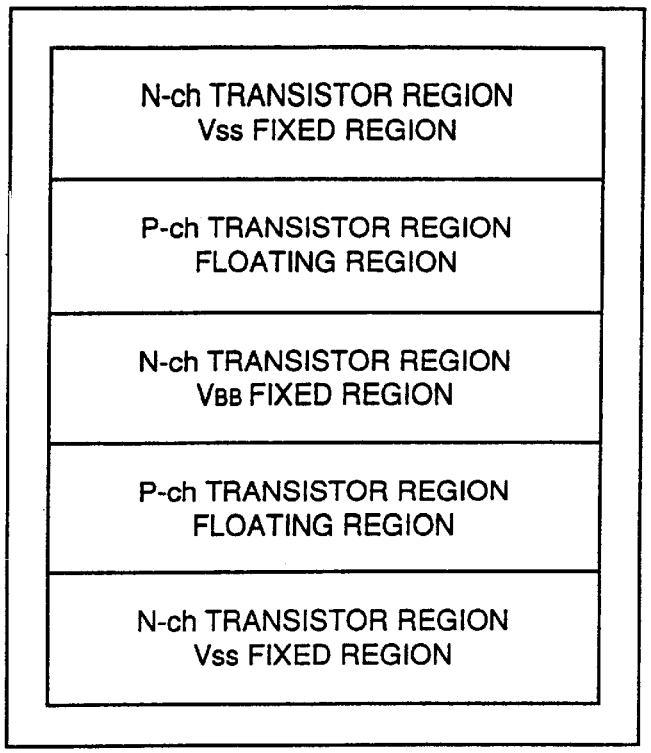

FIG. 72 is a diagram showing the concept of a DRAM according to embodiment 58 of the present invention. Referring to FIG. 72, the body region of all P channel MOS transistors is set to a floating state in embodiment 58. Therefore, the body regions of all N channel MOS transistors are electrically fixed, and the body regions of all P channel MOS transistors are set to a floating state in embodiment 58. Although the breakdown voltage between the source and drain of an N channel MOS transistor having a body region of a floating state is generally lower than that of a P channel MOS transistor, the breakdown voltage between the source and drain of an n channel MOS transistor is increased substantially to the level of that of a P channel MOS transistor since the body region of N channel MOS transistor is electrically fixed in embodiment 58. It is therefore not necessary to provide a body fix line in the region of the P channel MOS transistor since the breakdown voltage between the source and drain of all transistors is high and the body region of a P channel MOS transistor is not electrically fixed. Thus, the layout area of the DRAM of FIG. 58 is smaller than that of embodiment 56.

Although ground potential $V_{SS}$ is applied to the body region of some N channel MOS transistors in embodiment 58, a negative potential $V_{BB}$ may be applied, instead of potential $V_{SS}$.

Embodiment 59

Figure 73:
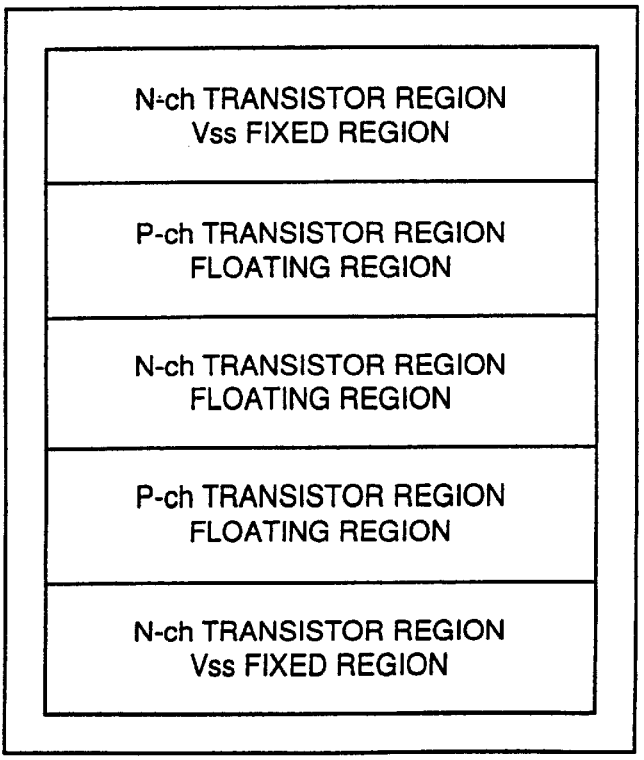

FIG. 73 is a diagram showing the concept of a DRAM according to embodiment 59 of the present invention. Referring to FIG. 73, the body region of some N channel MOS transistors are set to a floating state. Therefore, the body regions of some N channel MOS transistors are fixed, and the body regions of all P channel MOS transistors are set to a floating state. Because it is not necessary to provide a body fix line in the region of the some N channel MOS transistors, the layout area of embodiment 59 is smaller than that of embodiment 58.

Embodiment 60

Figure 74:
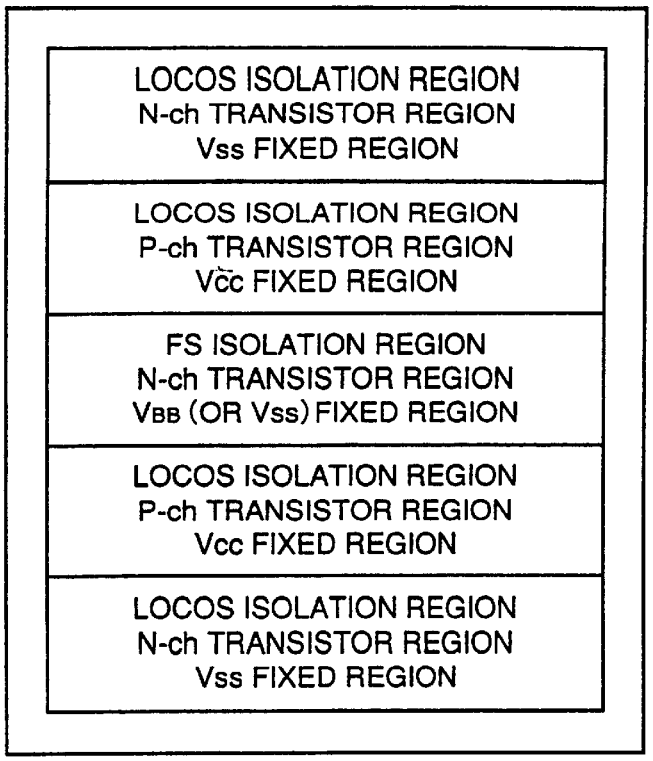

FIG. 74 is a diagram showing the concept of DRAM according to embodiment 60 of the present invention. Referring to FIG. 74, all P channel MOS transistors are isolated by a LOCOS. Some N channel MOS transistor are isolated by a LOCOS, and the remaining N channel MOS transistors are isolated by a field shield (FS). Negative potential $V_{BB}$ is applied to the body region of the N channel MOS transistor isolated by a field shield, and ground potential $V_{SS}$ is applied to the body region of the N channel MOS transistor isolated by a LOCOS. Power supply potential $V_{CC}$ is supplied to the body regions of all P channel MOS transistors. It is to be noted that ground potential $V_{SS}$ may be applied to the body regions of the N channel MOS transistor isolated by a field shield.

Embodiment 61

Figure 75:
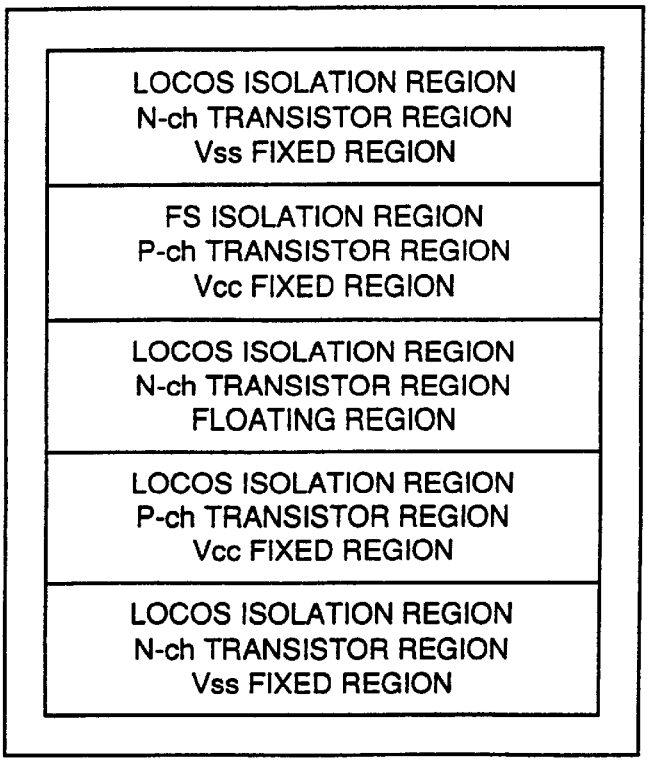

FIG. 75 is a diagram showing the concept of a DRAM according to embodiment 61 of the present invention. Referring to FIG. 75, some P channel MOS transistors are isolated by a field shield, and the remaining P channel MOS transistors are isolated by a LOCOS. All N channel MOS transistors are isolated by a LOCOS. Power supply potential $V_{CC}$ is applied to the body regions of all P channel MOS transistors. Some N channel MOS transistors have their body regions set to a floating state. The remaining N channel MOS transistors have their body regions supplied with ground potential $V_{SS}$. In embodiment 61, the body regions of some N channel MOS transistors are electrically fixed, and the body regions of all P channel MOS transistors are electrically fixed.

Embodiment 62

FIG. 76 is a diagram showing a concept of a DRAM according to embodiment 62 of the present invention. Referring to FIG. 76, this DRAM includes a plurality of P channel MOS transistors, and a plurality of N channel MOS transistors. Some P channel MOS transistors have a threshold voltage $V_{thp}1$, and the remaining P channel MOS transistors have a threshold voltage $V_{thp}2$. All the N channel MOS transistors have a threshold voltage of $V_{thn}$. Therefore, these P channel MOS transistors have two types of threshold voltages. The N channel MOS transistors have one type of threshold voltage. Thus, a channel type MOS transistor of the same conductivity type may have two types of threshold voltages.

In order to provide two types of threshold voltages in a transistor, two types of potentials are applied to the body regions of those transistors. This is because difference in the potential applied to a body region will result in different threshold voltages due to a body effect.

Alternatively, impurities differing in concentration may be doped into the n type body region of P channel MOS transistor 3 as shown in FIG. 77. Regions of different impurity concentration will be formed in the proximity of the surface of body region 3, whereby the two P channel MOS transistors have different threshold voltages.

Alternatively, a gate electrode 4 differing in material may be formed of the transistors. In this case, the threshold voltages of these transistors will differ from each other according to the work function specific to these materials.

Alternatively, SOI active layer 9 may be partially etched to result in a thick portion and a thin portion with transistors formed thereon. The transistor formed on the thin SOI active layer 9 approximates the so-called fully depleted transistor. The threshold voltage of a fully depleted transistor is generally smaller than that of a partially depleted transistor. Therefore, the transistor formed on the thin SOI active layer 9 has a threshold voltage smaller than that of the transistor formed on the thick SOI active layer 9.

The threshold voltage of a transistor may be changed by varying the film thickness or the material of the gate insulation film.

Although the P channel MOS transistors have two types of threshold voltages in embodiment 62, the N channel MOS transistors may have two types of threshold voltages. Furthermore, the transistor may have more than two types of threshold voltages.

As described above, the DRAM may operate more stably if many transistors in the DRAM formed on a SOI substrate have more than one type of threshold voltages.

Embodiment 63

FIG. 78 is a diagram showing the concept of a DRAM according to embodiment 63 of the present invention. Referring to FIG. 78, the body region of the transistor of a short gate length is electrically fixed, and the body region of the transistor of a long gate length is electrically floating. In general, the breakdown voltage between the source and drain of a transistor of a long gate length is higher than that of a transistor of a short gate length. Therefore, when the body region of the transistor of the short gate length is fixed, the threshold voltage thereof becomes approximately equal to that of a transistor having a body region of a floating state and a long gate length. in this case, there is hardly no increase in the layout area since it is not necessary to arrange a body fix line in the region of the transistor of the long gate length.

Embodiment 64

FIG. 79 is a sectional view showing a structure of the sense amplifier of a DRAM according to embodiment 64 of the present invention. Referring to FIG. 79, SOI active layer 9 is etched in a mesa-manner, and the LOCOS oxide film 5 of FIG. 6 is not formed.

FIGS. 80 and 81 are sectional views of a memory cell of a DRAM shown in FIG. 79. This memory cell has a planar structure. SOI active layer 9 is etched in a mesa-manner differing from that of FIGS. 60 and 61.

Such a structure is manufactured by steps set forth in the following.

After source/drain region 44, contact region 31, and the like are formed in SOI active layer 9, SOI active layer 9 is completely etched except for the element active region. As a result, the element active region is formed in a mesa-manner. Then, a gate oxide film is formed so as to cover the mesa element active region. A gate electrode 4 is formed on this oxide film.

In the case of the LOCOS isolation shown in FIG. 6, there is a problem that boron implanted into P type body region 3 is absorbed into LOCOS oxide film 5 during formation of LOCOS oxide film 5 carried out by thermal oxidation of SOI active layer 9. This absorption of boron from body region 3 into LOCOS oxide film 5 causes reduction in the impurity concentration of edge portion 3a of body region 3. As a result, a parasitic MOS transistor of a low threshold value is formed in this edge portion 3a. Therefore, the so-called hump phenomenon appears in the drain current-gate voltage characteristics of transistor Qn1. This hump phenomenon is considered to be caused also by a bird's beak specific to LOCOS isolation providing stress to the thin SOI active layer 9.

In contrast, the impurity concentration of the edge portion in body region 3 does not decrease in the case of mesa isolation shown in FIGS. 79–81. This is because SOI active layer 9 is not subjected to thermal oxidation, and because body region 3 is covered by a gate oxide film and gate electrode 4. Furthermore, stress will not be generated in the edge portion of body region 3 because an oxide film, a nitride film, or the like is deposited as interlayer insulation film 33 by CVD. Thus, a hump phenomenon will not appear in the drain current-gate voltage characteristics of this transistor. This transistor can operate in a further stable manner.

Embodiment 65

FIG. 82 is a sectional view of a memory cell of a DRAM according to embodiment 65 of the present invention. Referring to FIG. 82, this memory cell has a stack structure. SOI active layer 9 is etched in a mesa-manner. It is appreciated from embodiments 64 and 65 that mesa isolation may be employed instead of LOCOS isolation.

Embodiment 66

FIG. 83 is a diagram showing the concept of a DRAM partially according to embodiment 66 of the present invention. Although the above-described embodiment does not mention the potential of silicon substrate 7, it is preferable to supply a predetermined substrate potential $V_{BB}$ to silicon substrate 7 as shown in FIG. 83. This substrate potential $V_{BB}$ is generated by a substrate potential generator 100.

In SOI substrate 6, silicon substrate 7 is isolated from SOI active layer 9 by buried oxide layer 8. However SOI active layer 9 is connected to silicon substrate 7 via a parasitic capacitance. Therefore, when silicon substrate 7 is electrically floating, the potential of body region 3 is apt to become unstable in accordance with the potential variation of silicon substrate 7. In embodiment 66, the potential of silicon substrate 7 does not change since a predetermined substrate potential $V_{BB}$ is provided to silicon substrate 7 so that it is electrically fixed. Thus, a semiconductor element such as a transistor formed on SOI substrate 6 operates stably.

Embodiment 67

FIG. 84 is a diagram showing the concept of a DRAM according to embodiment 67 of the present invention. The DRAM of embodiment 67 differs from that of FIG. 83 in that silicon substrate 7 is connected to ground node 51. Because ground potential $V_{SS}$ is supplied to silicon substrate 7, silicon substrate 7 is electrically fixed. Therefore, a semiconductor element such as a transistor formed on SOI substrate 6 operates stably. It is appreciated from embodiment 67 that the potential is not particularly limited in the present invention. Not only substrate potential $V_{BB}$, but also ground potential $V_{SS}$ may be applied to silicon substrate 7.

Embodiment 68

FIG. 85 is a perspective view of a structure to supply substrate potential $V_{BB}$ to silicon substrate 7 as shown in FIG. 83. Referring to FIG. 85, a substrate potential generator 100 is formed on SOI substrate 6. A bonding pad 102 is formed on SOI substrate 6. Substrate potential $V_{BB}$ is provided to bonding pad 102 from substrate potential generator 100.

SOI substrate 6 is provided on a die pad (conductor plate) 106 disposed in the package. Bonding pad 102 is connected to die pad 106 via a wire 104. Since the back face of SOI substrate 6 is in contact with die pad 106, substrate potential $V_{BB}$ generated by substrate potential generator 100 is provided to silicon substrate 7 via bonding pad 102, wire 104, and die pad 106. Thus, silicon substrate 7 is electrically fixed.

Embodiment 69

FIG. 86 is a perspective view showing a specific structure to provide ground potential $V_{SS}$ to silicon substrate 7 as shown in FIG. 84. Bonding pad 102 of FIG. 86 serves to supply ground potential $V_{SS}$ to the circuit formed on SOI substrate 6. Bonding pad 102 is connected to lead frame 110 to which ground potential $V_{SS}$ is supplied via wire 104.

In the present embodiment, die pad 106 is connected to lead frame 110 via wire 104. Therefore, ground potential $V_{SS}$ is supplied to silicon substrate 7 via lead frame 110, wire 104 and die pad 106. Therefore, silicon substrate 7 is electrically fixed.

Embodiment 70

FIG. 87 is a perspective view showing another example for supplying ground potential $V_{SS}$ to silicon substrate 7. Referring to FIG. 87, SOI substrate 6 is provided on a die pad 112 of a L shape. Bonding pad 102 serves to provide ground potential $V_{SS}$ to the circuit on SOI substrate 6. Bonding pad 102 is connected to die pad 112 via wire 104. Therefore, ground potential $V_{SS}$ is supplied to bonding pad 102 via die pad 112, wire 104, and also to silicon substrate 7 via die pad 112. Therefore, silicon substrate 7 is electrically fixed.

Embodiment 71

FIG. 88 is a sectional view showing another example of providing substrate potential $V_{BB}$ to silicon substrate 7. Referring to FIG. 88, a contact trench 118 is formed in SOI substrate 6. Trench 118 goes through buried oxide layer 8 to silicon substrate 7. A contact hole CH is formed on trench 118. A substrate fix line 114 is formed on contact hole CH. Substrate fix line 114 is connected to silicon substrate 7 via contact hole CH.

In embodiment 72, substrate potential $V_{BB}$ generated by substrate potential generator 100 is supplied to substrate fix line 114. Therefore, substrate potential $V_{BB}$ is supplied to silicon substrate 7 via substrate fix line 114. Therefore, silicon substrate 7 is electrically fixed.

Embodiment 72

FIG. 89 is a sectional view showing another example of providing substrate potential $V_{BB}$ or ground potential $V_{SS}$ to silicon substrate 7 of FIGS. 83 or 84. Substrate fix line 114 is connected to bonding pad 102. Bonding pad 102 is formed on SOI substrate 6 as shown in FIG. 86 or 87. Ground potential $V_{SS}$ or substrate potential $V_{BB}$ is supplied to bonding pad 102. Therefore, potential $V_{SS}$ or $V_{BB}$ of bonding pad 102 is supplied to silicon substrate 7 via substrate fix line 114. Therefore, silicon substrate 7 is electrically fixed.

Embodiment 73

FIG. 90 is a circuit diagram showing a structure of a memory cell, a sense amplifier, and an input/output circuit of a DRAM according to embodiment 74 of the present invention. Referring to FIG. 90, a boosted sense ground potential generator 120 is provided. Boosted sense ground potential VBSG generated by generator 120 is applied to the source electrodes of transistors Qs1 and Qs2.

FIG. 91 is a timing chart showing an operation of this DRAM. As shown in FIG. 91(j), the potential of one bit line only falls to the level of boosted sense ground potential $V_{BSG}$. This potential VBSG is higher than ground potential $V_{SS}$ by $\Delta V$.

Although the gate potential of transfer gate Qm in a deselect memory cell is 0V (a L level), the source potential of transfer gate Qm falls only to the level of boosted sense ground potential $V_{BSG}$. Therefore, the source potential thereof is higher than the gate potential by $\Delta V$. Therefore, transfer gate Qm attains a more-heavy non-conducting state in comparison with those of the above-described embodiment. In other words, the threshold value of this transfer gate Qm is substantially higher. Therefore, in a de-select memory cell 27, the disturb type subthreshold leakage current is significantly suppressed.

According to such a boosted sense ground method, the threshold value of transfer gate Qm can be substantially increased without doping impurities into the body region thereof. Therefore, the carrier mobility will not be reduced by doping. The manufacturing process is simplified since such adoping step is not required.

The potential is not limited to that described in the above embodiments where a ground potential $V_{SS}$ or a negative potential $V_{BB}$ is applied to the body region of a N channel MOS transistor, and any potential lower than a source potential of the N channel MOS transistor may be applied. Furthermore, although the power supply potential $V_{CC}$ is supplied to the body region of a P channel MOS transistor, any potential higher than a source potential of the P channel MOS transistor may be applied.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising a plurality of MOS transistors,
   wherein said plurality of MOS transistors are formed on an SOI substrate,
   each of said plurality of MOS transistors including a source region, a drain region, and a body region located between said source region and said drain region, wherein the body region of at least one MOS transistor of said plurality of MOS transistors is supplied with a variable potential which becomes a reverse potential with respect to a PN junction between one of said source and drain regions and said body region.

2. The semiconductor memory device according to claim 1, wherein said body region of said at least one MOS transistor is connected to its source region.

3. A semiconductor memory device comprising a plurality of MOS transistors and output terminals, for storing data and externally providing the stored data via said output terminals,
wherein said plurality of MOS transistors are formed on an SOI substrate, each of said plurality of MOS transistors including a source region, a drain region and a body region located between said source region and said drain region,
one of said plurality of MOS transistors having a source region connected to one of said output terminals and to its body region.

4. A semiconductor memory device to which a predetermined power supply voltage is supplied, including a plurality of MOS transistors,
wherein said plurality of MOS transistors are formed on an SOI substrate,
wherein one of said plurality of MOS transistors to which a voltage higher than said power supply voltage is supplied has a body region being electrically fixed and located between its source and drain regions.

5. A semiconductor memory device comprising a plurality of MOS transistors and an input/output line, for reading/writing data via said input/output line,
wherein said plurality of MOS transistors and said input/output line are formed on an SOI substrate, each of said plurality of MOS transistors including a source region, a drain region, and a body region located between said source region and said drain region,
wherein one of said plurality of MOS transistors has a source region or a drain region connected to said input/output line, and a body region that is electrically fixed.

6. A semiconductor memory device comprising a plurality of MOS transistors,
wherein said plurality of MOS transistors are formned on an SOI substrate, and
wherein the body region located between a source region and a drain region of a MOS transistor included in an input buffer for receiving an external signal to provide an internal signal out of said plurality of MOS transistors is electrically fixed.

7. A semiconductor memory device comprising a plurality of MOS transistors,
wherein said plurality of MOS transistors are formed on an SOI substrate,
wherein the body region located between a source region and a drain region of a MOS transistor at an output stage for externally providing a signal out of said plurality of MOS transistors is electrically fixed.

8. A semiconductor memory device comprising a plurality of MOS transistors, wherein a plurality of N channel MOS transistors out of said plurality of MOS transistors are connected in series between an output node for providing a signal and a ground node,
wherein said plurality of MOS transistors are formed on an SOI substrate,
wherein the body region located between a source region and a drain region of at least one N channel MOS transistor other than an N channel MOS transistor having a source region directly connected to said ground node out of said plurality of N channel MOS transistors is electrically biased.

9. The semiconductor memory device according to claim 6, wherein said MOS transistor having the electrically fixed body region is included in a first stage of said input buffer.

10. The semiconductor memory device according to claim 6, wherein said MOS transistor having the electrically fixed body region is included in a last stage of said input buffer.

* * * * *